(12) United States Patent
Tomita

(10) Patent No.: US 9,520,440 B2
(45) Date of Patent: Dec. 13, 2016

(54) IMAGING DEVICE AND METHOD OF MANUFACTURING THE SAME

(71) Applicant: Renesas Electronics Corporation, Kawasaki-shi, Kanagawa (JP)

(72) Inventor: Kazuo Tomita, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/719,462

(22) Filed: May 22, 2015

(65) Prior Publication Data

US 2015/0371958 A1 Dec. 24, 2015

(30) Foreign Application Priority Data

Jun. 19, 2014 (JP) ................................. 2014-126160

(51) Int. Cl.
*H01L 31/0232* (2014.01)
*H01L 23/544* (2006.01)
*H01L 27/146* (2006.01)

(52) U.S. Cl.
CPC ... *H01L 27/14685* (2013.01); *H01L 27/14687* (2013.01); *H01L 27/14621* (2013.01); *H01L 27/14625* (2013.01); *H01L 27/14627* (2013.01)

(58) Field of Classification Search
CPC .................... H01L 27/14625; H01L 27/14685; H01L 27/14687
USPC .................. 257/432, 620, E31.127, E27.133
See application file for complete search history.

(56) References Cited

U.S. PATENT DOCUMENTS

| | | | |
|---|---|---|---|
| 6,753,608 B2 | 6/2004 | Tomita | |
| 7,298,955 B2 | 11/2007 | Kooriyama | |
| 2009/0283807 A1* | 11/2009 | Adkisson et al. | 257/292 |
| 2012/0104541 A1* | 5/2012 | Chiu | 257/508 |
| 2014/0151838 A1* | 6/2014 | Iizuka | 257/433 |
| 2014/0210033 A1* | 7/2014 | Yano et al. | 257/432 |

FOREIGN PATENT DOCUMENTS

| | | |
|---|---|---|
| JP | 2004-079596 A | 3/2004 |
| JP | 2006-310825 A | 11/2006 |
| JP | 2006-351759 A | 12/2006 |

* cited by examiner

*Primary Examiner* — Fernando L Toledo
*Assistant Examiner* — Aaron Gray
(74) *Attorney, Agent, or Firm* — Sughrue Mion, PLLC

(57) ABSTRACT

In an imaging device having a waveguide, a surface of an insulating film covering a seal ring is prevented from getting rough. A pixel region, a peripheral circuit region, and a seal region are defined over a semiconductor substrate. After formation of a pad electrode in the peripheral circuit region and a seal ring in the seal ring region, a TEOS film is so formed as to cover the pad electrode and the seal ring. A pattern of a photoresist for exposing a portion of the TEOS film covering the pad electrode and the seal ring, respectively, is formed and etching treatment is subjected to the exposed TEOS film. Then, after the pattern of the photoresist has been formed, a second waveguide holding hole is formed in the pixel region by performing etching treatment.

8 Claims, 54 Drawing Sheets

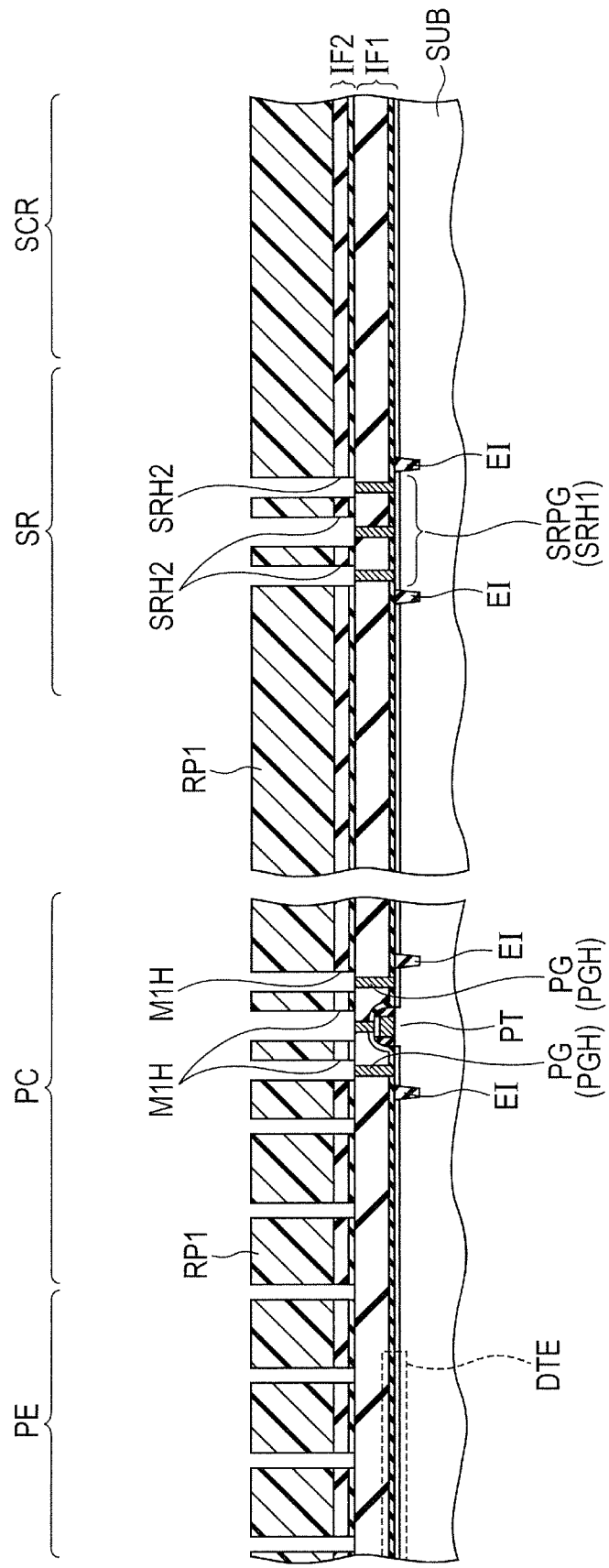

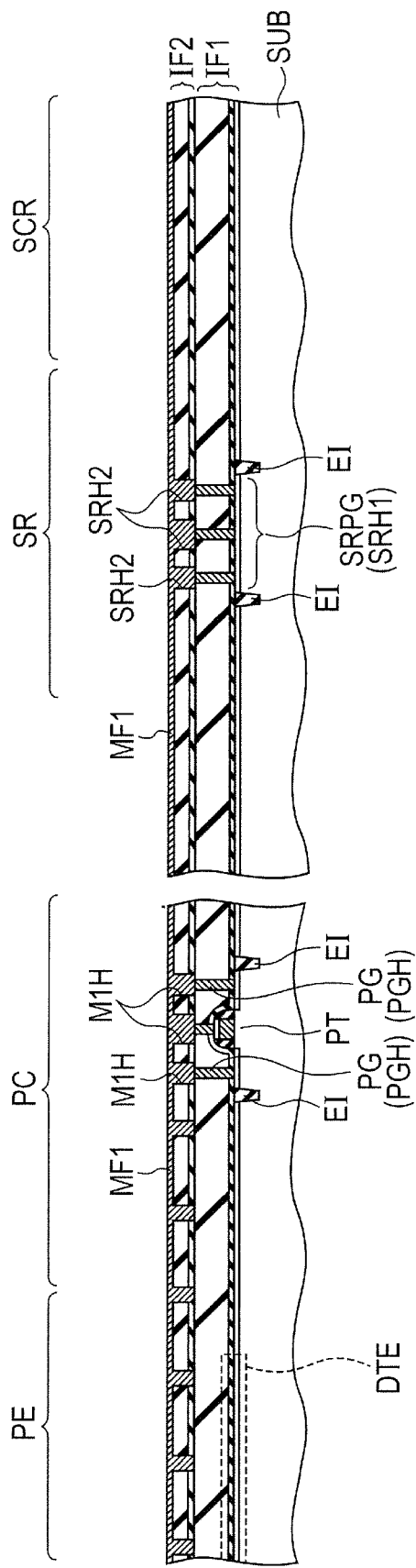
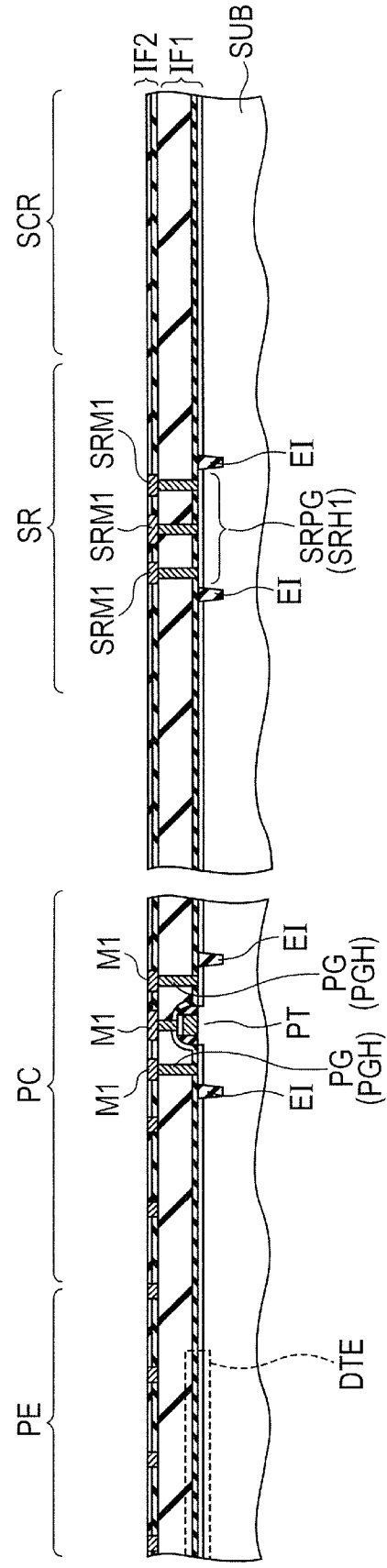

IMAGING DEVICE AND METHOD OF MANUFACTURING THE SAME

CROSS-REFERENCE TO RELATED APPLICATIONS

The disclosure of Japanese Patent Application No. 2014-126160 filed on Jun. 19, 2014 including the specification, drawings and abstract is incorporated herein by reference in its entirety.

BACKGROUND

The present invention relates to an imaging device and a method of manufacturing the same. In particular, the present invention is preferably applicable to an imaging device having a waveguide and a method of manufacturing such an imaging device.

In a semiconductor device, generally, in order to prevent external moisture from entering the inside of a chip, seal rings are so formed as to continuously enclose the chip from circumference. The seal rings are formed together with a plug for the chip and wirings or the like. Being stacked sequentially, eventually, the seal rings are built like a wall continuously enclosing the chip.

As one type of semiconductor devices, there is known an imaging device having a CMOS (Complementary Metal Oxide Semiconductor) image sensor. Such an imaging device is adapted to an electronic still camera, a smart phone, etc. In the imaging device, there are arranged a pixel region where pixel elements such as a photodiode converting incident light into an electric charge are formed and a peripheral circuit region where a peripheral circuit processing the electric charge converted by the pixel element as an electric signal is formed. The seal ring is so formed as to enclose the pixel region and the peripheral circuit region.

In recent years, to cope with downsizing of an electronic still camera etc., smaller-size pixel elements have been increasingly demanded for the imaging device. For this reason, in order to allow light to enter efficiently, there is proposed an imaging device in which a waveguide leading the light to a photodiode is provided. The waveguide is formed when a hole is formed by subjecting etching treatment to insulating films including an interlayer film etc. covering the pixel region and filling the hole with a predetermined gap fill member.

There is Patent Document 1 as an example of a document in which a semiconductor device having a seal ring is disclosed. Moreover, there are Patent Documents 2 and 3 as examples of documents in which an imaging device having a waveguide is disclosed.

[Patent Document 1]
Japanese Unexamined Patent Publication No. 2004-79596
[Patent Document 2]
Japanese Unexamined Patent Publication No. 2006-351759
[Patent Document 3]
Japanese Unexamined Patent Publication No. 2006-310825

SUMMARY

Conventional imaging devices had problems as follows. In a step where a hole to be a waveguide is formed, first, a predetermined region of a pixel region is exposed, and a pattern of a photoresist covering a peripheral circuit region and a seal ring region in which a seal ring is disposed is formed. Next, by subjecting etching treatment to the insulating film using the photoresist as an etching mask, the hole to be a waveguide is formed.

In the pixel region, it is necessary to guide light as efficiently as possible to the pixel element (photodiode) through the waveguide. Therefore, part of the insulating film located in the pixel region is removed. For this reason, at the time of forming the hole to be the waveguide, the pixel region becomes lower in height than seal ring region in particular. That is, a level of the seal ring region becomes higher than the pixel region and, in the seal ring region, the photoresist becomes thinner as compared with the pixel region.

Therefore, when etching treatment was performed by using such a photoresist as an etching mask, at times, before formation of a hole to be the waveguide, the photoresist covering the seal ring region was removed to expose the insulating film and the etching treatment was subjected also to the exposed portion of the insulating film, causing a surface of the insulating film to be rough.

Other problems and novel features will be apparent from the description herein and accompanying drawings.

The imaging device according to one embodiment has a waveguide and includes: a seal ring region; a pixel region having the waveguide therein and a peripheral circuit region; and an insulating film. In the insulating film so formed as to cover the pixel region, the peripheral circuit region, and the seal ring region, a first concave portion is formed in a region located on the outward side of a seal ring along the seal ring. A position of a surface of the insulating film located right above the seal ring is referred to as a first position. A position of the surface of the insulating film located in a first concave portion is referred to as a second position. A position of the surface of the insulating film located in a direction departing from the first concave portion for the outside of the seal ring region is referred to as a third position. Then, the second position is lower than the first position in height. Further, the third position is lower than the first position but higher than the second position.

A manufacturing method of an imaging device according to another embodiment is a manufacturing method of an imaging device having a waveguide and, in particular, includes the following steps. An insulating film is so formed over a semiconductor substrate as to cover a pixel region, a pad electrode, and a seal ring. There is formed a pattern of a first photoresist for exposing a first region of the insulating film located right above the pad electrode and a second region including a right-above portion of the insulating film located right above the seal ring. Using the first photoresist as an etching mask, etching treatment is subjected to the exposed first and second regions of the insulating film. After the first photoresist has been removed, a region including the first and second regions of the insulating film is covered, and a pattern of a second photoresist for exposing a third region of the insulating film located in the pixel region is formed. Then, using the second photoresist as an etching mask, by subjecting etching treatment to the exposed third region of the insulating film, a waveguide holding hole is formed in the pixel region.

According to an imaging device of one embodiment, it is possible to prevent deterioration of a surface of a portion of an insulating film covering a seal ring formed in a seal ring region.

According to a manufacturing method of the imaging device of another embodiment, it is possible to prevent deterioration of the surface of the portion of the insulating film covering the seal ring formed in the seal ring region.

BRIEF DESCRIPTION OF THE DRAWINGS

FIG. 4 is a partial cross-sectional view showing one step of the manufacturing method of the imaging device according to the embodiment;

FIG. 5 is a partial cross-sectional view showing a step after the step shown in FIG. 4 according to the embodiment;

FIG. 6 is a partial cross-sectional view showing a step after the step shown in FIG. 5 according to the embodiment;

DETAILED DESCRIPTION

First Embodiment

Figure 1:
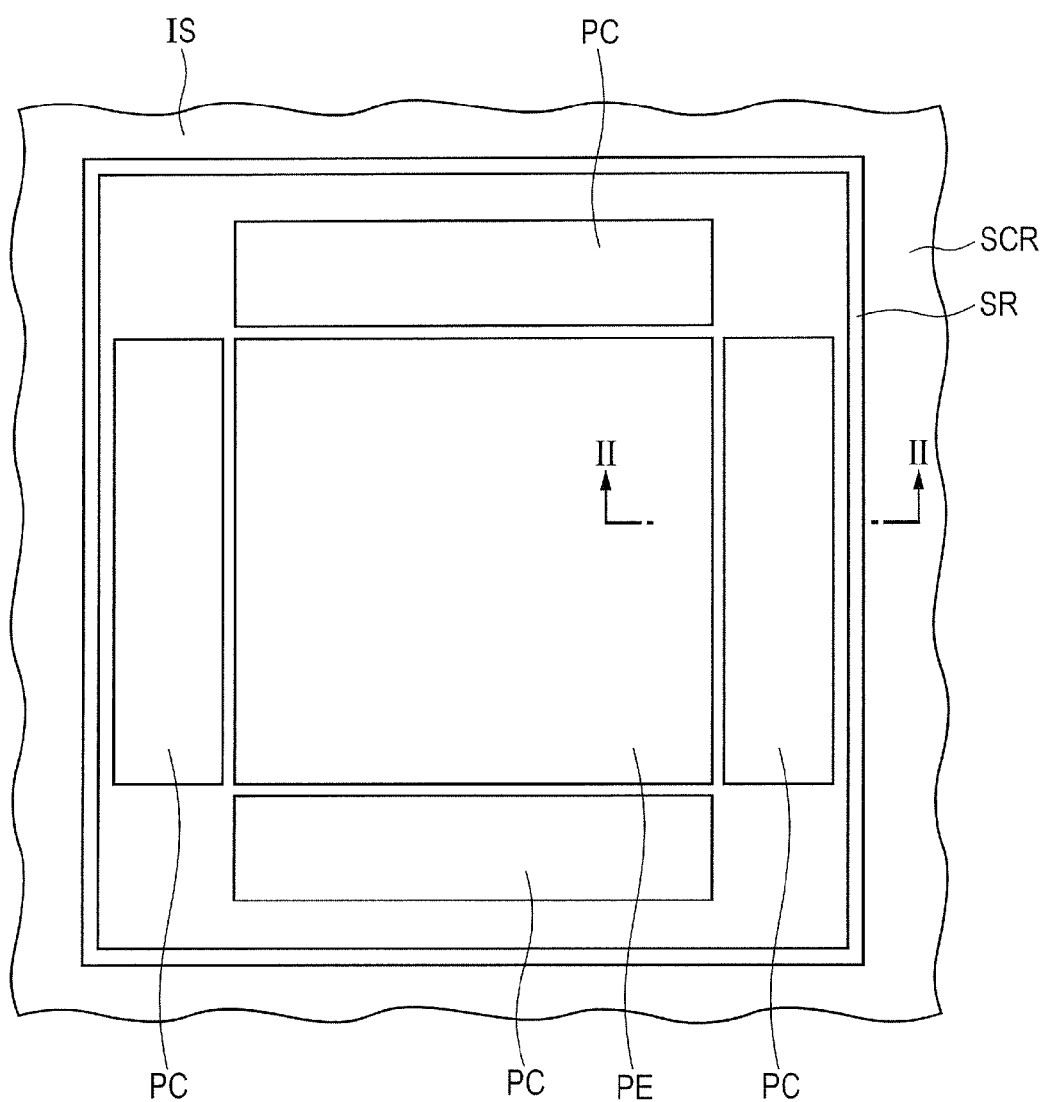
FIG. 1 is a plan view showing one example of a device layout of an imaging device according to First Embodiment.

An imaging device according to First Embodiment will be described. First, an example of a planar configuration (pattern) of the imaging device will be described. As shown in FIG. 1, in the imaging device IS, there is arranged a pixel region PE where pixel elements such as a photodiode converting incident light into an electric charge are formed. Around the pixel region PE, there is arranged a peripheral circuit region PC where a peripheral circuit processing the electric charge converted by the pixel element as an electrical signal is formed. Further, there is so arranged a seal ring region SR where seal rings are so formed as to continuously enclose the pixel region PE and the peripheral circuit region PC from circumference. There is located outside the seal ring region SR a scribe region SCR which is left behind after dicing.

Figure 2:
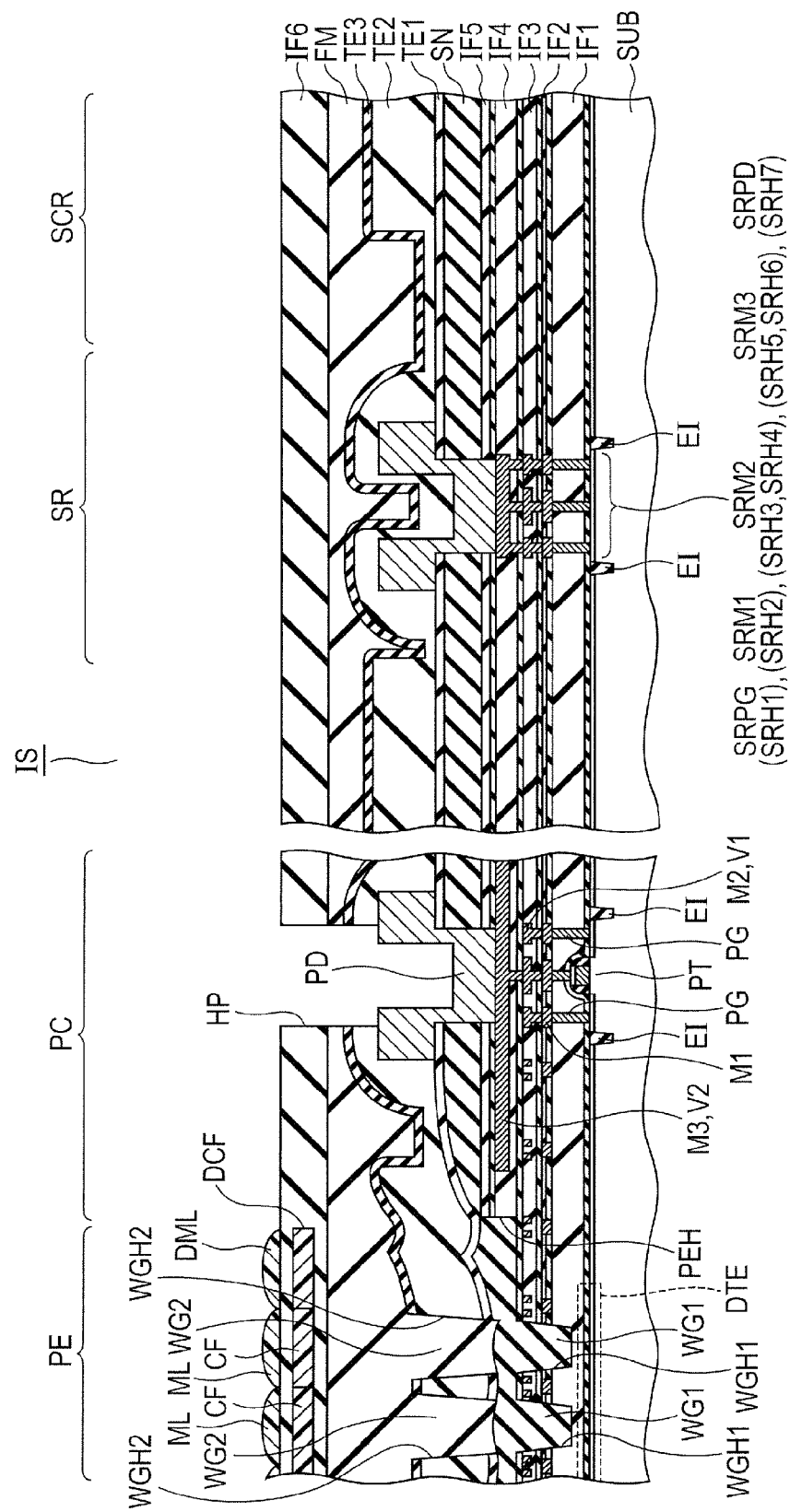
FIG. 2 is a cross-sectional view taken along line II-II shown in FIG. 1 according to the embodiment.

Next, a cross-sectional configuration of the imaging device IS will be described. As shown in FIG. 2, the pixel region PE, the peripheral circuit region PC, and the seal ring region SR are defined by forming an element-isolation insulating film EI over the semiconductor substrate SUB. A pixel element DTE is formed in the pixel region PE. The pixel element DTE includes a photodiode for converting light into an electric charge and a transfer transistor etc. for transferring the electric charge. Also, for simplifying the drawing, the portion concerned is outlined by a dotted line. In the peripheral circuit region PC, a transistor PT etc. processing the electric charge converted by the pixel element DTE as an electrical signal are formed.

So as to cover the pixel element DTE and the transistor etc., over the semiconductor substrate SUB, a first insulating film IF1 is formed as a contact interlayer insulating film. A contact plug PG is formed in the peripheral circuit region PC and a seal ring SRPG is comprised of the same film (material) as a film to be the contact plug PG in the seal ring region SR through the first insulating film IF1.

A second insulating film IF2 is so formed as to cover the first insulating film IF1. The second insulating film IF2 includes a SiCN film (carbon-doped silicon nitride film) and a TEOS (Tetra Ethyl Ortho Silicate) oxide film. In the peripheral circuit region PC, a first wiring M1 is formed in a groove formed in the second insulating film IF2. In the seal ring region SR, a seal ring SRM1 is comprised of the same film (material) as a film to be the first wiring M1.

A third insulating film IF3 is so formed as to cover the first wiring M1 etc. The third insulating film IF3 includes a SiCN film and a SiCO film (carbon-doped silicon oxide film) as stopper films and a SiOC film as a Low-k film. In the peripheral circuit region PC, a second wiring M2 is formed in a groove etc. formed in the third insulating film IF3. In the seal ring region SR, a seal ring SRM2 is comprised of the same film (material) as a film to be the second wiring M2.

A fourth insulating film IF4 is so formed as to cover the second wiring M2 etc. The fourth insulating film IF4 includes a SiCN film and a SiCO film as stopper films and a SiOC film as a Low-k film. In the peripheral circuit region PC, in a groove etc. formed in the fourth insulating film IF4, a third wiring M3 is formed. In the seal ring region SR, a seal ring SRM3 is comprised of the same film (material) as a film to be the third wiring M3.

In the peripheral circuit region PC and the seal ring region SR, a fifth insulating film IF5 is so formed as to cover the third wiring M3 or the like. The fifth insulating film IF5 includes a SiCN film and a SiCO film as stopper films and a TEOS film (having a thickness of about 200 nm) to be a hard mask.

On the other hand, in the pixel region PE, a pixel hole PEH is formed by removing the fourth insulating film IF4 and the fifth insulating film IF5. In the pixel region PE, there is further formed a first waveguide holding hole WGH1 penetrating the third insulating film IF3 and the second insulating film IF2, and reaching the midway of a depth of the first insulating film IF1.

A silicon nitride film SN is so formed as to fill the first waveguide holding hole WGH1 and the pixel hole PEH and to cover the fifth insulating film IF5. A first waveguide WG1 is formed by a portion of the silicon nitride film SN embedded in the first waveguide holding hole WGH1. A TEOS film TE1 (having a thickness of about 200 nm) is so formed as to cover the silicon nitride film SN.

In the peripheral circuit region PC, pad electrodes PD are formed in holes formed in the TEOS film TE1, the silicon nitride film SN, and the fifth insulating film IF5. In the seal ring region SR, a seal ring SRPD is comprised of the same film (material) as a film to be the pad electrode PD. A TEOS film TE2 is so formed as to cover the pad electrode PD etc. and, further, a TEOS film. TE3 (having a thickness of about 100 nm) is so formed as to cover the TEOS film TE2.

In the pixel region PE, there is formed a second waveguide holding hole WGH2 penetrating the TEOS film TE3 and the TEOS film TE2 and reaching the first waveguide WG1. A gap fill member FM of a coating type is so formed as to fill the second waveguide holding hole WGH2 and to cover the TEOS film TE3. A sixth insulating film IF6 is so formed as to cover the gap fill member FM.

In the pixel region PE, a second waveguide WG2 is formed by a portion of the gap fill member FM embedded in the second waveguide holding hole WGH2. A color filter CF and a micro lens ML are disposed right above the second waveguide WG2. Also, in addition to the original color filter CF and the micro lens ML, a dummy color filter DCF and a dummy micro lens DML are arranged on the side of the peripheral circuit region PC. The imaging device IS according to the present embodiment is configured as above.

In the imaging device IS described above, after formation of the TEOS film TE2 covering the pad electrode PD and the seal ring SRPD, by subjecting dry etching treatment to a portion covering the pad electrode PD and a portion covering the seal ring SRPD at the same time, the level difference of the peripheral circuit region PC and the level difference of the seal ring region SR are reduced. Next, an example of the manufacturing method of the imaging device IS will be described.

Figure 3:
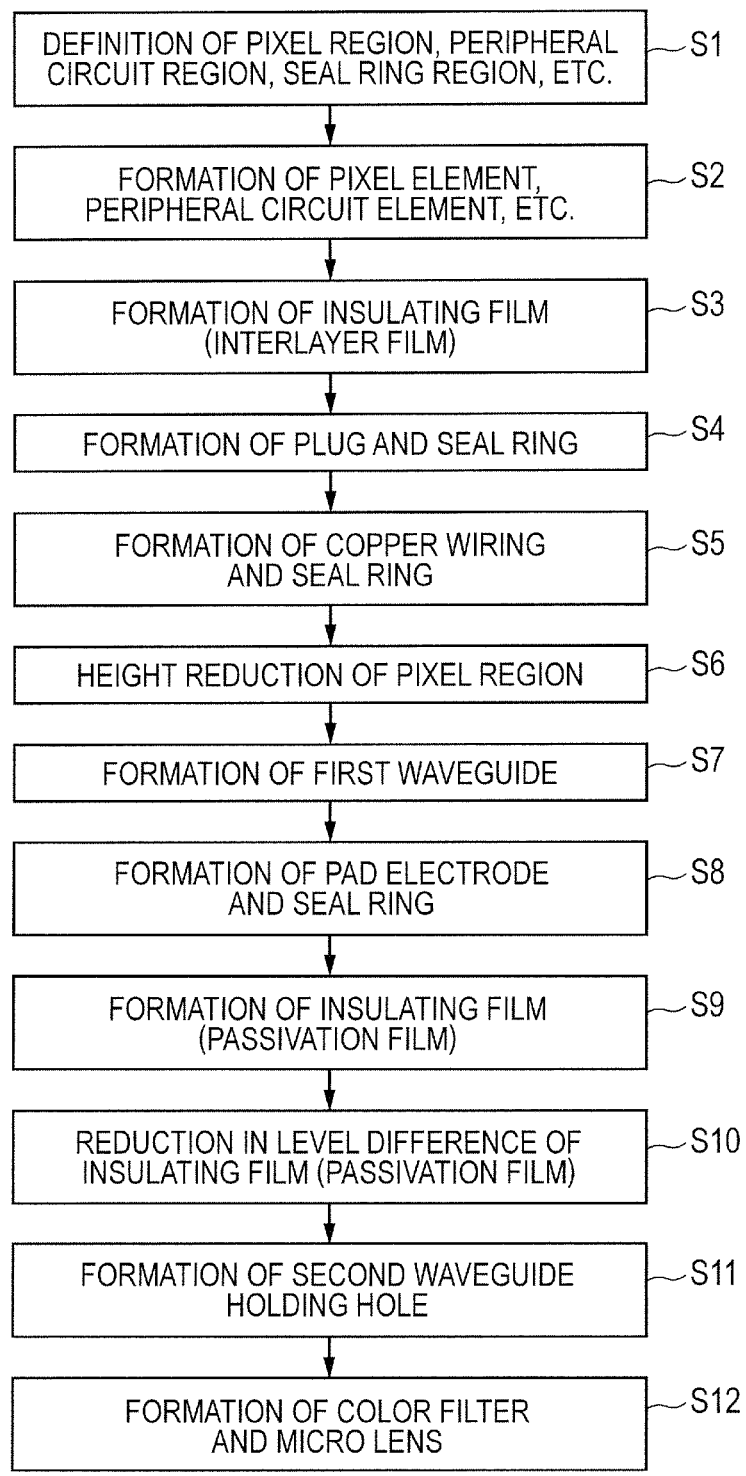
FIG. 3 is a flow chart showing an outline of a manufacturing method of the imaging device according to the embodiment.

First, the outline of a manufacturing flow will be explained. As shown in FIG. 3, in step S1, by forming an element-isolation insulating film over the semiconductor substrate, the pixel region, the peripheral circuit region, and the seal ring region or the like are defined. In step S2, in the pixel region, pixel elements such as a photodiode and a transistor are formed in the pixel region and peripheral circuit elements such as a transistor are formed in the peripheral circuit region. In step S3, an insulating film (interlayer film) is so formed as to cover the pixel elements and the peripheral circuit elements or the like.

In step S4, a plug is formed in the peripheral circuit region and a seal ring is formed in the seal ring region. In step S5, a multilayer copper wiring is formed in the peripheral circuit region and a seal ring is formed in the seal ring region. In step S6, the pixel region is made thinner by removing the insulating film etc. located in the pixel region (height reduction). In step S7, a first waveguide is formed in the pixel region. In step S8, a pad electrode is formed in the peripheral circuit region and a seal ring is formed in the seal ring region.

In step S9, an insulating film (passivation film) is so formed as to cover the pad electrode. In step S10, etching treatment is performed to reduce a level difference of the insulating film (passivation film). In step S11, by subjecting the etching treatment to the insulating film (passivation film), a second waveguide holding hole is formed in the pixel region. There are cases in which a second waveguide is formed and in which a color filter is formed in the second waveguide holding hole. In step S12, when the color filter and the micro lens are formed in the pixel region, principal parts of the imaging device are completed.

Next, the manufacturing method of the imaging device will be explained in detail. As shown in FIG. 4, by forming an element-isolation insulating film EI in a predetermined region of the semiconductor substrate SUB, the pixel region PE, the peripheral circuit region PC, and the seal ring region SR or the like are defined.

Next, in the pixel region PE, predetermined pixel elements DTE including a photodiode and a transfer transistor or the like are formed. The photodiode has a function of converting light entering from the outside to an electric charge. The transfer transistor has a function of transferring the electric charge converted by the photodiode to another predetermined element. Moreover, in the peripheral circuit region PC, elements such as a transistor PT are formed. The transistor PT or the like has a function of processing the electric charge converted by the pixel element DTE as an electrical signal.

Next, over the semiconductor substrate SUB, so as to cover the pixel element DTE and the transistor PT or the like, as a contact interlayer film, a first insulating film IF1 is formed. Next, by subjecting a lithography process and etching treatment to the first insulating film IF1, a contact hole PGH penetrating the first insulating film IF1 and reaching the transistor PT is formed in the peripheral circuit region PC. In the seal ring region SR, a seal ring hole SRH1 is so formed as to continuously enclose the pixel region PE and the peripheral circuit region PC.

Next, a predetermined conductive film (not shown) is so formed over the first insulating film IF1 as to fill the contact hole PGH and the seal ring hole SRH1. Next, leaving portions of the conductive film located in the contact hole PGH and the seal ring hole SRH1, by removing a portion of the conductive film located over an upper surface of the first insulating film IF1, the contact plug PG is formed in the contact hole PGH and the seal ring SRPG is formed in the seal ring hole SRH1. The contact plug PG is electrically coupled to the transistor PT. The seal ring SRPG is formed like a wall continuously enclosing the pixel region PE and the peripheral circuit region PC. In addition, in this imaging device, the seal ring is of a three-fold configuration.

Next, a second insulating film IF2 is so formed as to cover the first insulating film IF1. As the second insulating film IF2, at least a SiCN film and a TEOS film are laminated. Next, by a lithography process, a pattern of a photoresist RP1 for forming a wiring groove and a seal ring hole is formed. Next, using the photoresist RP1 as an etching mask, by subjecting etching treatment to the second insulating film IF2, a wiring groove M1H for exposing the contact plug PG is formed in the peripheral circuit region PC. In the seal ring region SR, a seal ring hole SRH2 exposing the seal ring SRPG is formed. Subsequently, the photoresist RP1 is removed.

Next, as shown in FIG. 5, by electrolytic plating, a copper film MF1 is so formed over the second insulating film IF2 as to fill the wiring groove M1H and the seal ring hole SRH2. In addition, before forming the copper film MF1, a barrier film and a copper seed layer (neither is shown) are formed in advance. Next, a portion of the copper film MF1 located over an upper surface of the second insulating film IF2 is removed by performing chemical mechanical polishing. As a result, as shown in FIG. 6, in the peripheral circuit region PC, a first wiring M1 is formed in the wiring groove M1H. Also, in the seal ring region SR, a seal ring SRM1 is formed in a seal ring hole SRH2. The seal ring SRM1 is formed like a wall which is in contact with an upper surface of the seal ring SRPG and continuously encloses the pixel region PE and the peripheral circuit region PC.

Figure 7:
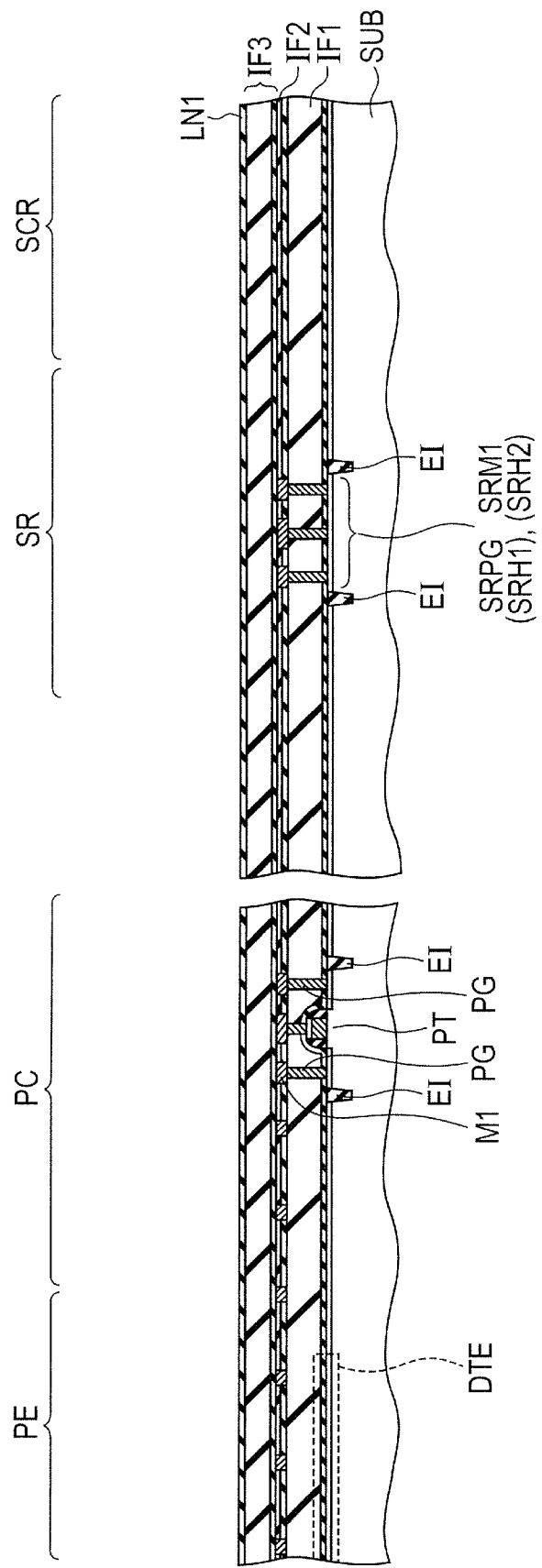
FIG. 7 is a partial cross-sectional view showing a step after the step shown in FIG. 6 according to the embodiment.

Next, as shown in FIG. 7, a third insulating film IF3 is so formed as to cover the first wiring M1 and the seal ring SRM1. As the third insulating film IF3, for instance, a SiCN film and a SiCO film as stopper films and a SiOC film as a Low-k film are laminated. A first cap film LN1 is so formed as to cover the third insulating film IF3. As the first cap film LN1, for instance, a TEOS film is formed.

Figure 8:
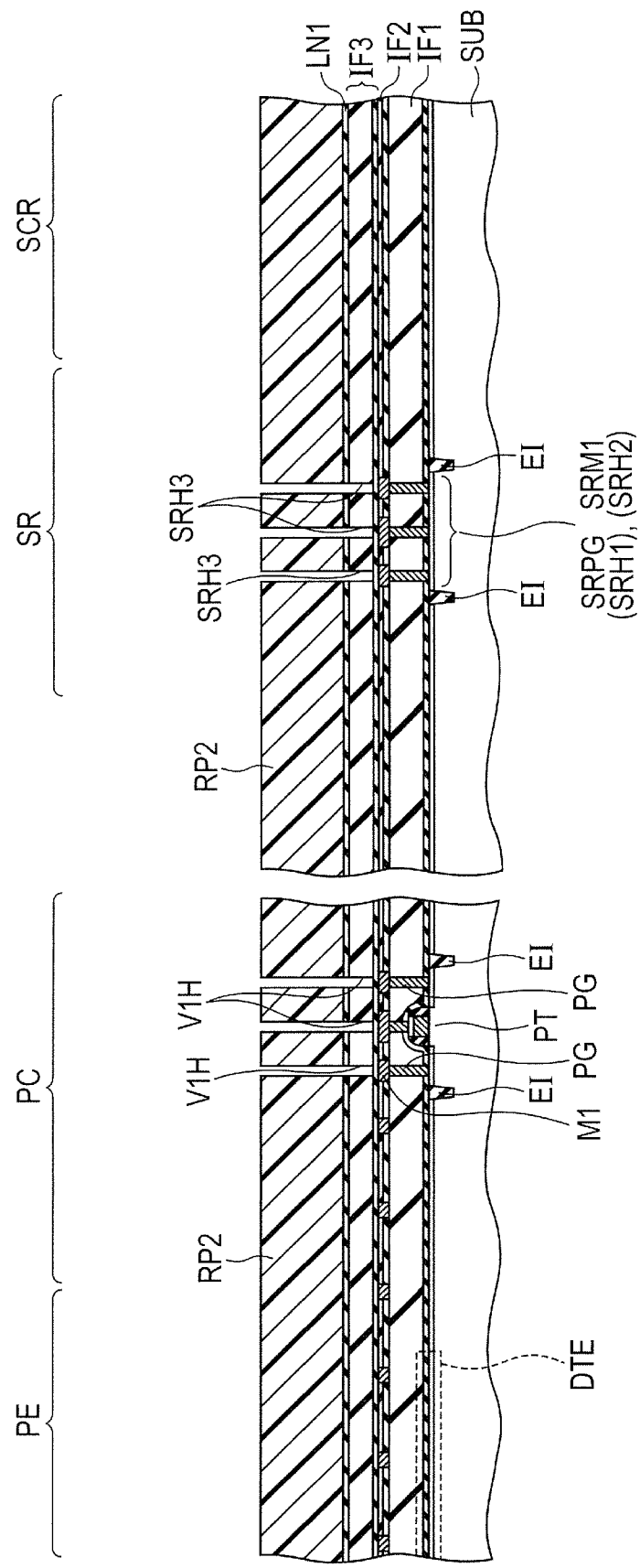
FIG. 8 is a partial cross-sectional view showing a step after the step shown in FIG. 7 according to the embodiment.

Next, as shown in FIG. 8, by a lithography process, a pattern of a photoresist RP2 for forming a via hole and a seal ring hole is formed. Next, using the photoresist RP2 as an etching mask, a via hole V1H for exposing the first wiring M1 is formed by subjecting etching treatment to the third insulating film IF3 etc. in the peripheral circuit region PC. In the seal ring region SR, a seal ring hole SRH3 for exposing the seal ring SRM1 is formed. Subsequently, the photoresist RP2 is removed. Next, a photoresist (not shown) is newly applied and, by subjecting etch back treatment to the photoresist, leaving portions of the photoresist located in the via hole V1H and the seal ring hole SRH3, other portions of the photoresist are removed.

Figure 9:
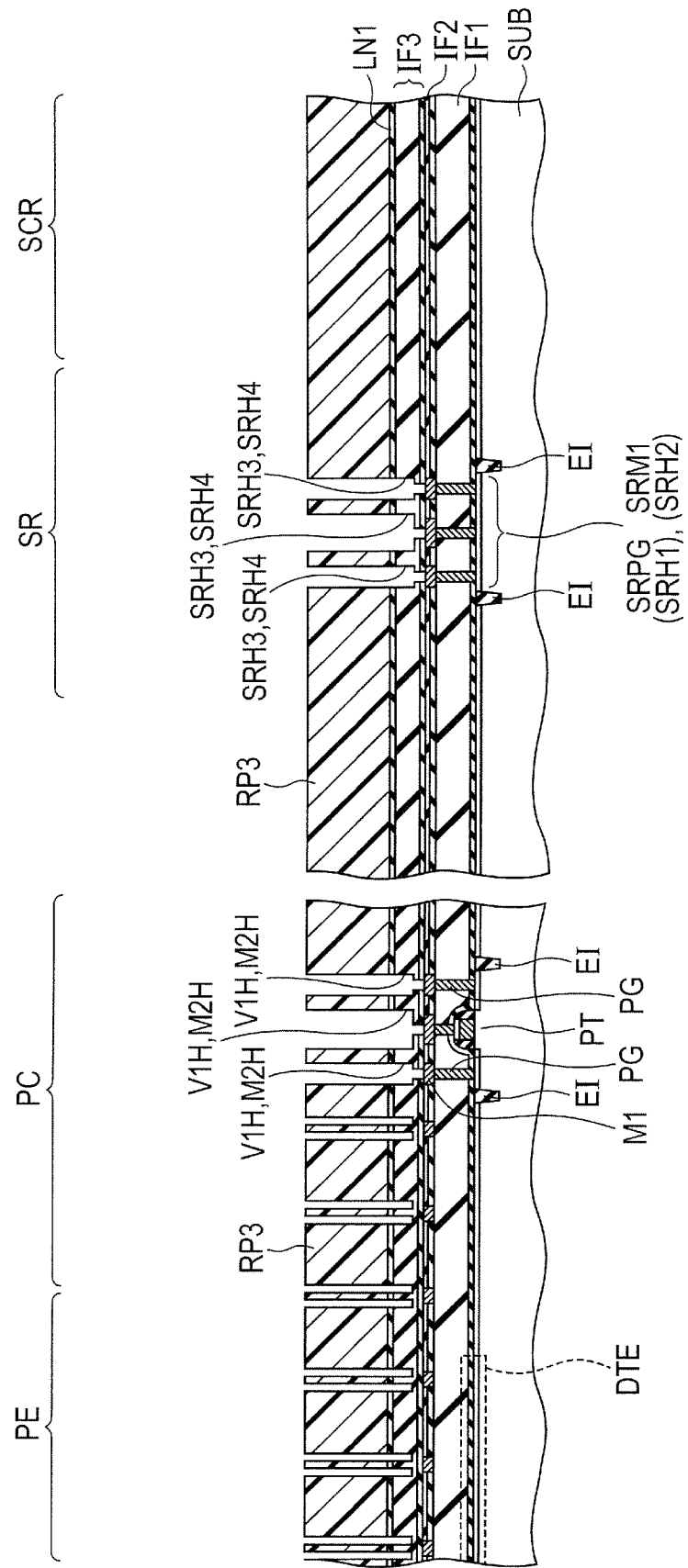
FIG. 9 is a partial cross-sectional view showing a step after the step shown in FIG. 8 according to the embodiment.

Next, as shown in FIG. 9, by a lithography process, a pattern of a photoresist RP3 for forming a wiring groove and a seal ring hole is formed. Next, using the photoresist RP3 as an etching mask, by subjecting etching treatment to a SiOC film as a Low-k film in the third insulating film IF3, a wiring groove M2H is formed in the peripheral circuit region PC. In the seal ring region SR, a seal ring hole SRH4 is formed. Subsequently, the photoresist RP3 is removed.

Figure 10:
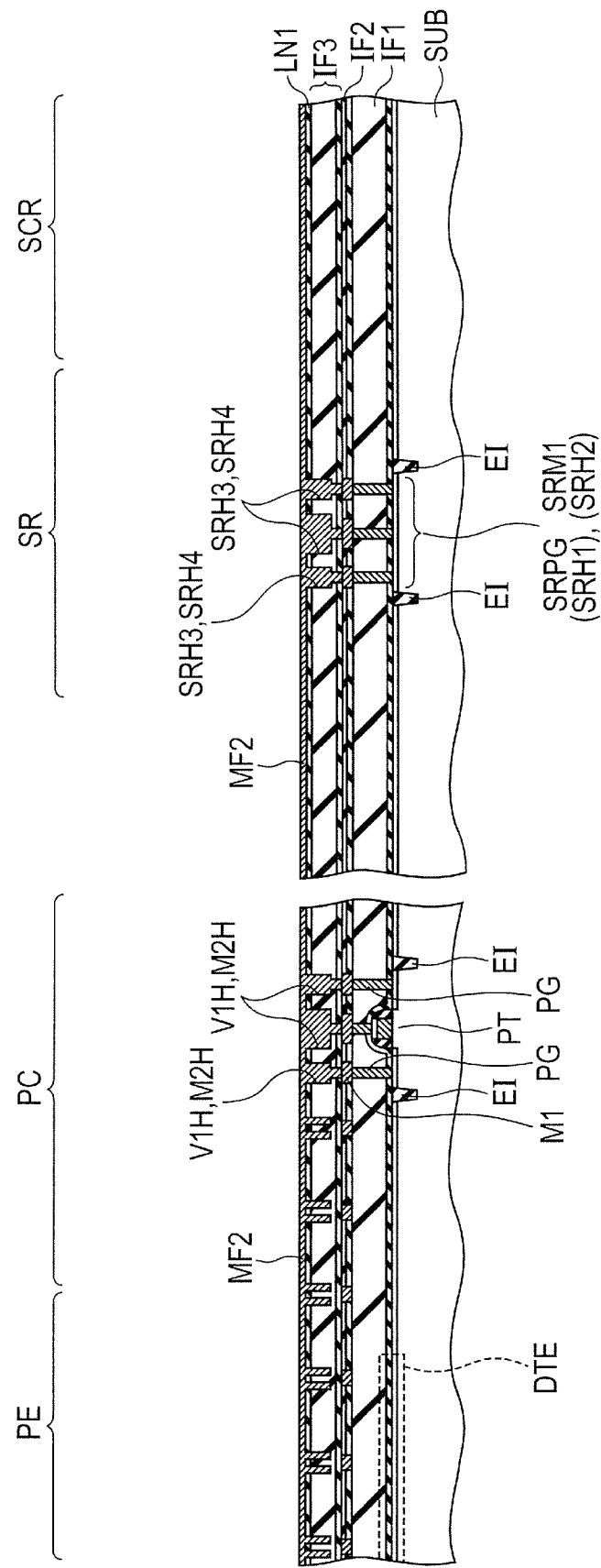
FIG. 10 is a partial cross-sectional view showing a step after the step shown in FIG. 9 according to the embodiment.

Next, as shown in FIG. 10, by electrolytic plating, a copper film MF2 is so formed over the third insulating film IF3 as to fill the wiring groove M2H, the via hole V1H, and the seal ring holes SRH3 and SRH4. In addition, before forming the copper film MF2, a barrier film and a copper seed layer (neither is shown) are formed in advance. Next, a portion of the copper film MF2 located over an upper surface of the third insulating film IF3 is removed by chemical mechanical polishing. As a result, in the peripheral circuit region PC, a via V1 is formed in the via hole V1H and a second wiring M2 is formed in the wiring groove M2H (see FIG. 11). Also, in the seal ring region SR, a seal ring SRM2 is formed in the seal ring holes SRH3 and SRH4 (see FIG. 11). The seal ring SRM2 is formed like a wall which is in contact with an upper surface of the seal ring SRM1 and continuously encloses the pixel region PE and the peripheral circuit region PC. At this time, the first cap film LN1 is removed.

Figure 11:
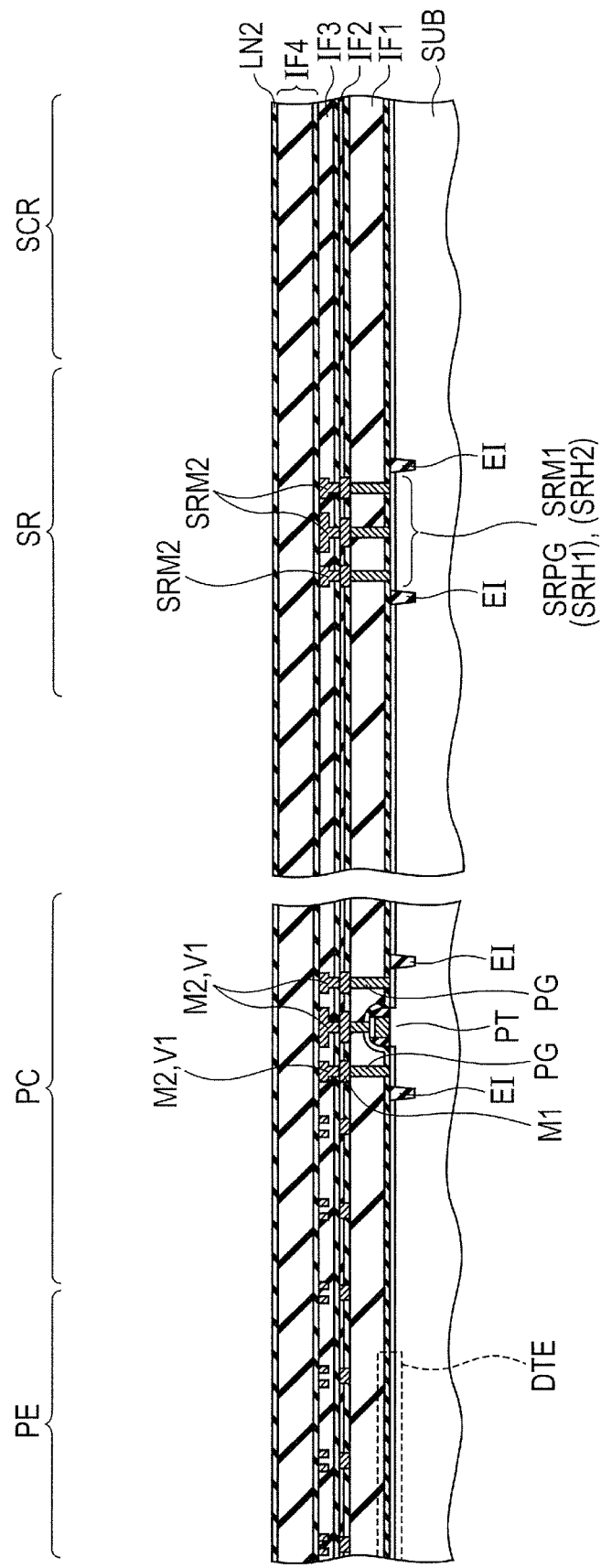
FIG. 11 is a partial cross-sectional view showing a step after the step shown in FIG. 10 according to the embodiment.

Next, as shown in FIG. 11, a fourth insulating film IF4 is so formed as to cover the second wiring M2 and the seal ring SRM2. As the fourth insulating film IF4, for instance, a SiCN film and a SiCO film as stopper films and a SiOC film as a Low-k film are laminated. A second cap film LN2 is so formed as to cover the fourth insulating film IF4. As the second cap film LN2, for instance, a TEOS film is formed.

Figure 12:
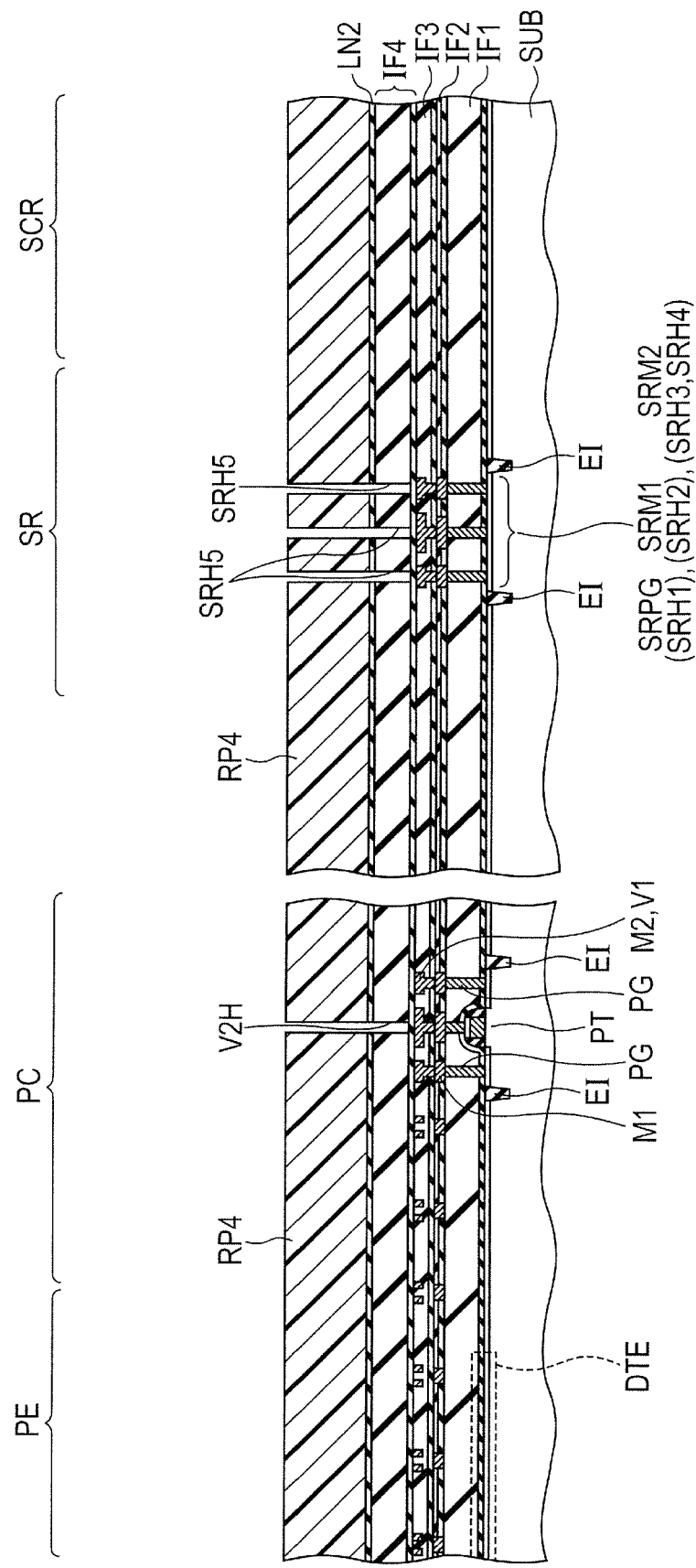
FIG. 12 is a partial cross-sectional view showing a step after the step shown in FIG. 11 according to the embodiment.

Next, as shown in FIG. 12, by a lithography process, a pattern of a photoresist RP4 for forming a via hole and a seal ring hole is formed. Next, using the photoresist RP4 as an etching mask, a via hole V2H for exposing the second wiring M2 is formed by subjecting etching treatment to the fourth insulating film IF4 etc. in the peripheral circuit region PC. In the seal ring region SR, a seal ring hole SRH5 for exposing the seal ring SRM2 is formed. Subsequently, the photoresist RP4 is removed. Next, a photoresist (not shown) is newly applied and, by subjecting etch back treatment to the photoresist, leaving portions of the photoresist located in the via hole V2H and the seal ring hole SRH5, other portions of the photoresist are removed.

Figure 13:
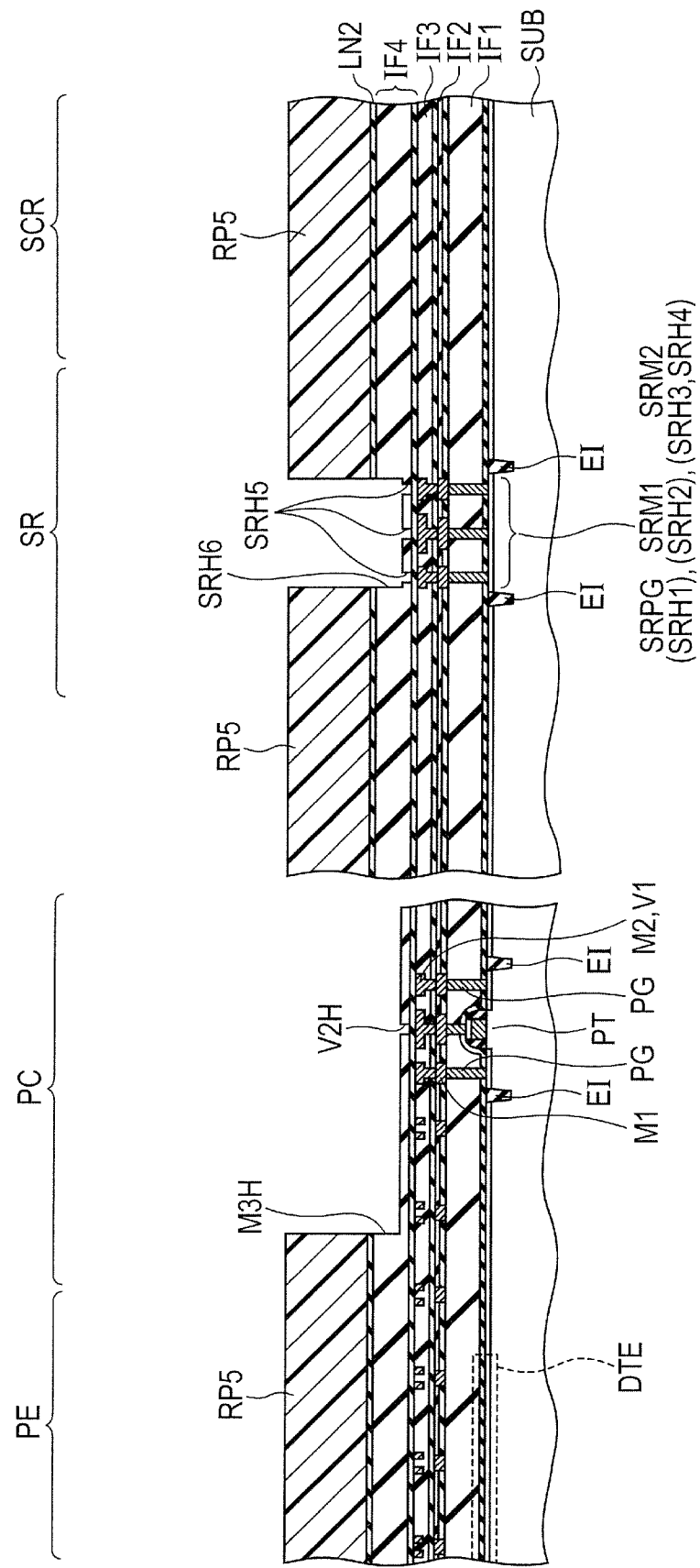
FIG. 13 is a partial cross-sectional view showing a step after the step shown in FIG. 12 according to the embodiment.

Next, as shown in FIG. 13, a pattern of a photoresist RP5 for forming a wiring groove and a seal ring hole is formed. Next, using the photoresist R53 as an etching mask, by subjecting etching treatment to a SiOC film as a Low-k film in the fourth insulating film IF4, a wiring groove M3H is formed in the peripheral circuit region PC. In the seal ring region SR, a seal ring hole SRH6 is formed. Subsequently, the photoresist RP5 is removed.

Figure 14:
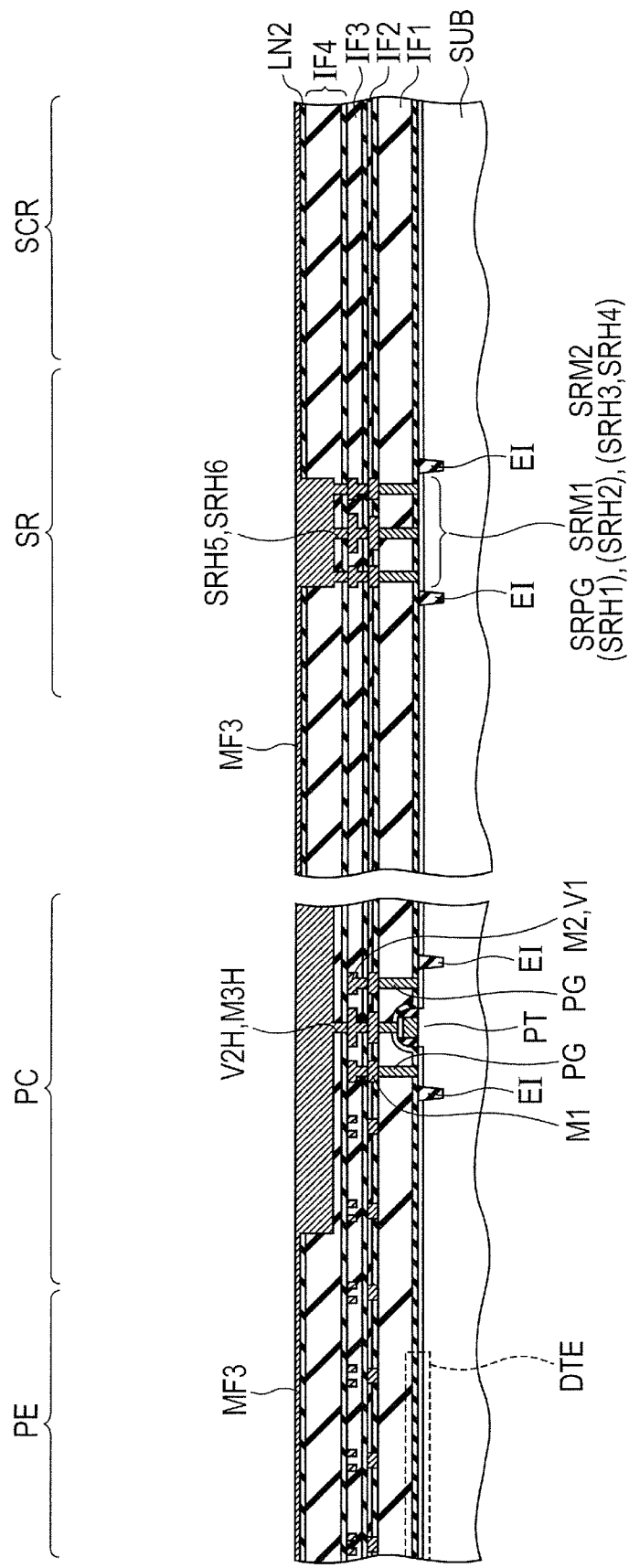
FIG. 14 is a partial cross-sectional view showing a step after the step shown in FIG. 13 according to the embodiment.

Next, as shown in FIG. 14, by electrolytic plating, a copper film MF3 is so formed over the fourth insulating film IF4 as to fill the wiring groove M3H, the via hole V2H, and the seal ring holes SRH5 and SRH6. In addition, before forming the copper film MF3, a barrier film and a copper seed layer (neither is shown) are formed in advance.

Next, a portion of the copper film MF3 located over an upper surface of the fourth insulating film IF4 is removed by performing chemical mechanical polishing. As a result, in the peripheral circuit region PC, a via V2 is formed in the via hole V2H and a third wiring M3 is formed in the wiring groove M3H (see FIG. 15). Also, in the seal ring region SR, a seal ring SRM3 is formed in the seal ring holes SRH5 and SRH6 (see FIG. 15). The seal ring SRM3 is formed like a wall which is in contact with an upper surface of the seal ring SRM2 and continuously encloses the pixel region PE and the peripheral circuit region PC. At this time, the second cap film LN2 is also removed.

Figure 15:
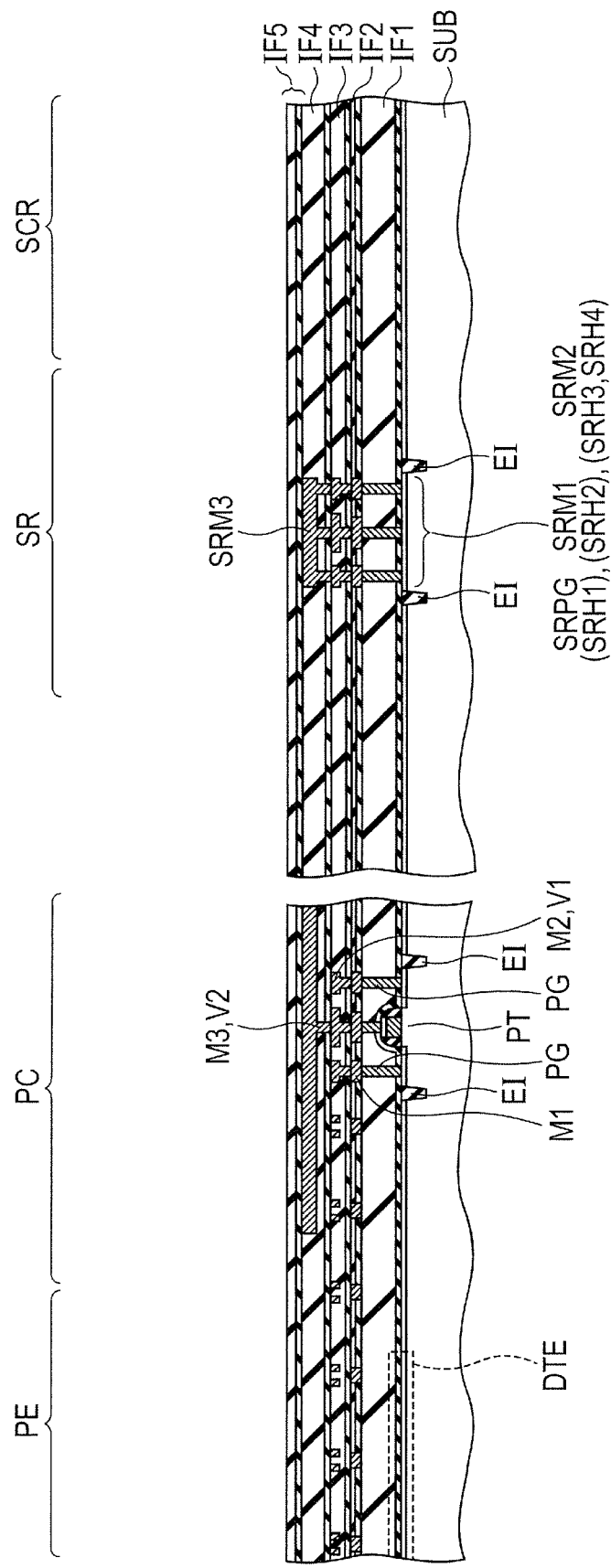
FIG. 15 is a partial cross-sectional view showing a step after the step shown in FIG. 14 according to the embodiment.

Next, as shown in FIG. 15, a fifth insulating film IF5 is so formed as to cover the third wiring M3 and the seal ring SRM3. As the fifth insulating film IF5, for instance, the SiCN film and the SiCO film as stopper films and the TEOS film as a hard mask are laminated. Next, a pattern of the photoresist (not shown) exposing the pixel region PE and covering other regions is formed. Next, by performing etching treatment using the photoresist as an etching mask, leaving portions of the TEOS film located in the peripheral circuit region PC and the seal ring region SR or the like, a portion of the TEOS film located in the pixel region PE is removed.

Figure 16:
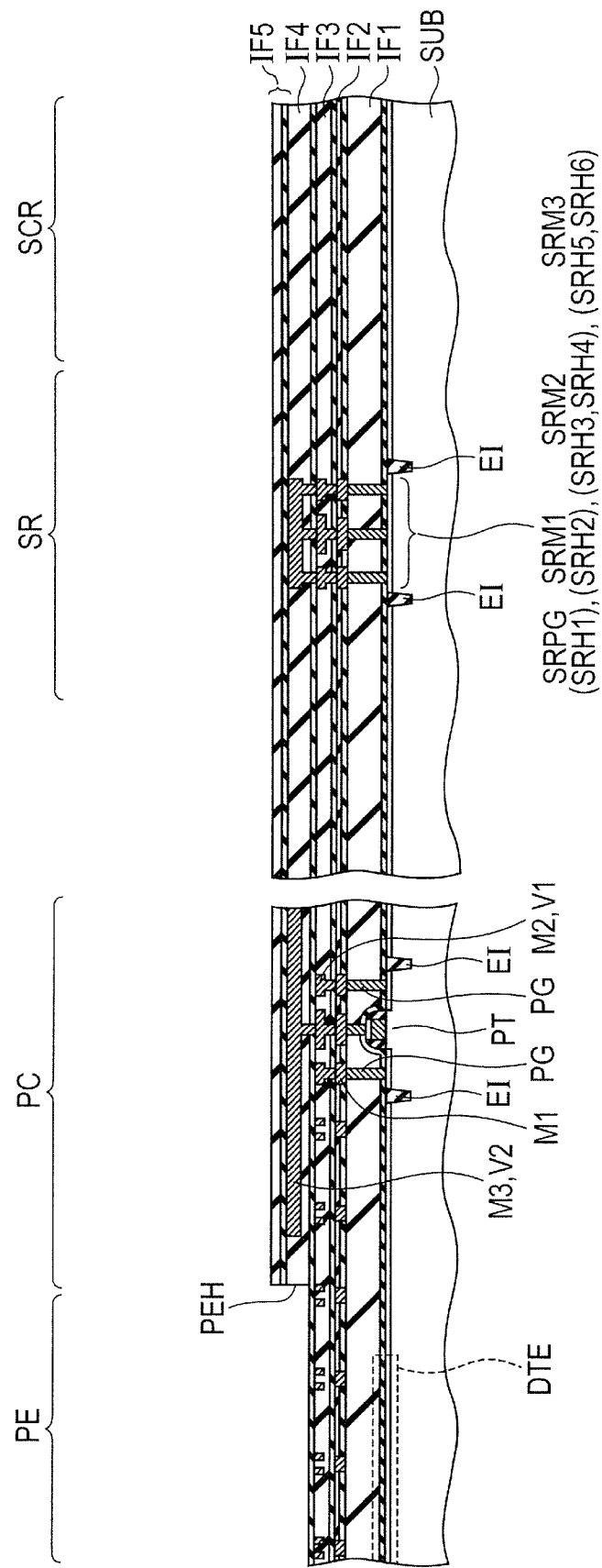
FIG. 16 is a partial cross-sectional view showing a step after the step shown in FIG. 15 according to the embodiment.

Next, as shown in FIG. 16, by performing etching treatment using the remaining portion etc. of the TEOS film as an etching mask (hard mask), a portion of the SiOC film (Low-k film) of the fourth insulating film IF4 located in the pixel region PE is removed, and a pixel hole PEH is formed in the pixel region PE. In this way, the process of thinning the insulating film etc. located over the pixel element DTE is performed (height reduction).

Figure 17:
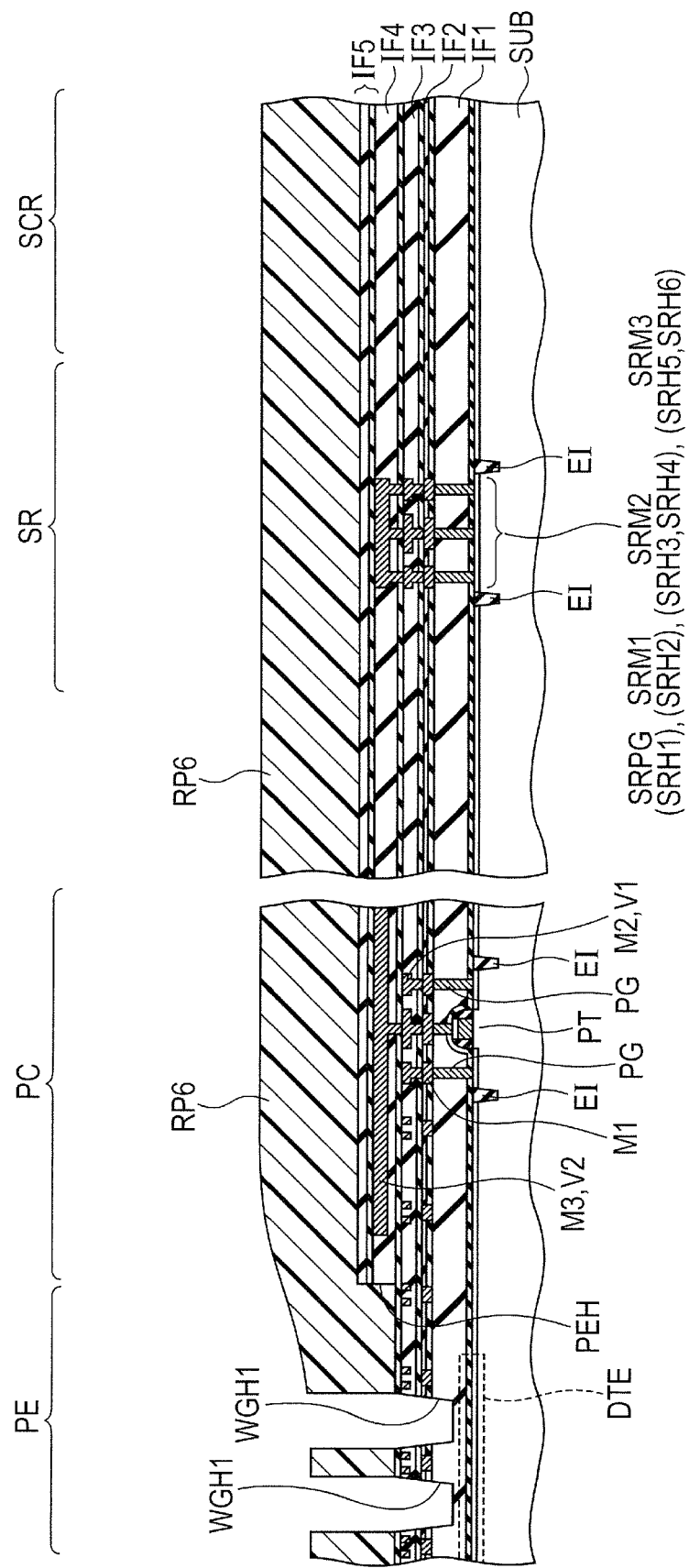
FIG. 17 is a partial cross-sectional view showing a step after the step shown in FIG. 16 according to the embodiment.
Figure 18:
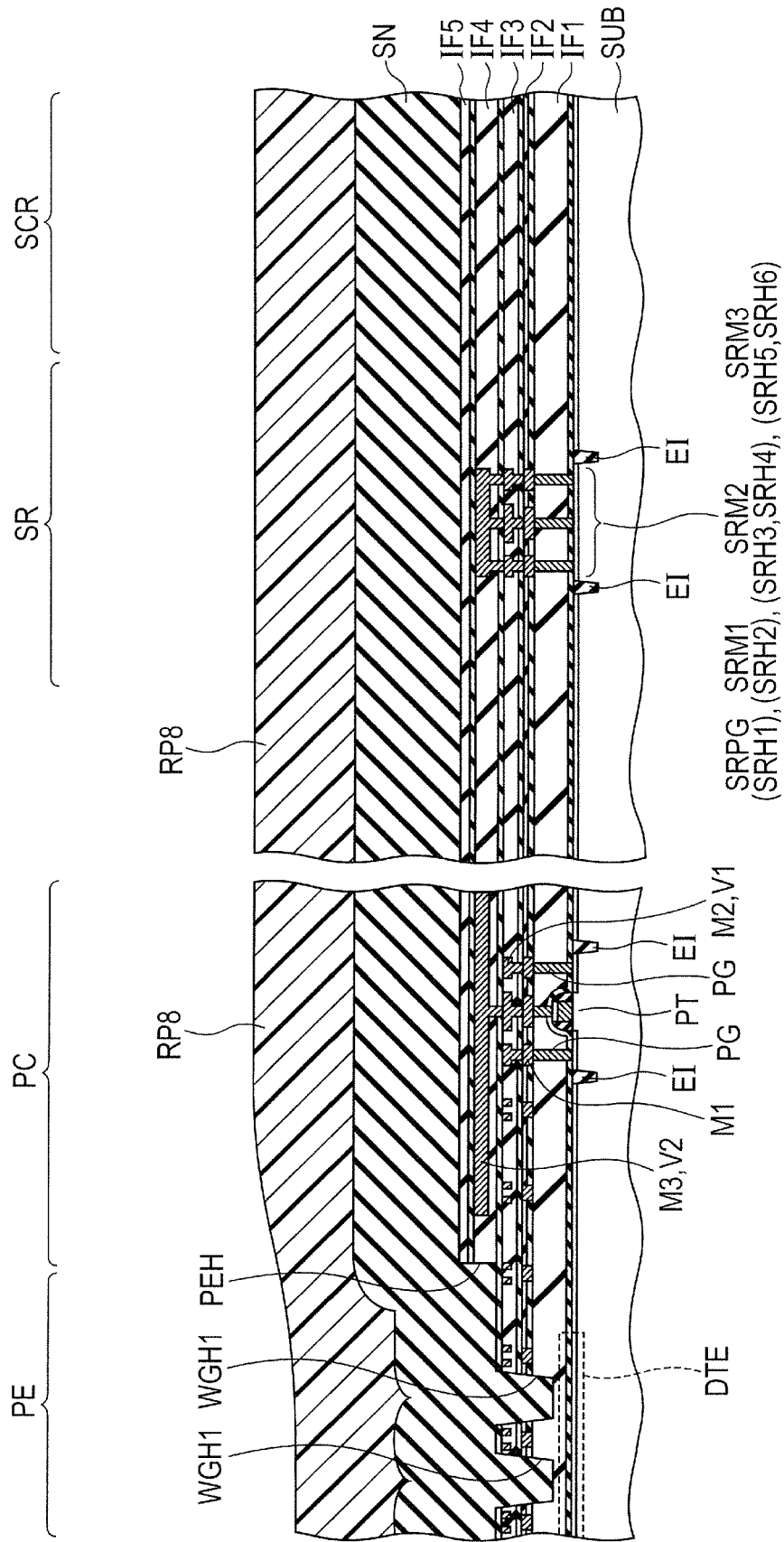
FIG. 18 is a partial cross-sectional view showing a step after the step shown in FIG. 17 according to the embodiment.

Next, as shown in FIG. 17, by a lithography process, a photoresist RP6 for forming a first waveguide holding hole is formed. Next, by performing etching treatment using the photoresist RP6 as an etching mask, a first waveguide holding hole WGH1 is formed in the pixel region PE. Subsequently, the photoresist RP6 is removed. Next, as shown in FIG. 18, a thick silicon nitride film SN is so formed as to fill the first waveguide holding hole WGH1. Next, a photoresist RP8 is so applied as to cover the silicon nitride film SN. Next, etch back treatment is subjected to the photoresist RP8. Then, by subjecting etching treatment to the exposed silicon nitride film SN, the silicon nitride film SN is flattened (see FIG. 19).

In this way, by filling the first waveguide holding hole WGH1 with the silicon nitride film SN, a first waveguide WG1 is formed. At this time, in the seal ring region SR, there are laminated a SiCN film (having a thickness of about 30 nm) and a SiCO film (having a thickness of about 30 nm) as liner films, a TEOS film (having a thickness of about 100 nm), and a silicon nitride film SN (having a thickness of about 400 nm) over the seal ring SRM3.

Figure 19:
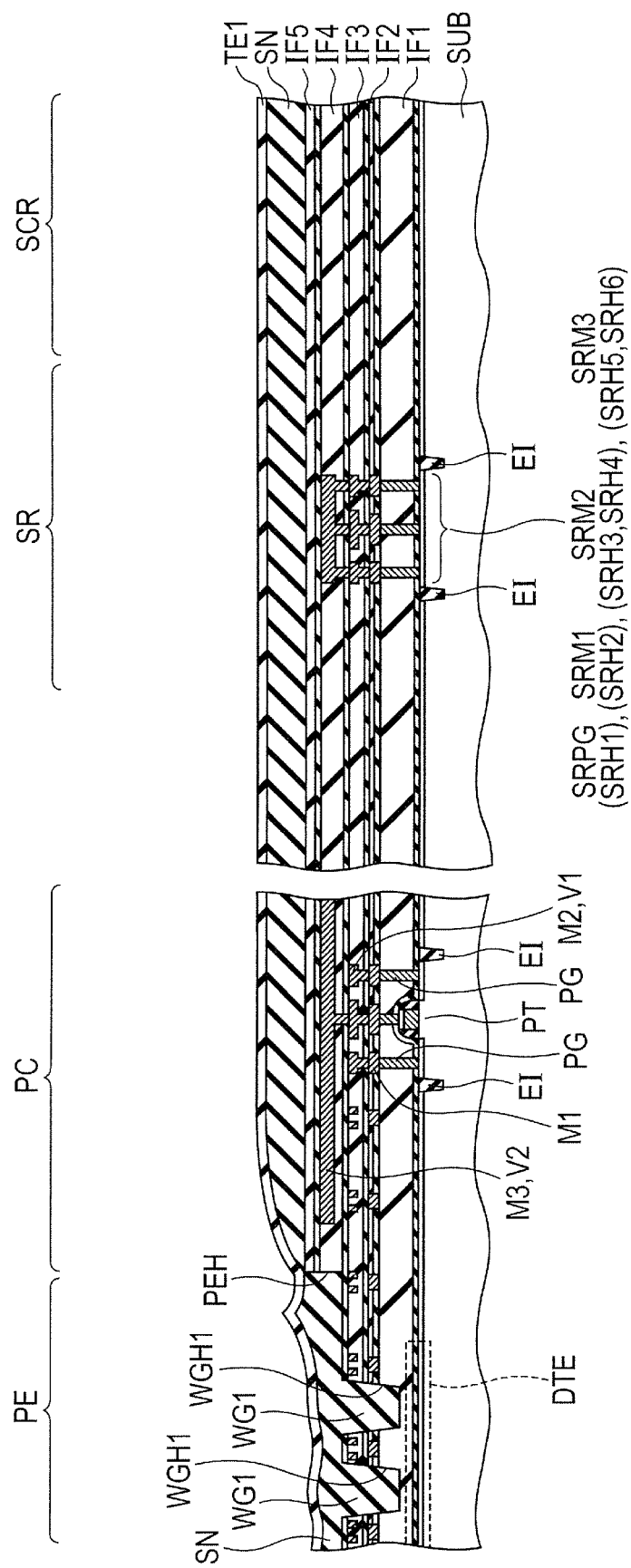
FIG. 19 is a partial cross-sectional view showing a step after the step shown in FIG. 18 according to the embodiment.
Figure 20:
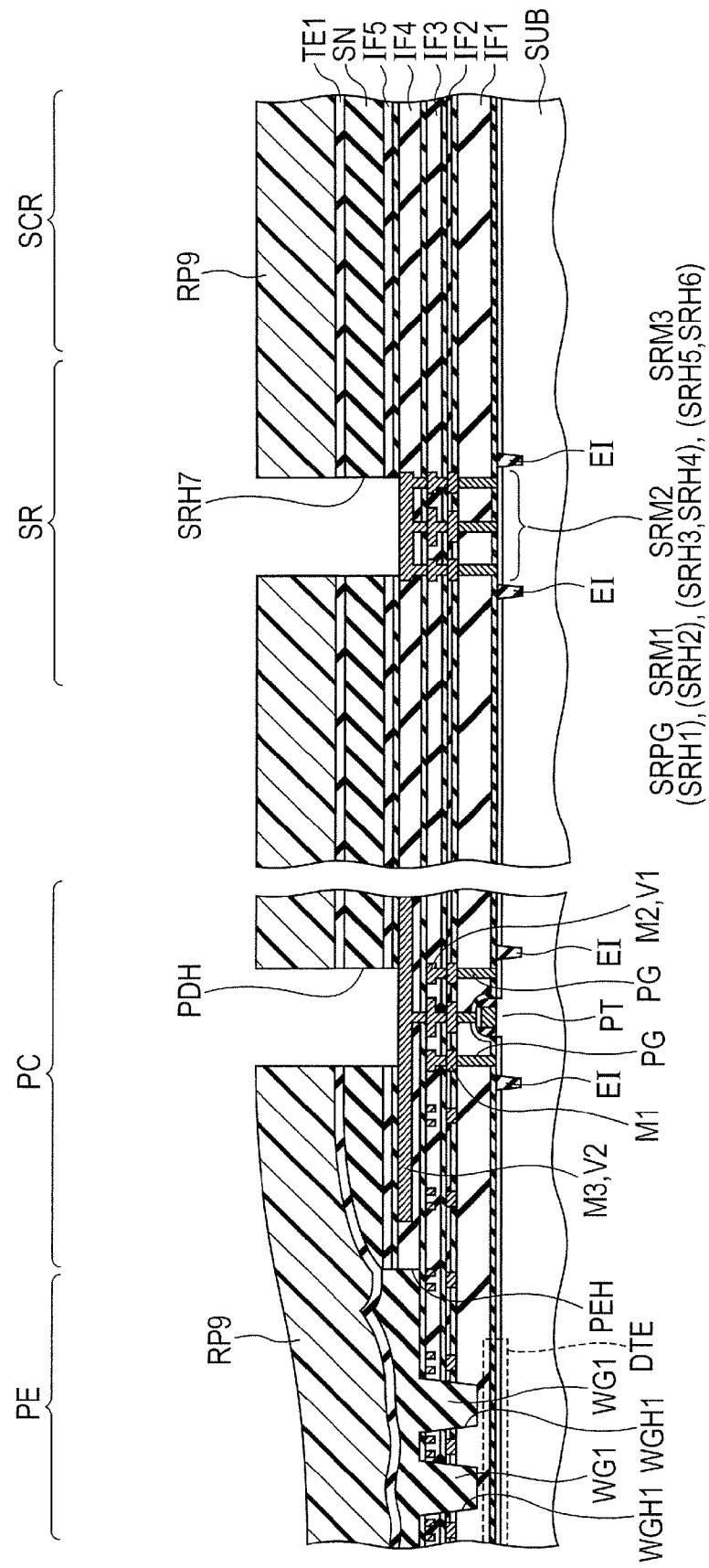
FIG. 20 is a partial cross-sectional view showing a step after the step shown in FIG. 19 according to the embodiment.

Next, as shown in FIG. 19, the TEOS film TE1 (having a thickness of about 200 nm) is so formed as to cover the silicon nitride film SN. Next, as shown in FIG. 20, by a lithography process, a pattern of a photoresist RP9 for forming a pad hole and a seal ring hole is formed. Next, using the photoresist RP9 as an etching mask, by subjecting etching treatment to the TEOS film TE1 and the silicon nitride film SN or the like, a pad hole PDH for exposing a third wiring M3 is formed in the peripheral circuit region PC. In the seal ring region SR, a seal ring hole SRH7 for exposing the seal ring SRM3 is formed. Subsequently, the photoresist RP9 is removed.

Figure 21:
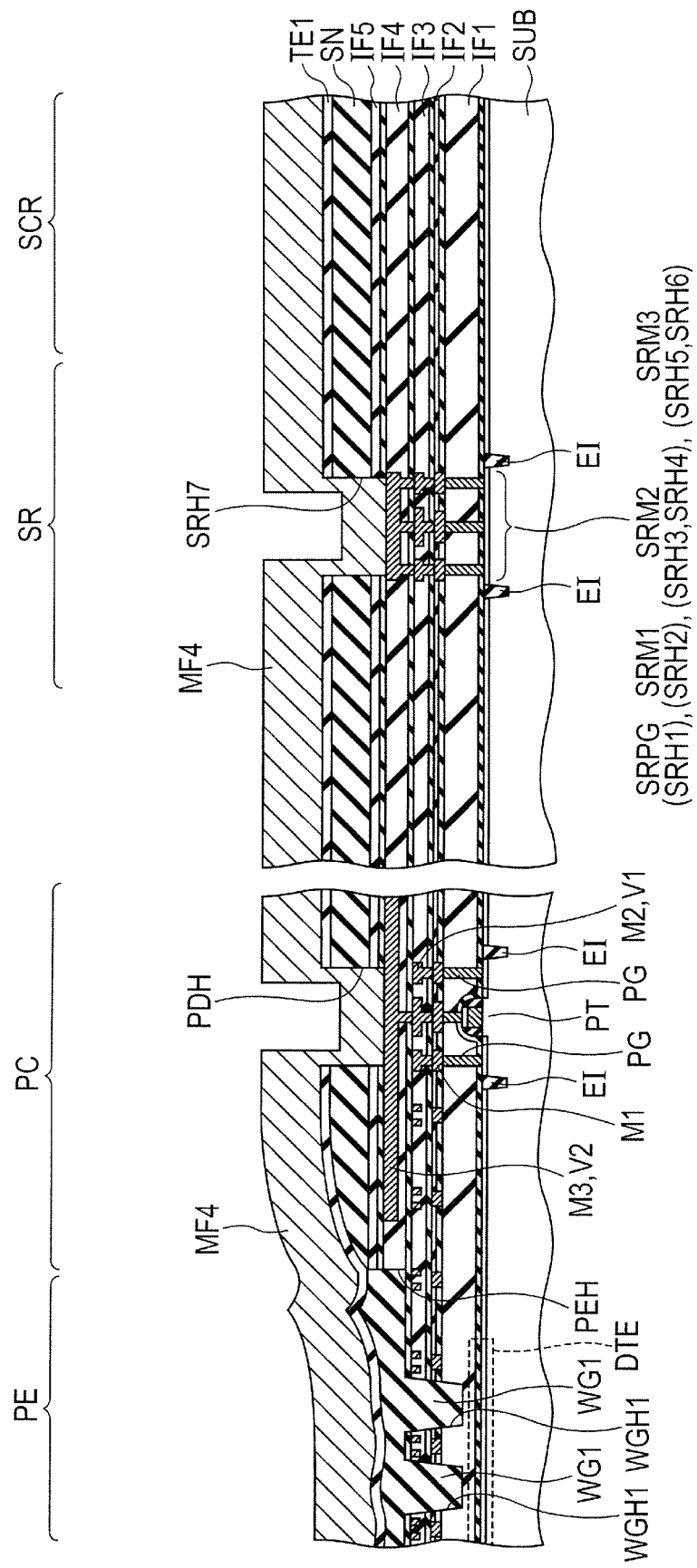
FIG. 21 is a partial cross-sectional view showing a step after the step shown in FIG. 20 according to the embodiment.

Next, as a barrier film, a titanium film (having a thickness of about 10 nm) and a titanium nitride film (having a thickness of about 50 nm) (neither is shown) are so formed as to cover the TEOS film TE1. Next, as shown in FIG. 21, an aluminum film MF4 (having a thickness of about 600 nm) is formed by the sputtering method.

Figure 22:
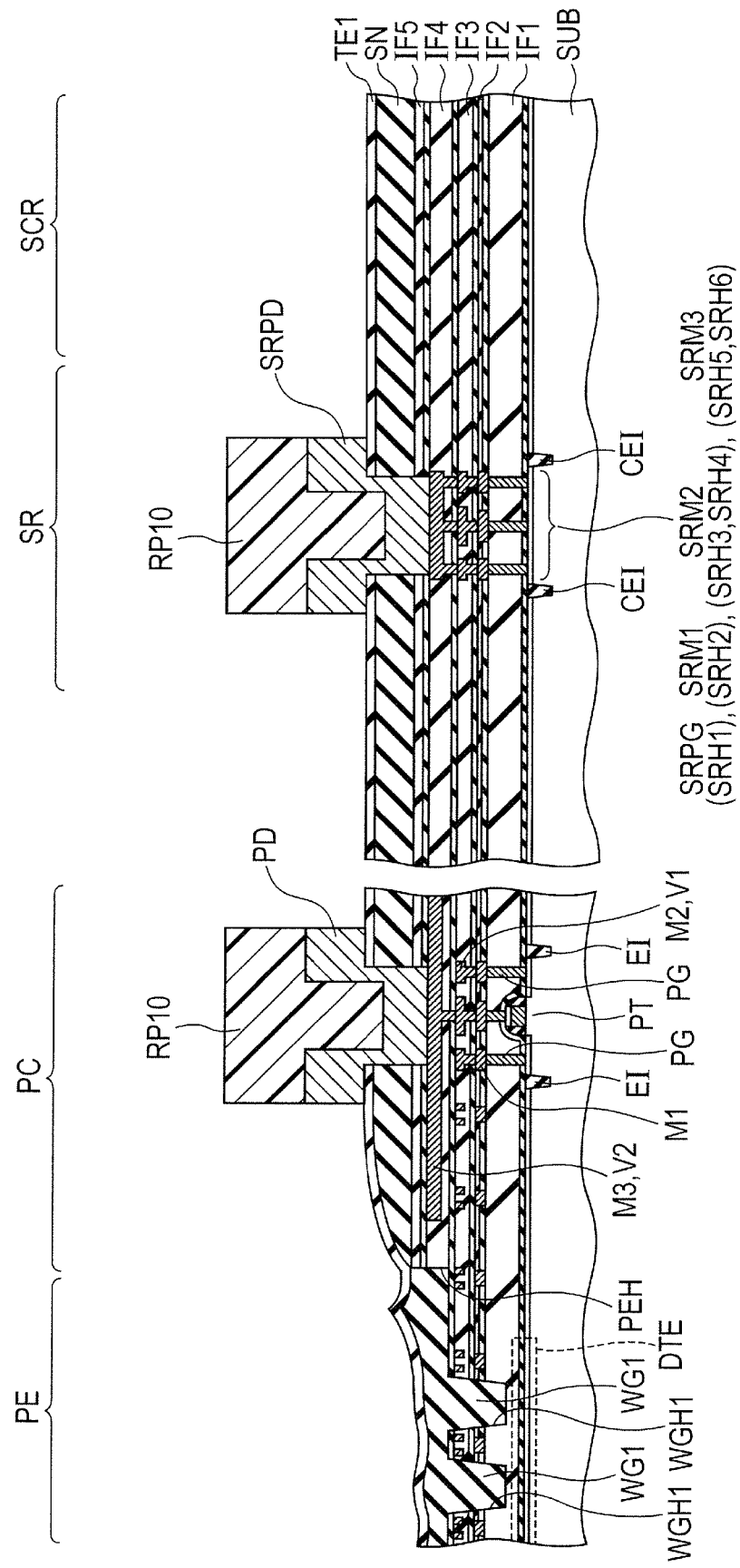
FIG. 22 is a partial cross-sectional view showing a step after the step shown in FIG. 21 according to the embodiment.

Next, as shown in FIG. 22, by a lithography process, a pattern of a photoresist RP10 for forming a pad electrode and a seal ring is formed. Next, using the photoresist RP10 as an etching mask, by subjecting etching treatment to an aluminum film MF4 etc., in the peripheral circuit region PC, a pad electrode PD electrically coupled to the third wiring M3 is formed in the pad hole PDH. In the seal ring region SR, a seal ring SRPD is formed in the seal ring hole SRH7. The seal ring SRPD is formed like a wall which is in contact with an upper surface of the seal ring SRM3 and continuously encloses the pixel region PE and the peripheral circuit region PC. Subsequently, the photoresist RP10 is removed.

Figure 23:
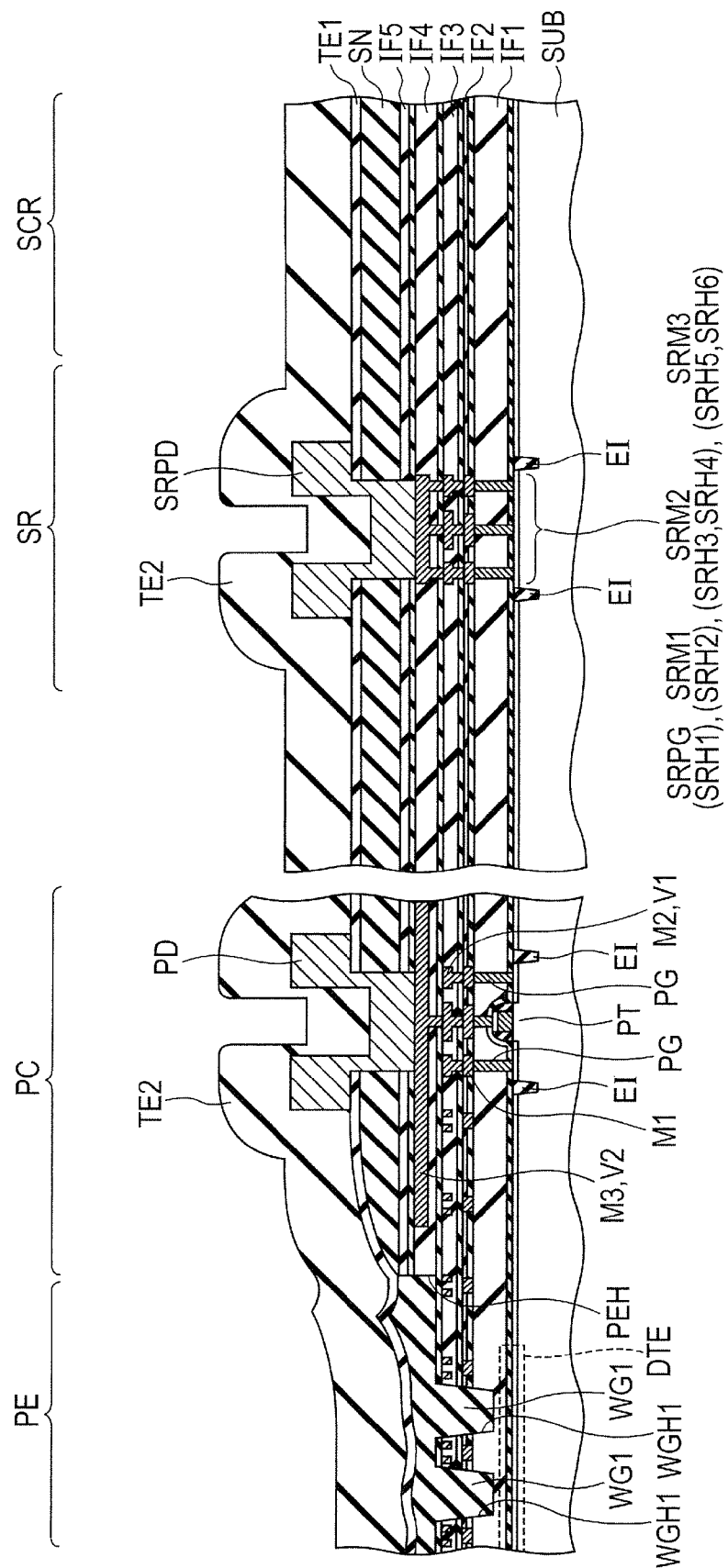
FIG. 23 is a partial cross-sectional view showing a step after the step shown in FIG. 22 according to the embodiment.
Figure 24:
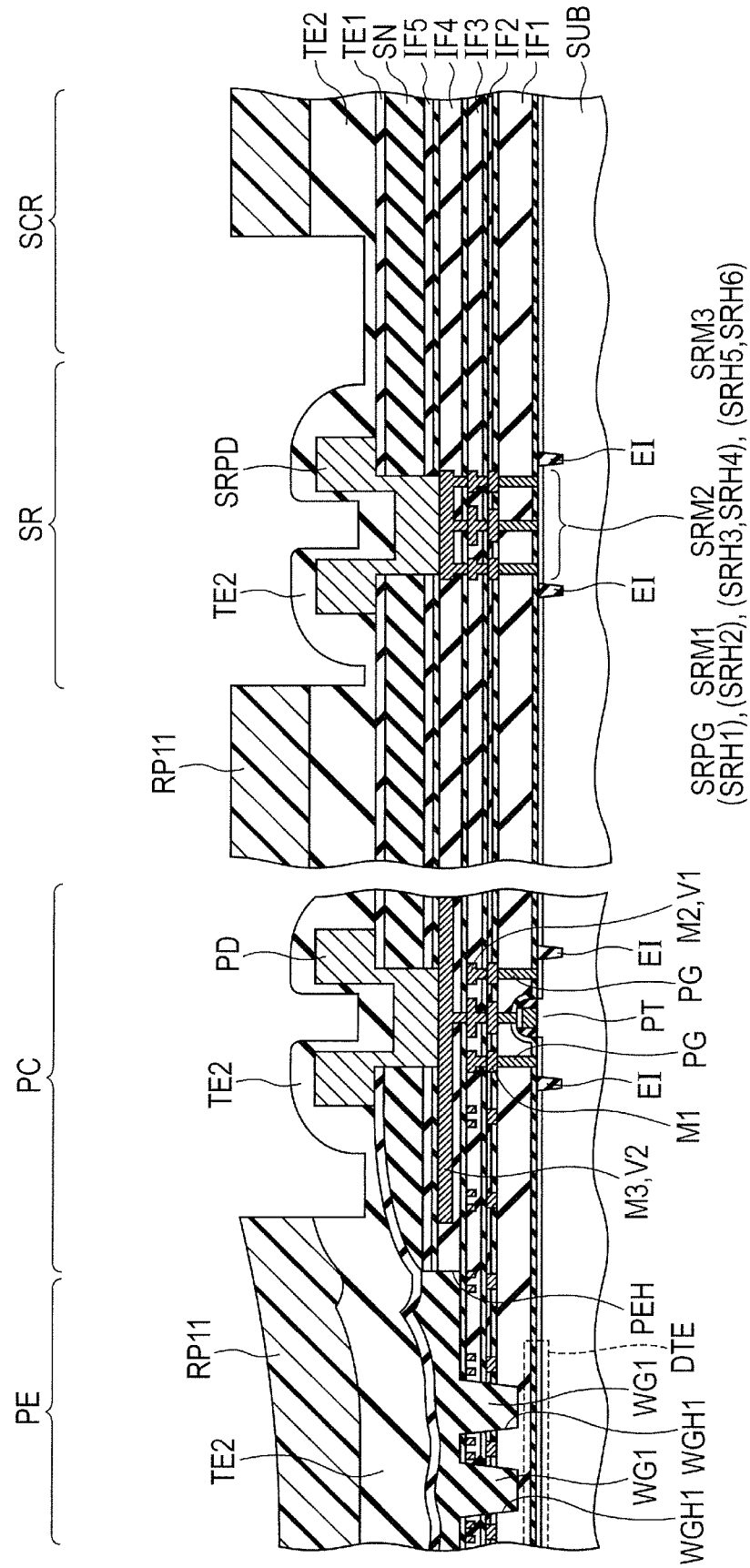
FIG. 24 is a partial cross-sectional view showing a step after the step shown in FIG. 23 according to the embodiment.

Next, as shown in FIG. 23, a TEOS film TE2 (having a thickness of about 750 nm) is formed as a passivation film. Next, of the TEOS film TE2, regarding a portion covering the pad electrode PD and a portion covering the seal ring SRPD having relatively big level differences with respect to the pixel region PE, a process to reduce the level differences of the TEOS film TE2 is performed. As shown in FIG. 24, by a lithography process, there are exposed a portion of the TEOS film TE2 covering the pad electrode PD in the peripheral circuit region PC and a portion of the TEOS film TE2 covering the seal ring SRPD in the seal ring region SR, respectively, and a pattern of a photoresist RP11 covering a portion of the TEOS film TE2 located in another region is formed.

As will be described later, in the pattern of the photoresist RP11, there is exposed a portion of the TEOS film TE2 located in a region of about 1 μm from an edge of the seal ring SRPD on the peripheral circuit region PC side to the peripheral circuit region PC side. Also, there is exposed a portion of the TEOS film TE2 located in a region of about 3 μm from an edge of the seal ring SRPD on the scribe region SCR side to the scribe region SCR side. Next, by performing dry etching treatment using the photoresist RP11 as an etching mask, an exposed portion of about 550 nm of the TEOS film TE2 is removed. In this regard, as an example of the dry etching treatment, for instance, there is known reactive ion etching with use of fluorocarbon gas ($CHF_3$, $C_2F_6$). Subsequently, the photoresist RP11 is removed.

As a result, each of the level differences of the TEOS film TE2 located in the peripheral circuit region PC (pad electrode PD) and the seal ring region SR (seal ring SRPD) with respect to the TEOS film TE2 located in the pixel region PE is reduced. Moreover, in regard to the seal ring SRPD, grooves are formed on the sides of the peripheral circuit region PC and the scribe region SCR, respectively, along the seal ring SRPD. A width of the groove formed on the side of the scribe region SCR is greater than a width of the groove formed on the side of the peripheral circuit region PC.

Figure 25:
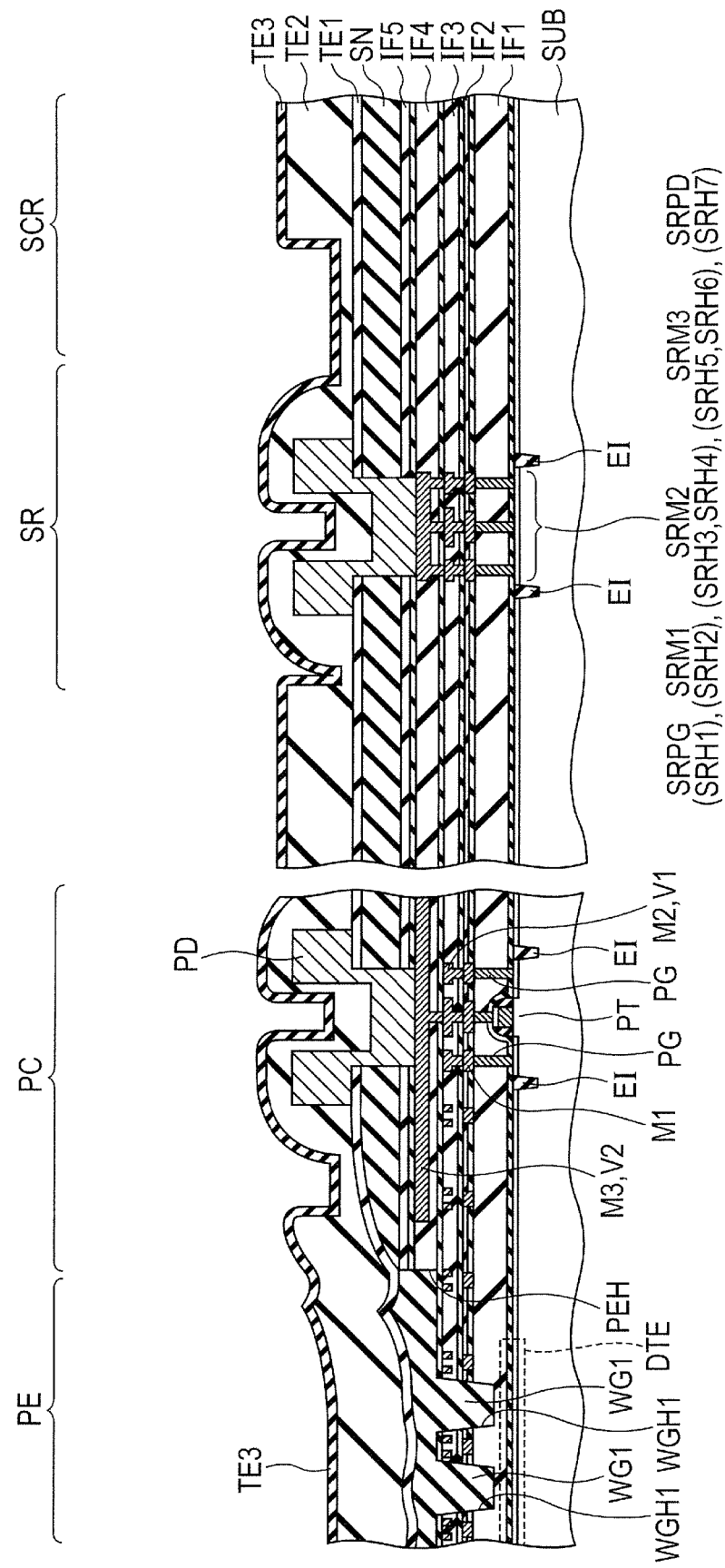
FIG. 25 is a partial cross-sectional view showing a step after the step shown in FIG. 24 according to the embodiment.
Figure 26:
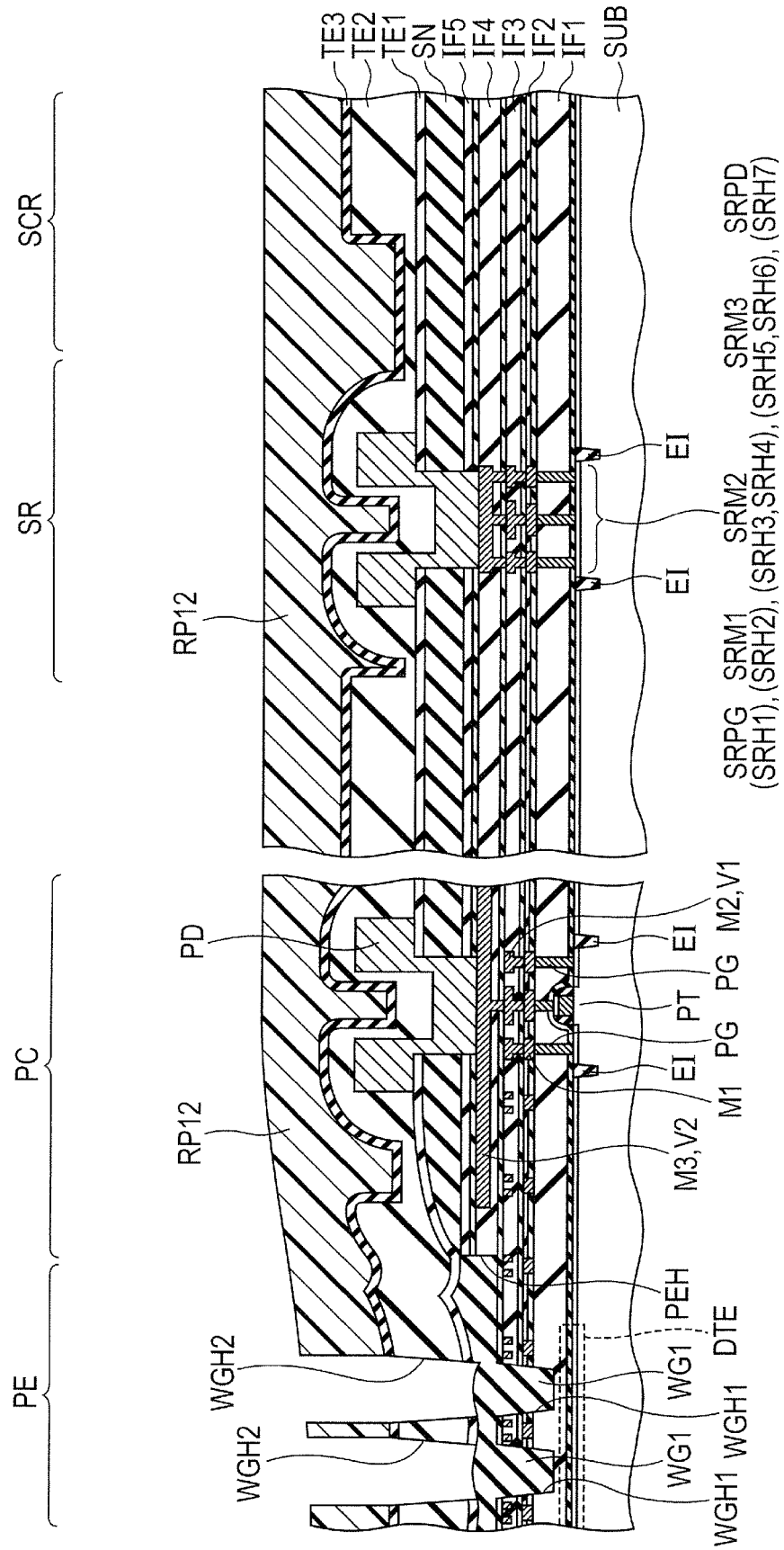
FIG. 26 is a partial cross-sectional view showing a step after the step shown in FIG. 25 according to the embodiment.

Next, as shown in FIG. 25, a TEOS film TE3 (having a width of about 100 nm) is further formed so as to cover the TEOS film TE2. Next, as shown in FIG. 26, by a lithography process, a pattern of a photoresist RP12 for forming a second waveguide holding hole is formed. Next, by performing etching treatment using the photoresist RP12 as an etching mask, a second waveguide holding hole WGH2 for exposing the first waveguide WG1 in the pixel region PE is formed.

At this time, as described later, in particular, since the level difference (height) of the TEOS film TE2 located in the seal ring region SR is reduced, even if the surface of the photoresist RP12 is removed to some extent by the etching treatment, it is possible to prevent the surface of the TEOS film TE2 from being exposed. After the second waveguide holding hole WGH2 has been formed, the photoresist RP12 is removed.

Figure 27:
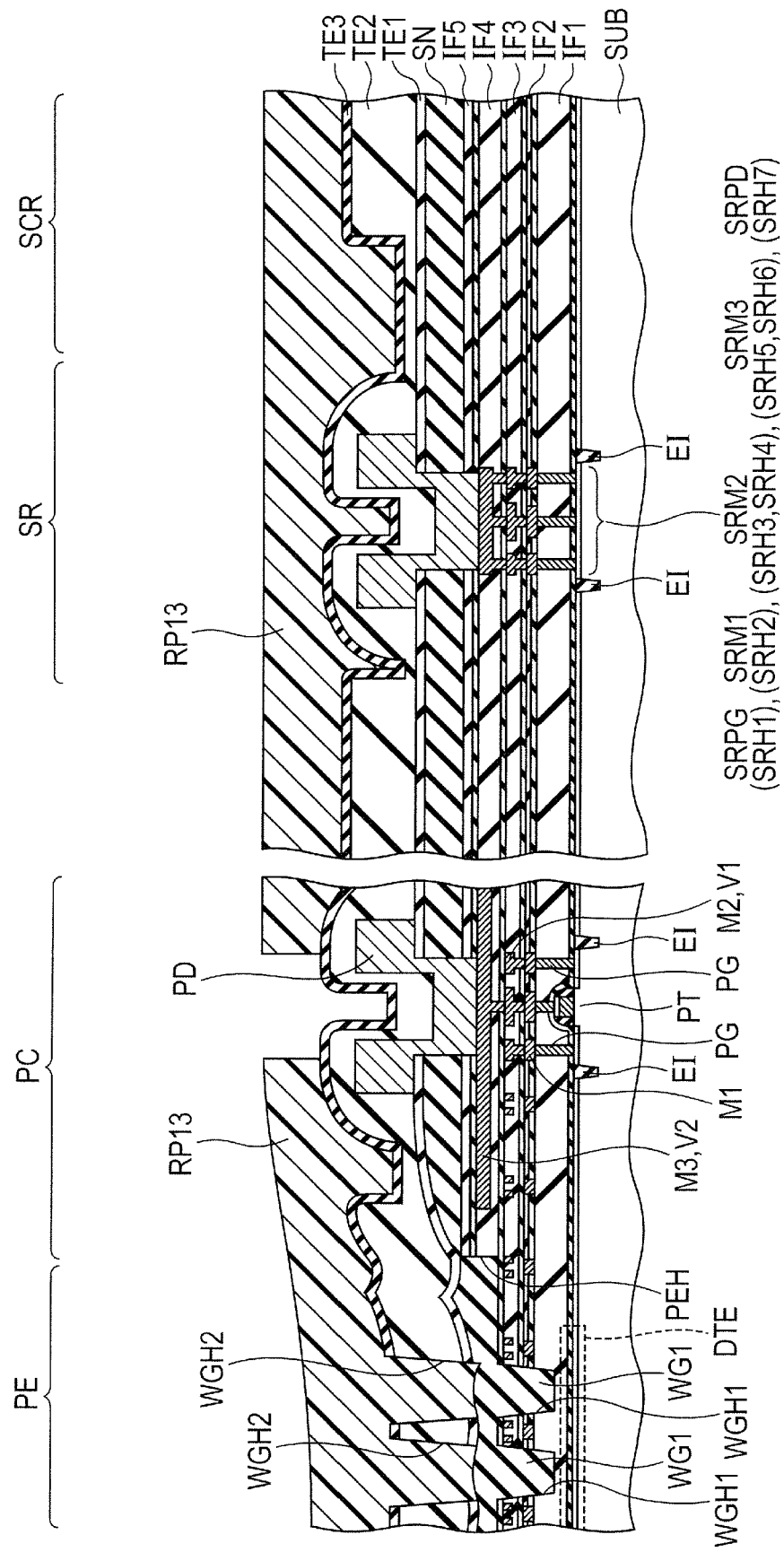
FIG. 27 is a partial cross-sectional view showing a step after the step shown in FIG. 26 according to the embodiment.
Figure 28:
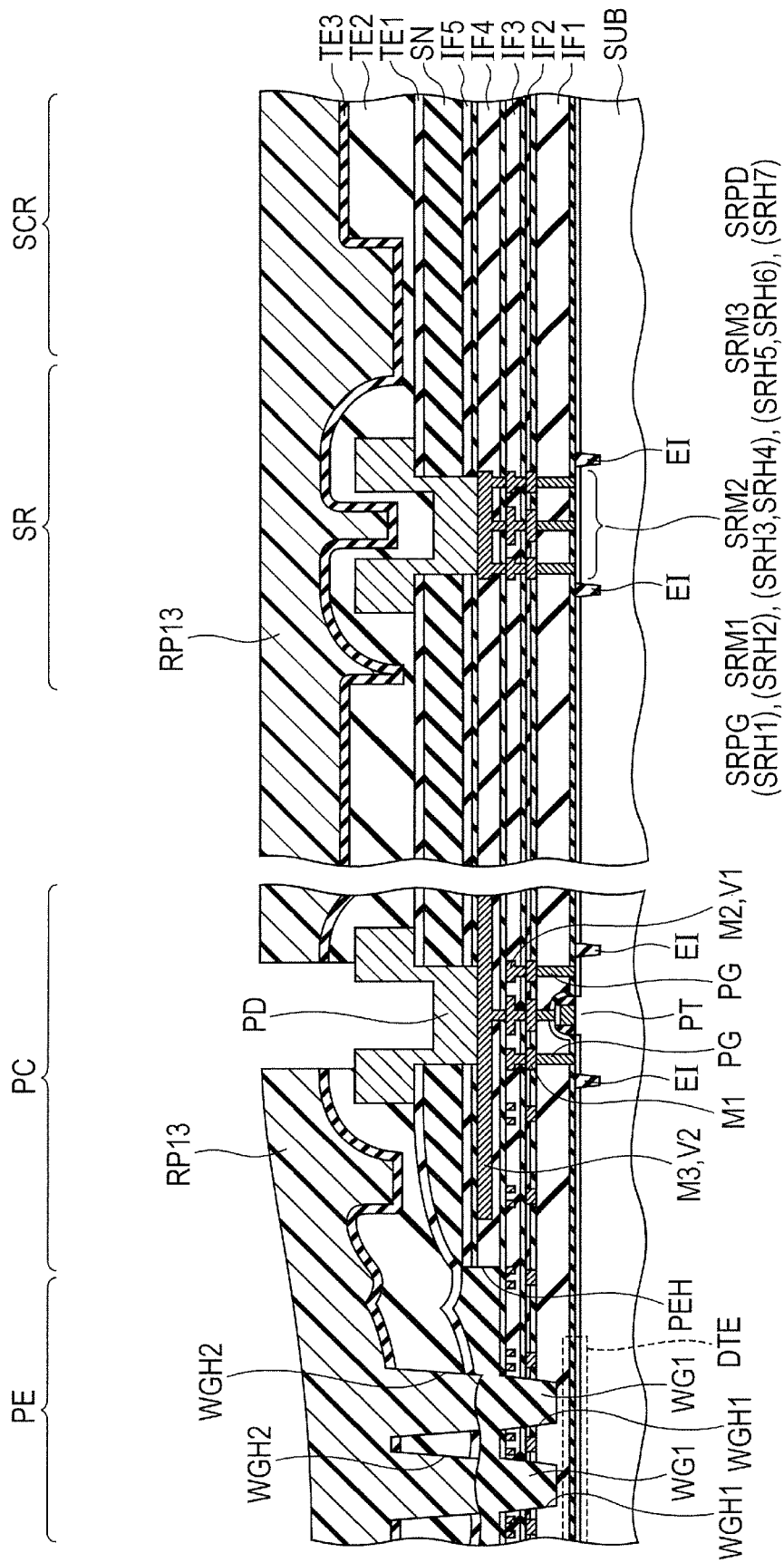
FIG. 28 is a partial cross-sectional view showing a step after the step shown in FIG. 27 according to the embodiment.
Figure 29:
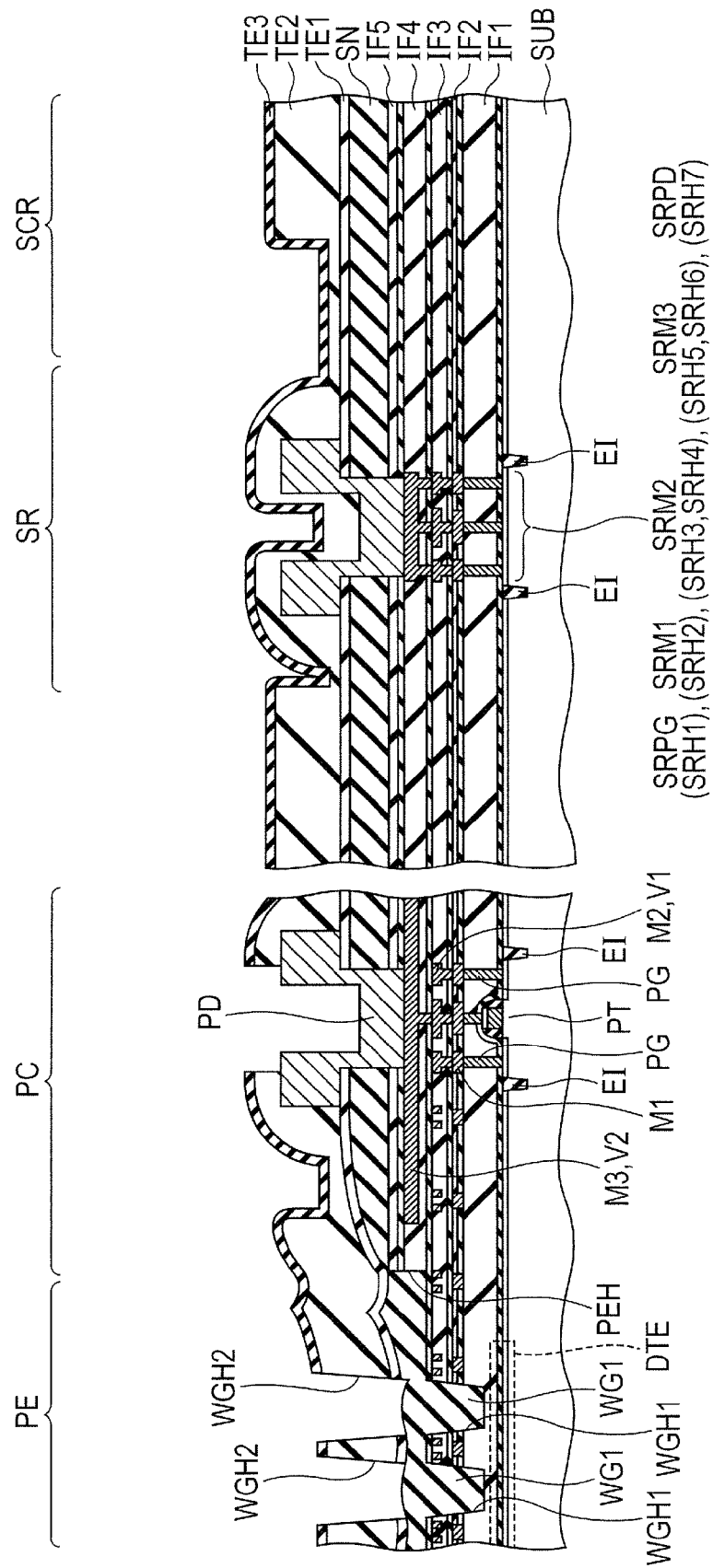
FIG. 29 is a partial cross-sectional view showing a step after the step shown in FIG. 28 according to the embodiment.

Next, as shown in FIG. 27, by a lithography process, a pattern of a photoresist RP13 for exposing the pad electrode PD is formed. Next, as shown in FIG. 28, using the photoresist RP13 as an etching mask, by subjecting etching treatment to the TEOS film TE3 and the TEOS film TE2, a surface of the pad electrode PD is exposed. Subsequently, as shown in FIG. 29, by removing the photoresist RP13, the second waveguide holding hole WGH2 or the like is exposed.

Figure 30:
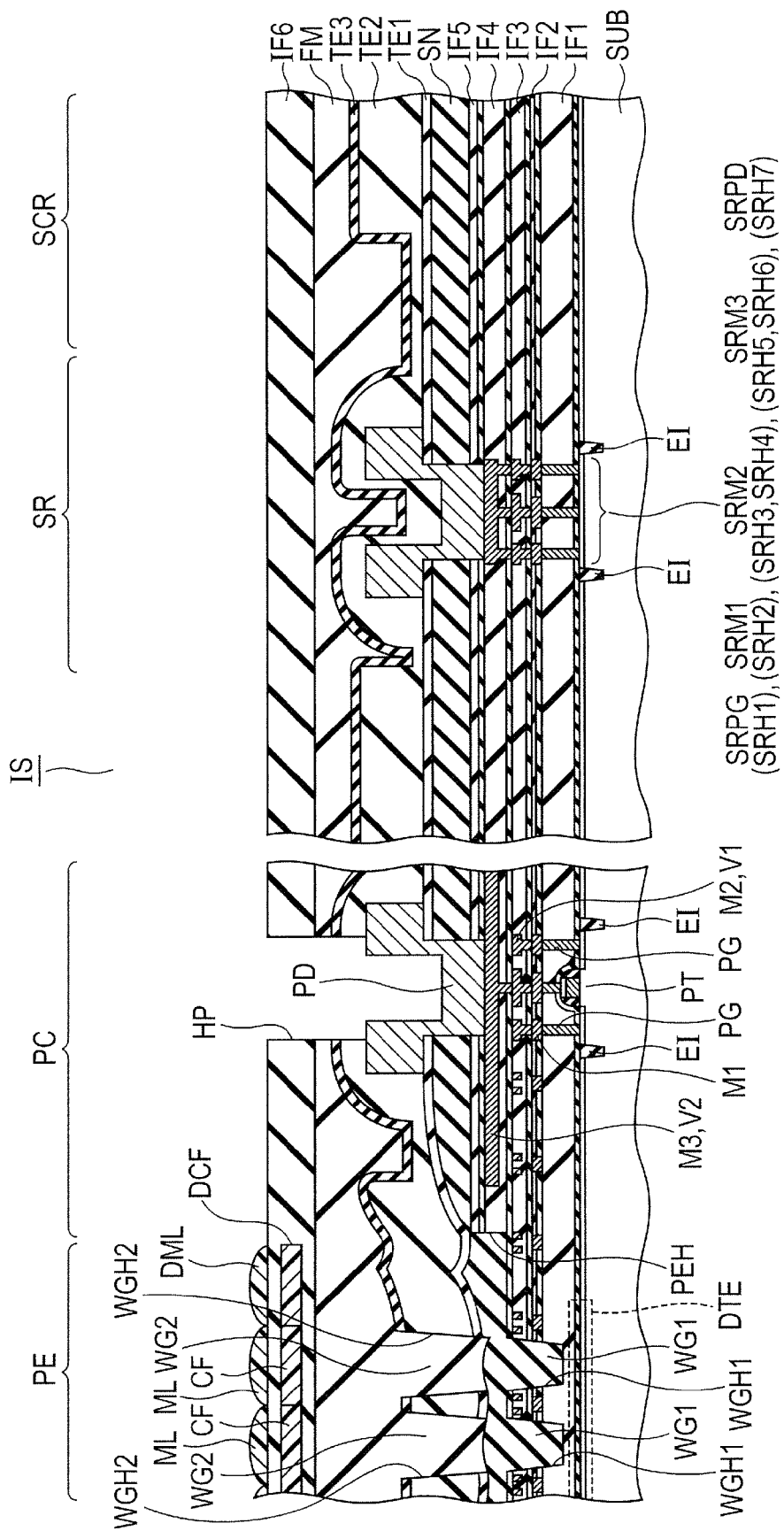
FIG. 30 is a partial cross-sectional view showing a step after the step shown in FIG. 29 according to the embodiment.

Next, as shown in FIG. 30, an insulating gap fill member FM of a coating type is so formed as to fill the second waveguide holding hole WGH2 and to cover the TEOS film TE3. By the gap fill member FM filled in the second waveguide holding hole WGH2, a second waveguide WG2 in communication with the first waveguide WG1 is formed.

Next, in the pixel region PE, by a lithography process, a color filter CF and a dummy color filter DCF are formed over the gap fill member FM. Next, a sixth insulating film IF6 is so formed as to cover the color filter CF and the dummy color filter DCF. Further, in the pixel region PE, over a surface of the sixth insulating film IF6, a micro lens ML corresponding to the color filter CF and a dummy micro lens DML corresponding to the dummy color filter DCF are formed. Also, in the peripheral circuit region PC, a hole HP for exposing a surface of the pad electrode PD is formed. Subsequently, by dicing the scribe region SCR, principal parts of the imaging device IS are completed.

According to the manufacturing method of the imaging device described above, it is possible to prevent the surface of the TEOS film TE2 from getting rough by etching treatment during the formation of the second waveguide holding hole. In this regard, an explanation will be made while comparing with an imaging device according to a comparative example.

In the imaging device according to the comparative example, first, steps until formation of the TEOS film covering the pad electrode are the same as the manufacturing steps of First Embodiment described above, which will be explained briefly. Also, in regard to reference characters of the comparative example, as for members corresponding to members used in First Embodiment, a character "C" is affixed before each of first letters of the reference characters concerned.

Figure 31:
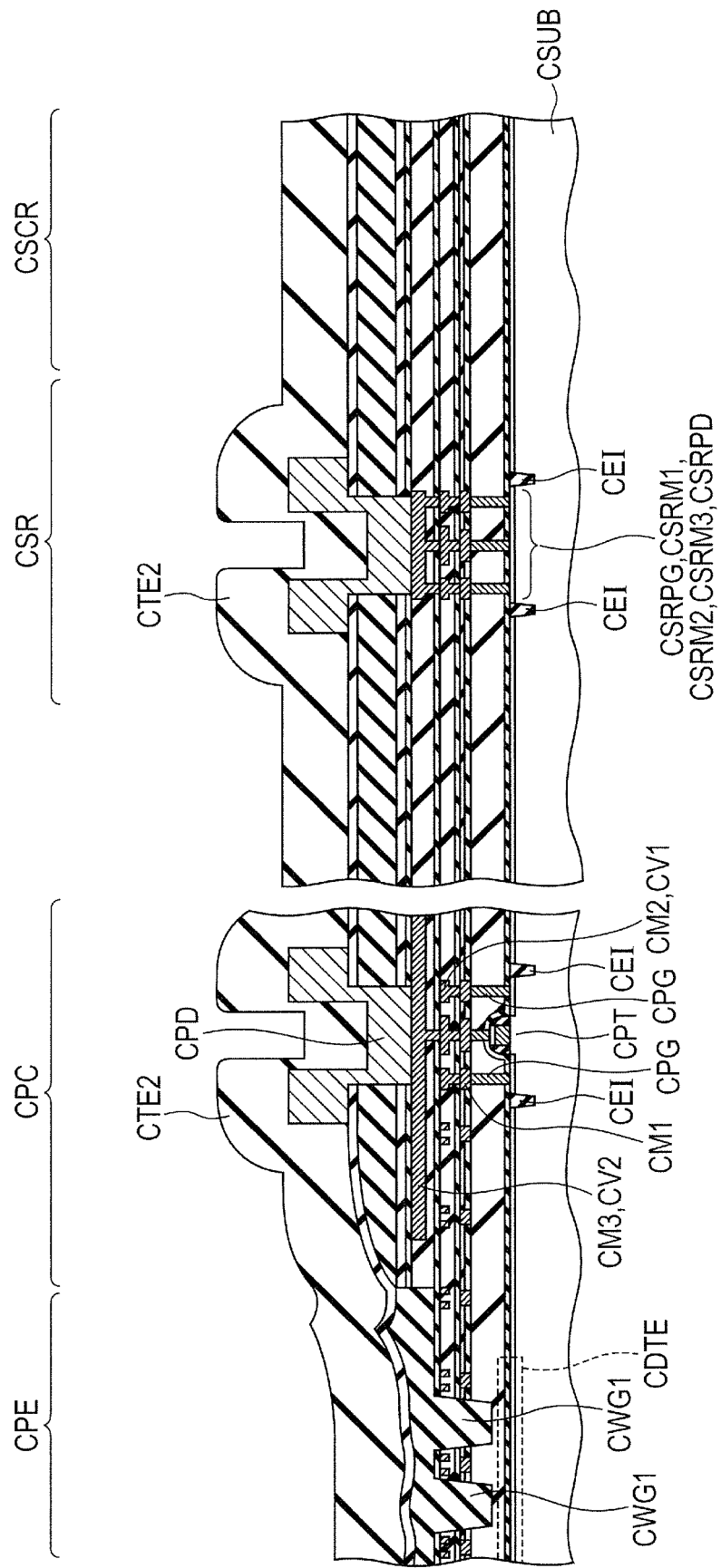
FIG. 31 is a partial cross-sectional view showing one step of a manufacturing method of an imaging device according to a comparative example.

As shown in FIG. 31, a pixel region CPE, a peripheral circuit region CPC, and a seal ring region CSR or the like are defined by forming an element-isolation insulating film CEI over the semiconductor substrate CSUB. Next, a predetermined pixel element CDTE is formed in the pixel region CPE and elements such as a transistor CPT are formed in the peripheral circuit region CPC. Next, a contact plug CPG is formed in the peripheral circuit region CPC and a seal ring CSRPG is formed in the seal ring region CSR. Next, a first wiring CM1 is formed in the peripheral circuit region CPC and a seal ring CSRM1 is formed in the seal ring region CSR.

Next, a via CV1 and s second wiring CM2 are formed in the peripheral circuit region CPC and a seal ring CSRM2 is formed in the seal ring region CSR. Next, a via CV2 and a third wiring CM3 are formed in the peripheral circuit region CPC and a seal ring CSRM3 is formed in the seal ring region CSR. Next, a pad electrode CPD is formed in the peripheral circuit region CPC and a seal ring CSRPD is formed in the seal ring region CSR. Next, a TEOS film CTE2 (having a thickness of about 750 nm) is so formed as to cover the pad electrode CPD and the seal ring CSRPD.

Figure 32:
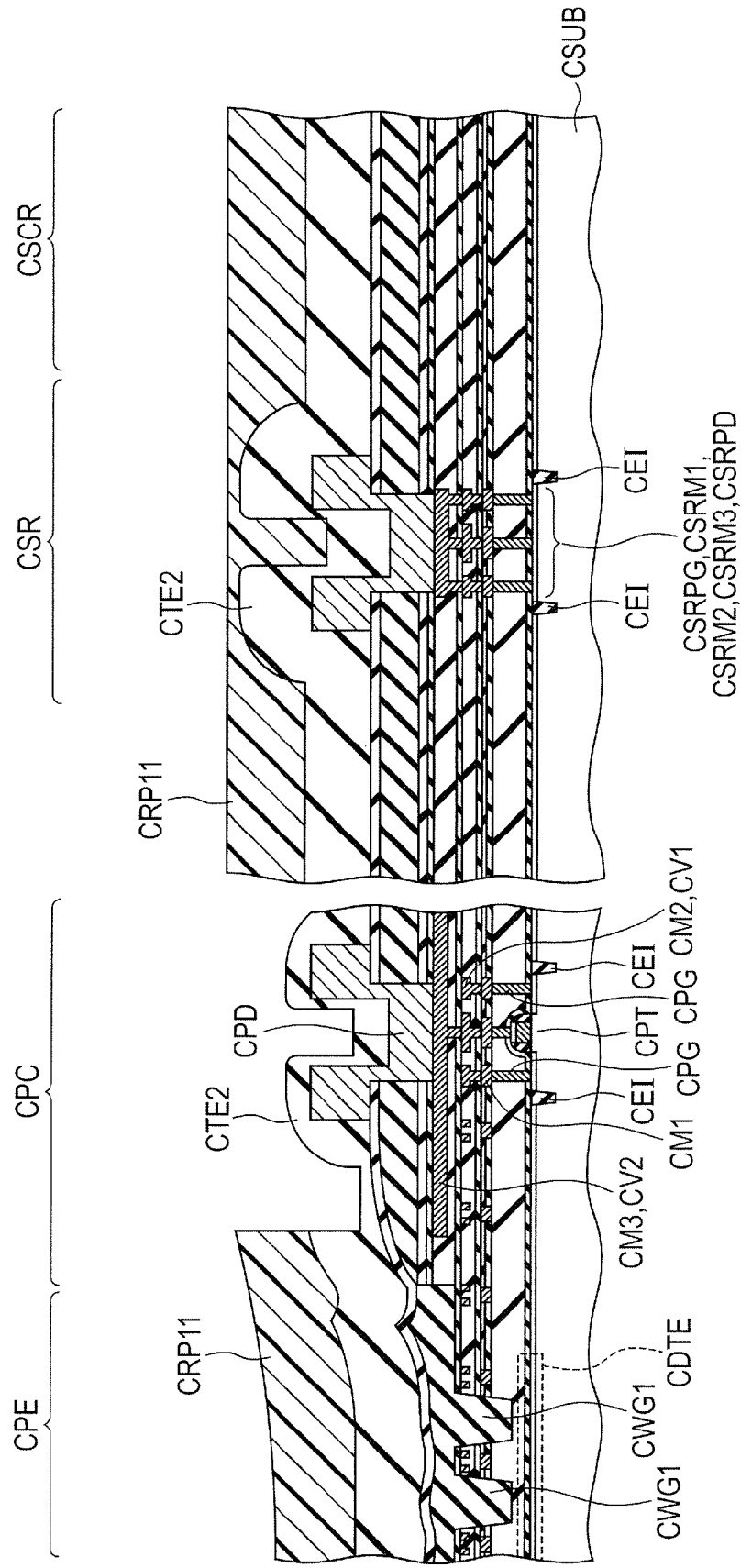
FIG. 32 is a partial cross-sectional view showing a step after the step shown in FIG. 31.

Next, as shown in FIG. 32, by a lithography process, a portion of the TEOS film CTE2 covering the pad electrode PD is exposed, and a pattern of a photoresist CRP11 covering other regions is formed. Next, by performing dry etching treatment using the photoresist CRP11 as an etching mask, an exposed portion of about 550 nm of the TEOS film CTE2 is removed. Subsequently, the photoresist CRP11 is removed.

Figure 33:
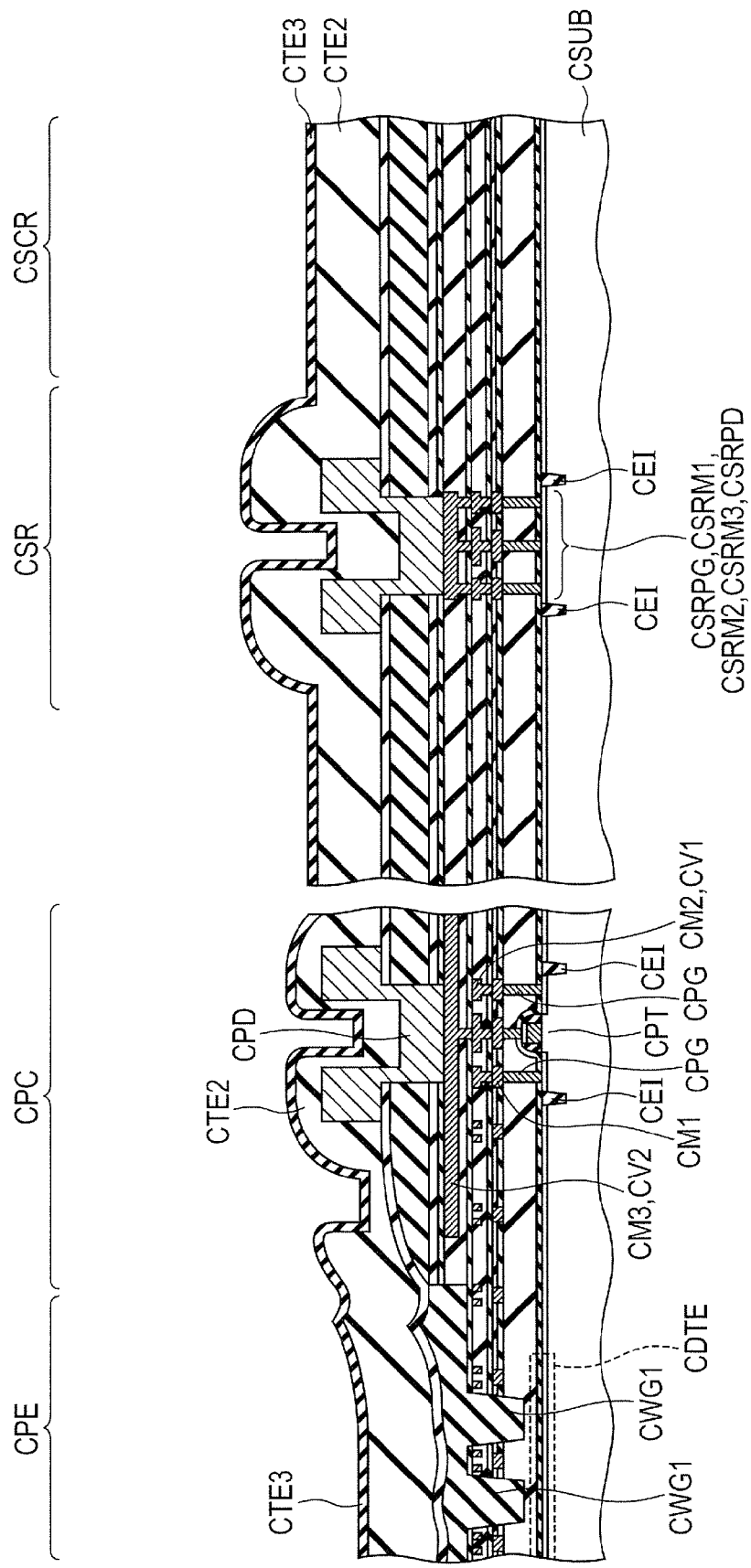
FIG. 33 is a partial cross-sectional view showing a step after the step shown in FIG. 32.
Figure 34:
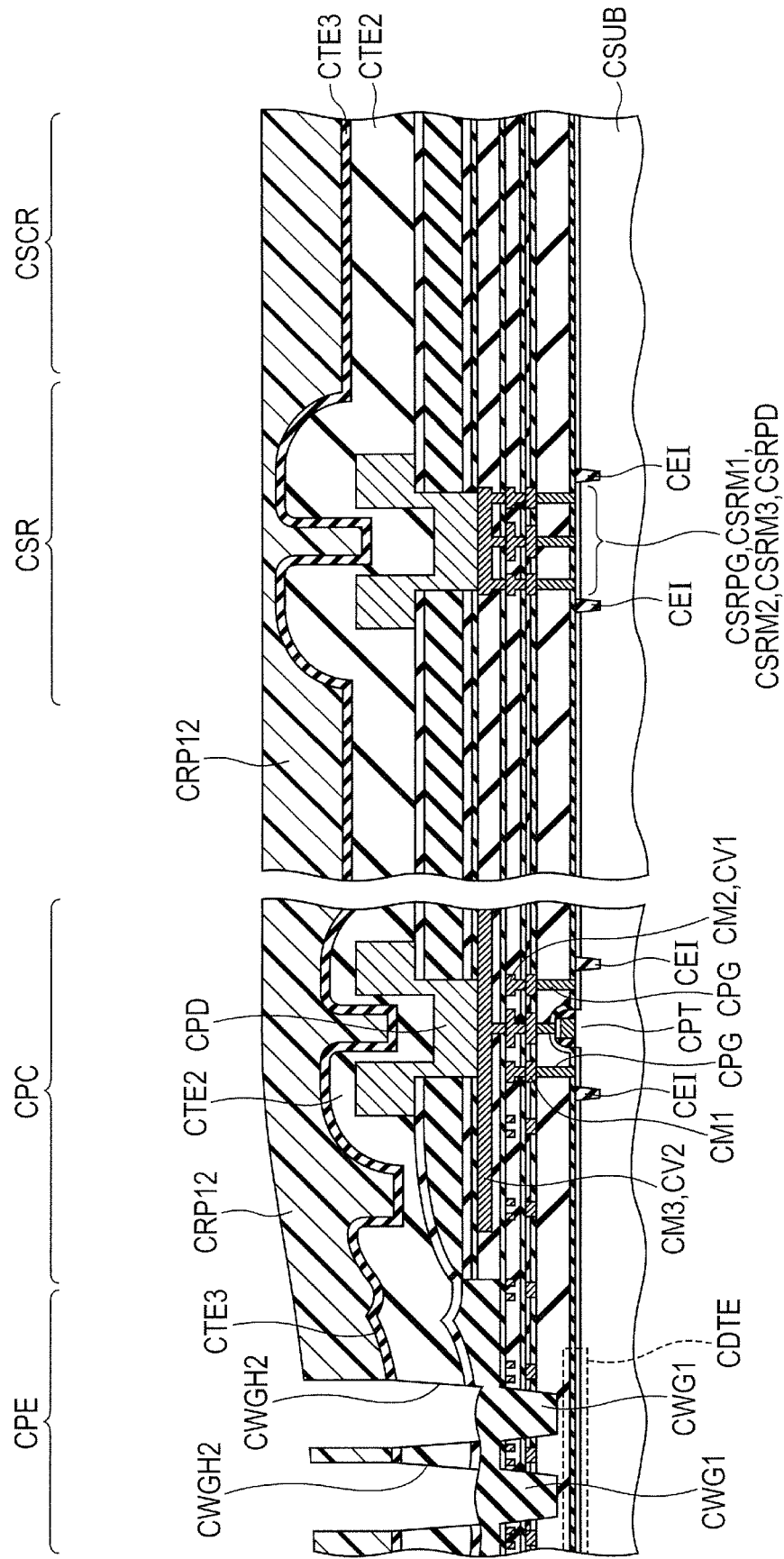
FIG. 34 is a partial cross-sectional view showing a step after the step shown in FIG. 33.

Next, as shown in FIG. 33, a TEOS film CTE3 (having a thickness of about 100 nm) is further formed so as to cover the TEOS film CTE2. Next, as shown in FIG. 34, by a lithography process, a pattern of a photoresist CRP12 for forming a second waveguide holding hole is formed. Next, by performing etching treatment using the photoresist CRP12 as an etching mask, a second waveguide holding hole CWGH2 for exposing the first waveguide WG1 in the pixel region CPE is formed. Subsequently, the photoresist CRP12 is removed.

Figure 35:
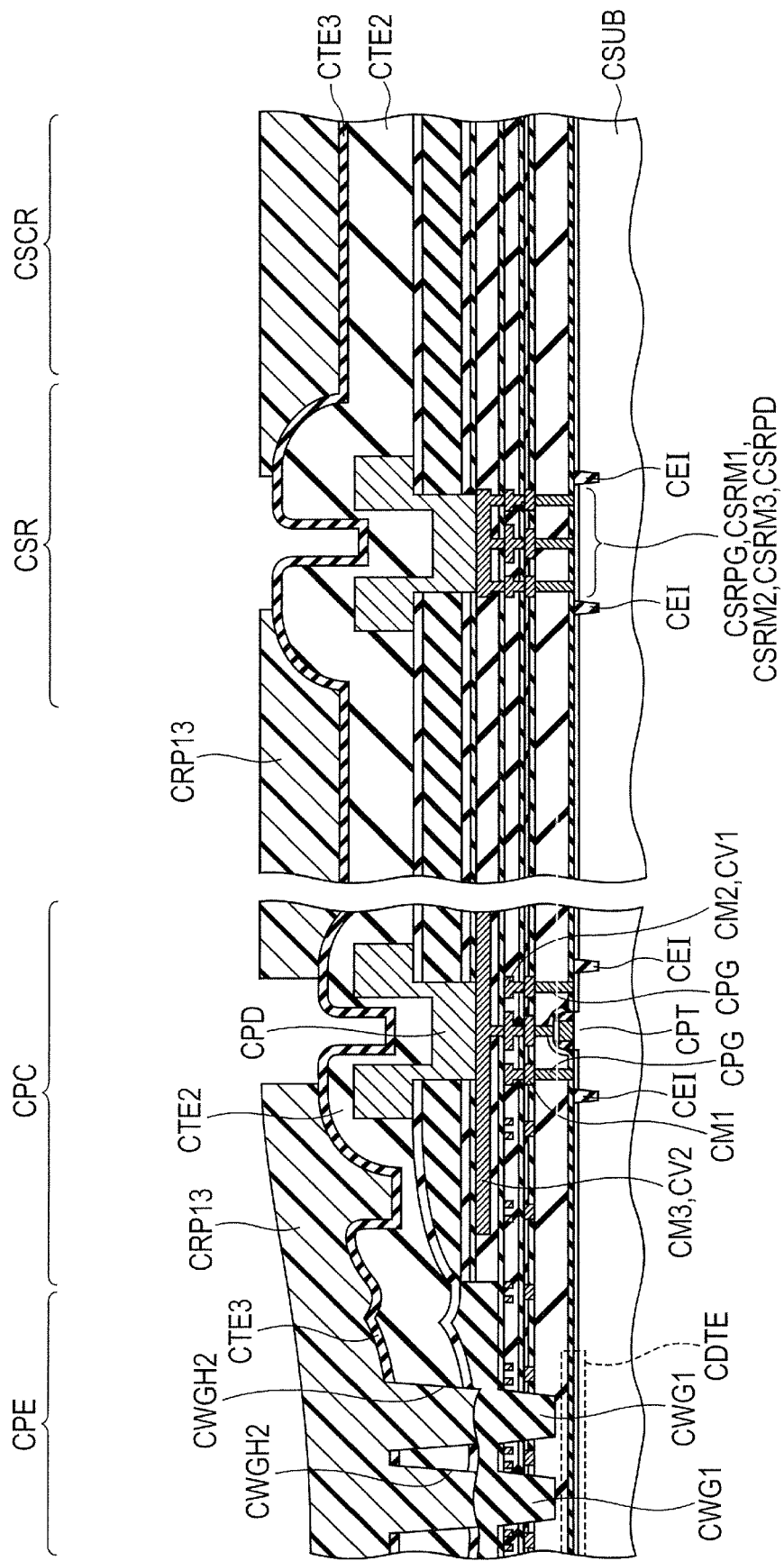
FIG. 35 is a partial cross-sectional view showing a step after the step shown in FIG. 34.
Figure 36:
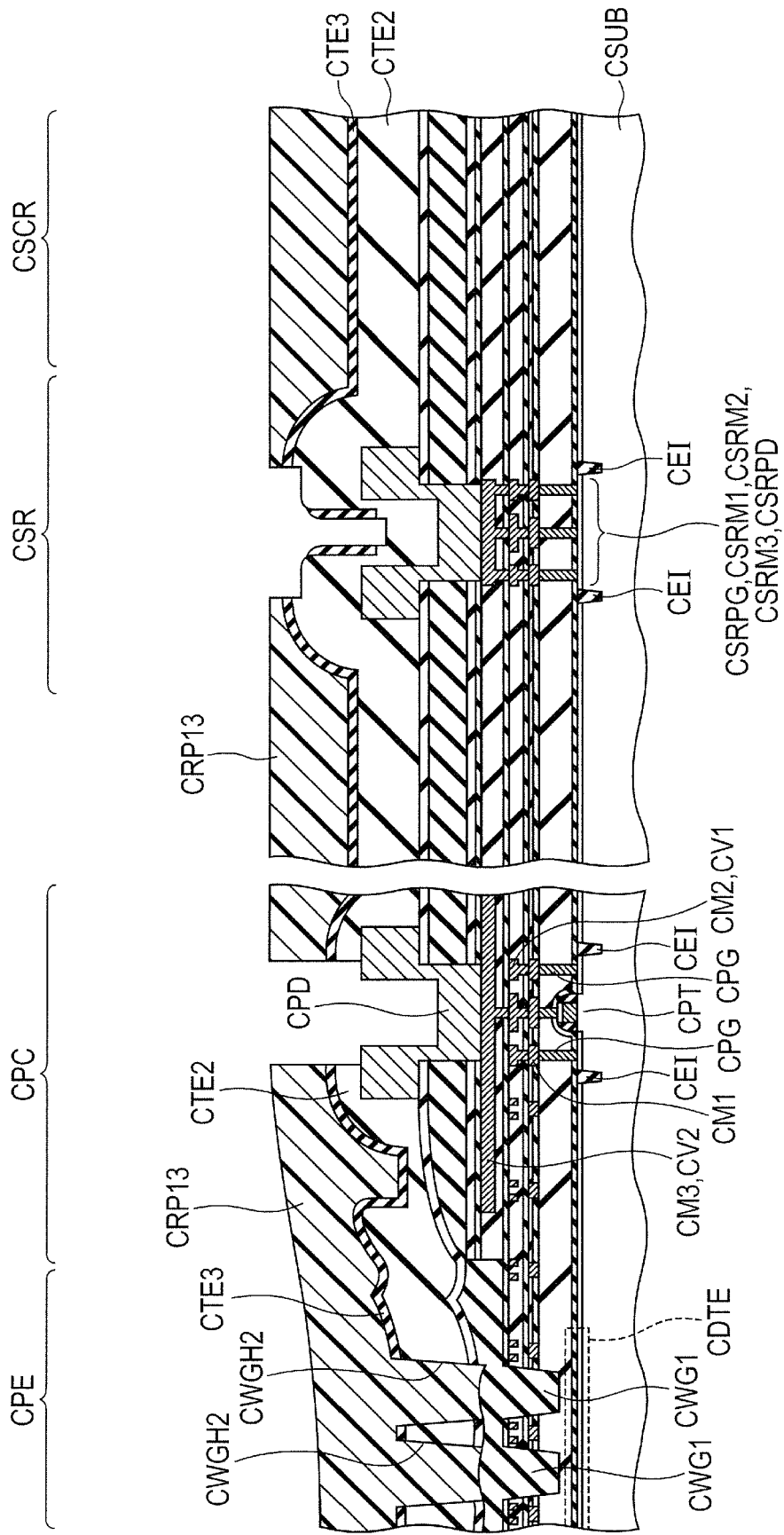
FIG. 36 is a partial cross-sectional view showing a step after the step shown in FIG. 35.
Figure 37:
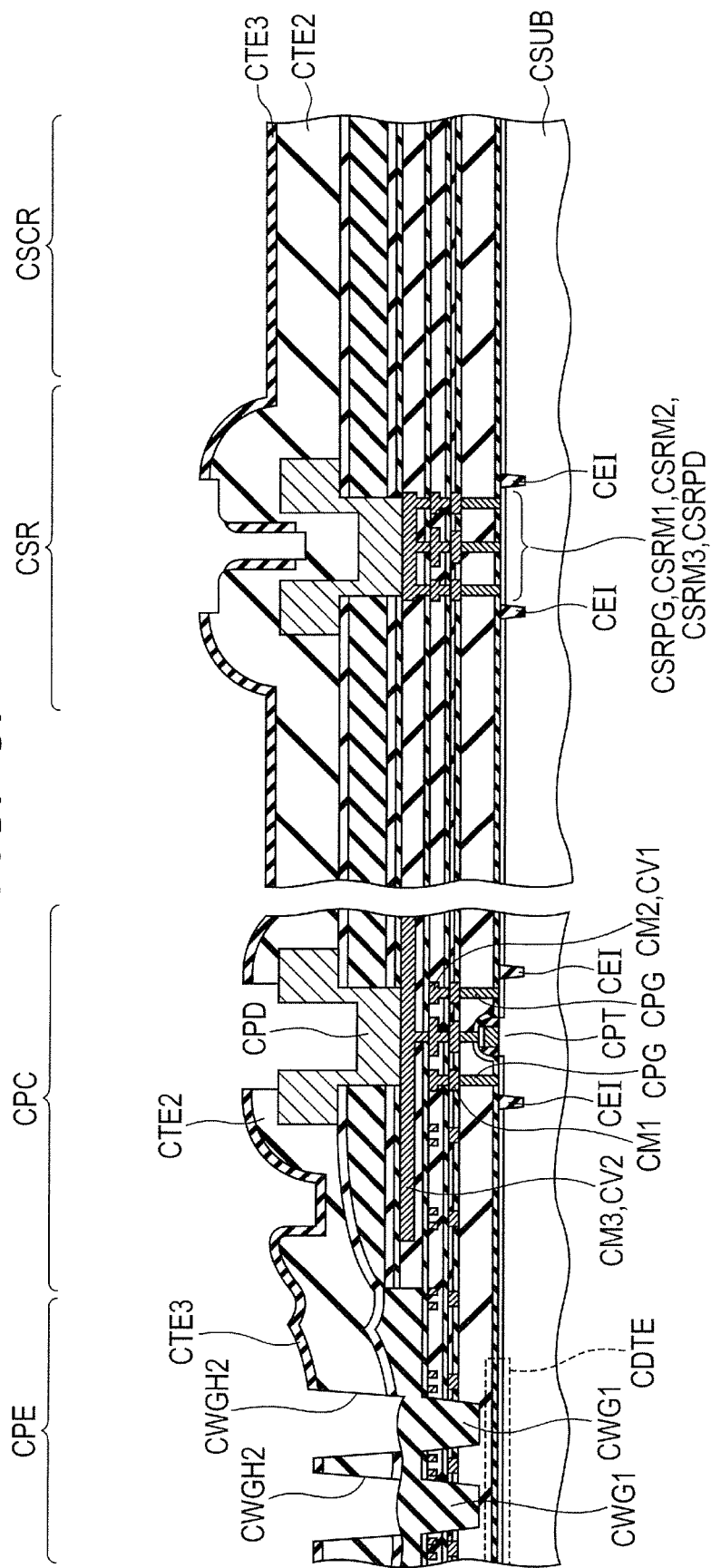
FIG. 37 is a partial cross-sectional view showing a step after the step shown in FIG. 36.

Next, as shown in FIG. 35, by a lithography process, a pattern of a photoresist CRP13 for exposing a portion of the TEOS film CTE3 covering the pad electrode PD and a portion of the TEOS film CTE3 covering the seal ring CSRPD is formed. Next, as shown in FIG. 36, using the photoresist CRD13 as an etching mask, by subjecting etching treatment to the exposed TEOS films CTE3 and CTE2, a surface of the pad electrode PD is exposed in the peripheral circuit region CPC. Subsequently, as shown in FIG. 37, the second waveguide holding hole CWGH2 etc. are exposed in the pixel region CPE by removing the photoresist CRP13.

Figure 38:
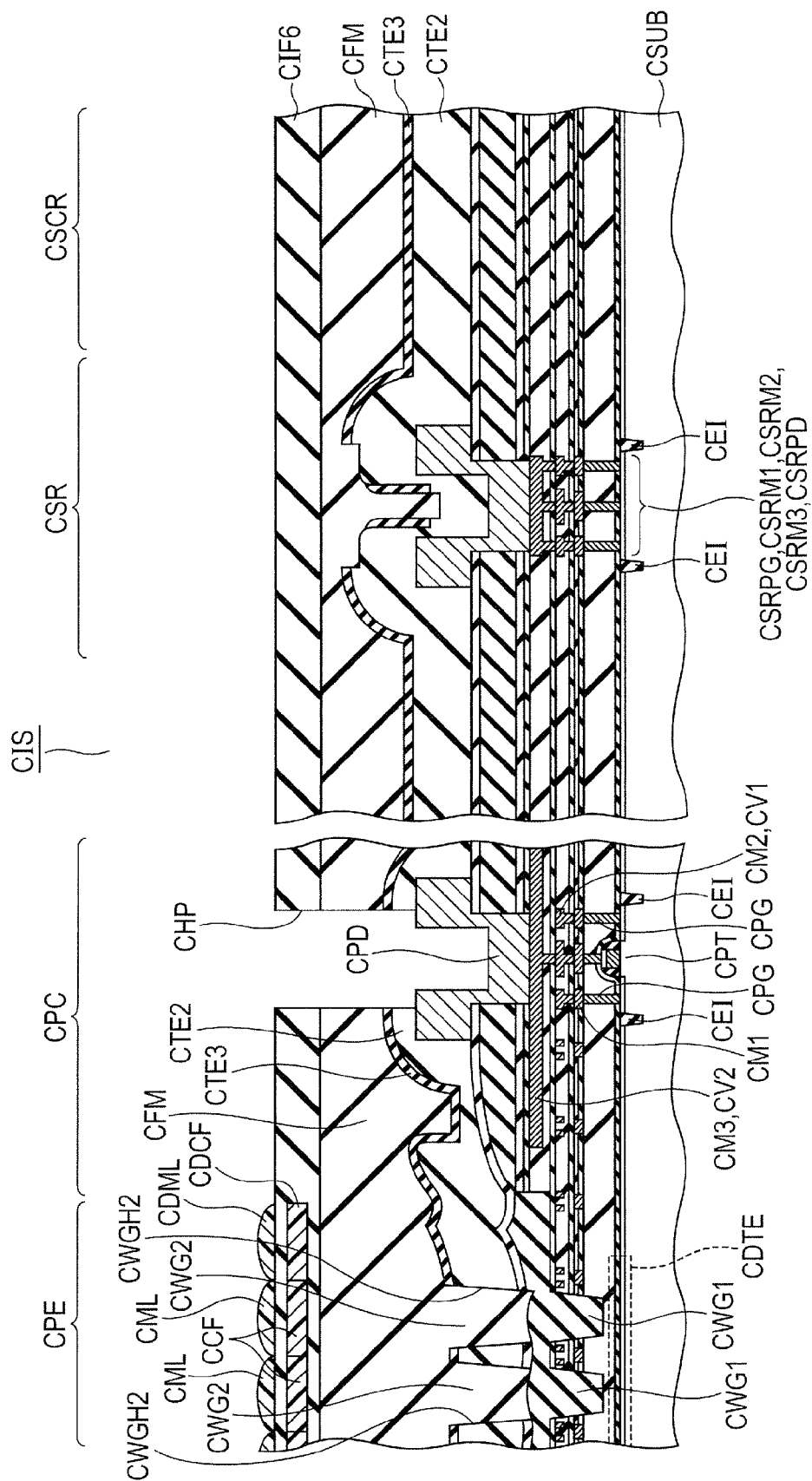
FIG. 38 is a partial cross-sectional view showing a step after the step shown in FIG. 37.

Next, as shown in FIG. 38, an insulating gap fill member CFM of a coating type is so formed as to fill the second waveguide holding hole CWGH2 and to cover the TEOS film TE3. By the gap fill member CFM filled in the second waveguide holding hole CWGH2, a second waveguide CWG2 which is in communication with the first waveguide CWG1 is formed.

Next, in the pixel region CPE, over the gap fill member CFM, a color filter CCF and a dummy color filter CDCF are formed. Also, an insulating film CIF6 is so formed as to cover the color filter CCF and the dummy color filter CDCF. Further, in the pixel region CPE, over a surface of the insulating film CIF6, a micro lens CML corresponding to the color filter CCF and a dummy micro lens CDML corresponding to the dummy color filter CDCF are formed. Also, in the peripheral circuit region CPC, a hole CHP for exposing a surface of the pad electrode CPD is formed. Subsequently, by dicing the scribe region CSCR, principal parts of the imaging device CIS according to the comparative example are completed.

In the imaging device CIS of the comparative example, before forming the second waveguide holding hole, in a step shown in FIG. 32, etching treatment is subjected to the TEOS film CTE2 covering the pad electrode CPD to reduce a level difference of the peripheral circuit region CPC with respect to the pixel region CPE. At this time, etching treatment is subjected to the seal ring region CSR being covered with the photoresist CRP11. Therefore, the level difference of the seal ring region CSR with respect to the pixel region CPE and the seal ring region CSR is not reduced.

Figure 39:
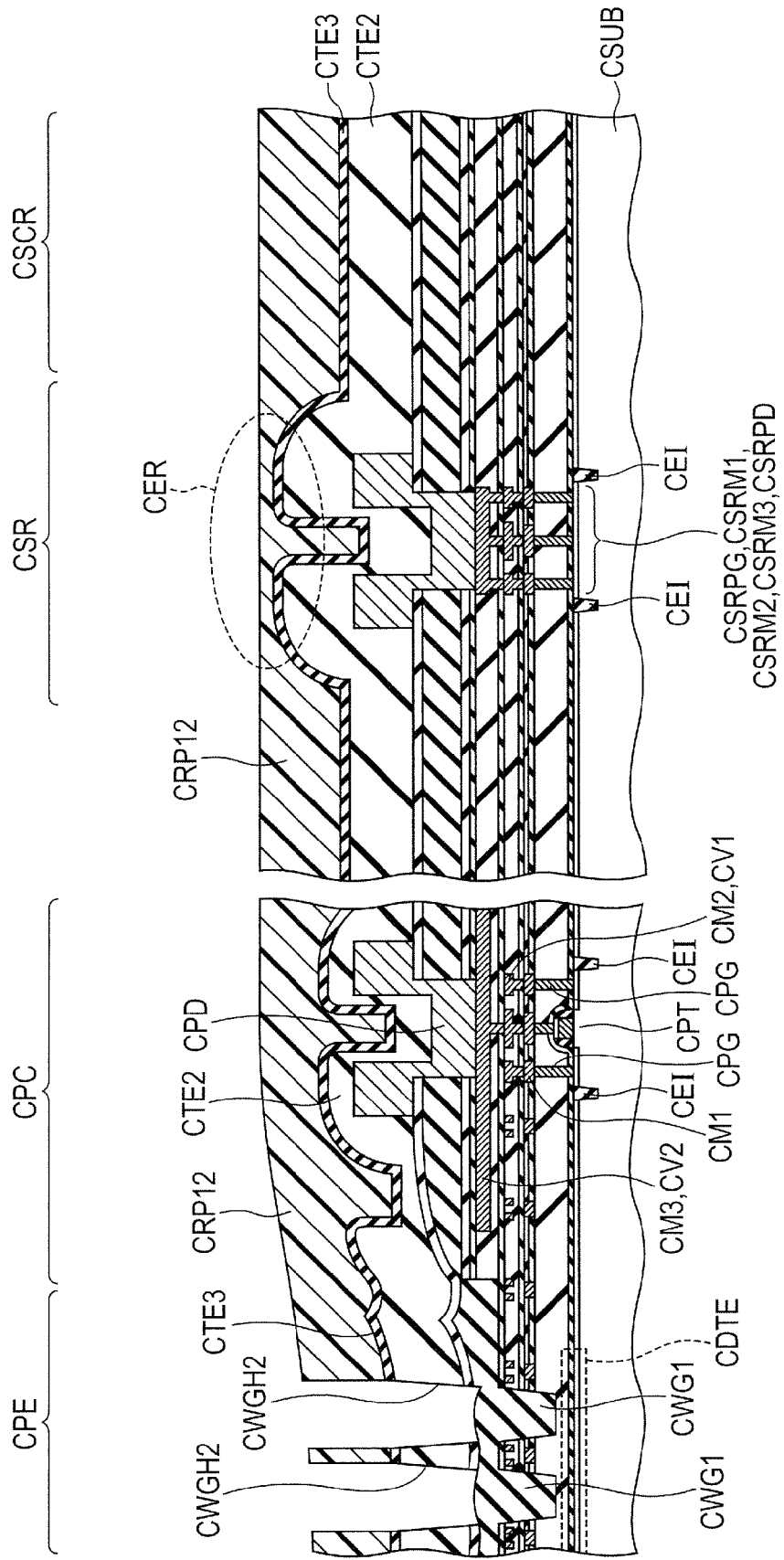
FIG. 39 is a partial cross-sectional view explaining a problem of the imaging device according to the comparative example.

As a result, in a state where a photoresist CRP12 for forming the second waveguide holding hole CWGH2 is formed, as shown by a dotted-line frame CER of FIG. 39, a portion of the photoresist CRP12 covering a TEOS film TE3 located right above the seal ring CSRPD becomes thinner than other portions. When performing etching treatment using the photoresist CRP12 as an etching mask, due to etching of the TEOS film CTE3 etc., a surface of the photoresist CRP12 is also etched.

In such a case, in the seal ring region CSR where the photoresist CRP12 is relatively thin, the region CSR where the photoresist CRP12 is relatively thin, the photoresist CRP12 is removed and the surface of the TEOS film CTE3 is exposed. Thus, there was a problem of the exposed surface of the TEOS film CTE3 being given etching treatment and getting rough. The surface of the TEOS film CTE getting rough generates a particle of the TEOS film (CTE3) itself, which became one of the factors of lowering the yield of the imaging device.

Moreover, because the surface of the TEOS film CTE3 gets rough, the following problem can be anticipated. When removing the photoresist CRP122, because the surface of the TEOS film CT3 is rough, it is anticipated that a reaction product generated by the etching treatment cannot be sufficiently removed, causing contamination.

Furthermore, if the surface of the TEOS film CTE3 gets rough, when forming a pattern (see FIG. 36) of a photoresist CRP13 exposing the pad electrode CPD, it is anticipated that the photoresist cannot be applied uniformly, being unable to form a desired pattern of the photoresist CRP13.

Moreover, when using such a photoresist CRP13 as an etching mask and subjecting etching treatment to the TEOS film CTE3 etc., in the seal ring region CSR, whose surface is rough, it is anticipated that the film thickness of the remaining TEOS films CTE3 and CTE2 also becomes uneven and, at some locations, the seal ring CSRPD is exposed to be etched. It is also anticipated that the seal ring CSRPD comprised of an aluminum film etc. being etched may affect a moisture resistance thereof and degrade the reliability of the imaging device.

Further, it is anticipated that, because the surface of the TEOS film CTE3 is rough, sufficient flatness of the gap fill member CFM cannot be secured, which may affect the formation of the color filter and the micro lens. The problem of surface roughness of the TEOS film CTE2 described above and problems to be anticipated according to the surface roughness are disclosed, in the imaging device CIS, for the first time by the present inventors.

Unlike the imaging device according to the comparative example, in the imaging device according to First Embodiment, when reducing the level difference of the peripheral circuit region PC with respect to the pixel region PE, the level difference of the seal ring region SR is also reduced. As shown in FIG. 24, using, as an etching mask, the photoresist RP11 exposing a portion of the TEOS film TE2 covering the pad electrode PD of the peripheral circuit region PC and exposing a portion of the TEOS film TE2 covering the seal ring SRPD of the seal ring region SR, dry etching treatment is subjected to the exposed portions of the TEOS film TE2.

Figure 40:
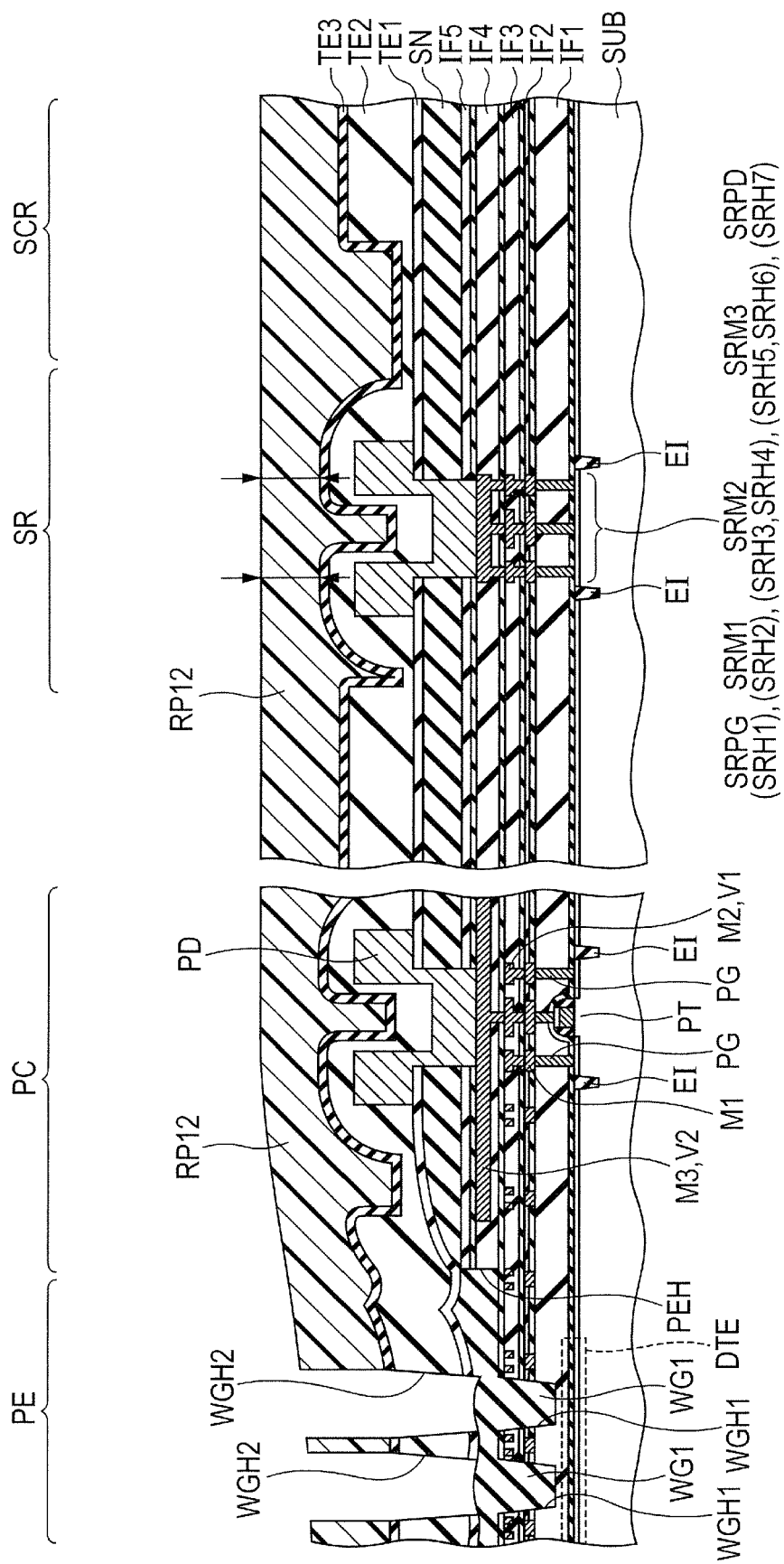
FIG. 40 is a first partial cross-sectional view explaining the operational advantage according to the embodiment.

As a result, the level difference of the seal ring region SR with respect to the pixel region PE becomes about the same as the level difference of the peripheral circuit region PC with respect to the pixel region PE. When the level difference of the seal ring region SR and the level difference of the peripheral circuit region PC become about the same, as shown in FIG. 40, in the photoresist RP12 for forming a second waveguide holding hole, a portion located in the seal ring region SR (see an arrow) comes to have a sufficient thickness which is about the same as that of a portion located in the peripheral circuit region PC.

Therefore, when performing etching treatment using the photoresist RP12 as an etching mask, even if a surface of the photoresist RP12 is etched due to etching of a TEOS film TE3 etc., it is possible to prevent the TEOS film. TE3 covering the seal ring SRPD from being exposed and a surface of the TEOS film TE3 from getting rough.

As a result, it is possible to prevent generation of a particle of the TEOS film itself, contributing to improvement in yield. Moreover, since the surface of the TEOS film TE3 is prevented from getting rough, various problems which might be caused by the surface roughness described above can be gotten rid of (avoided).

Figure 41:
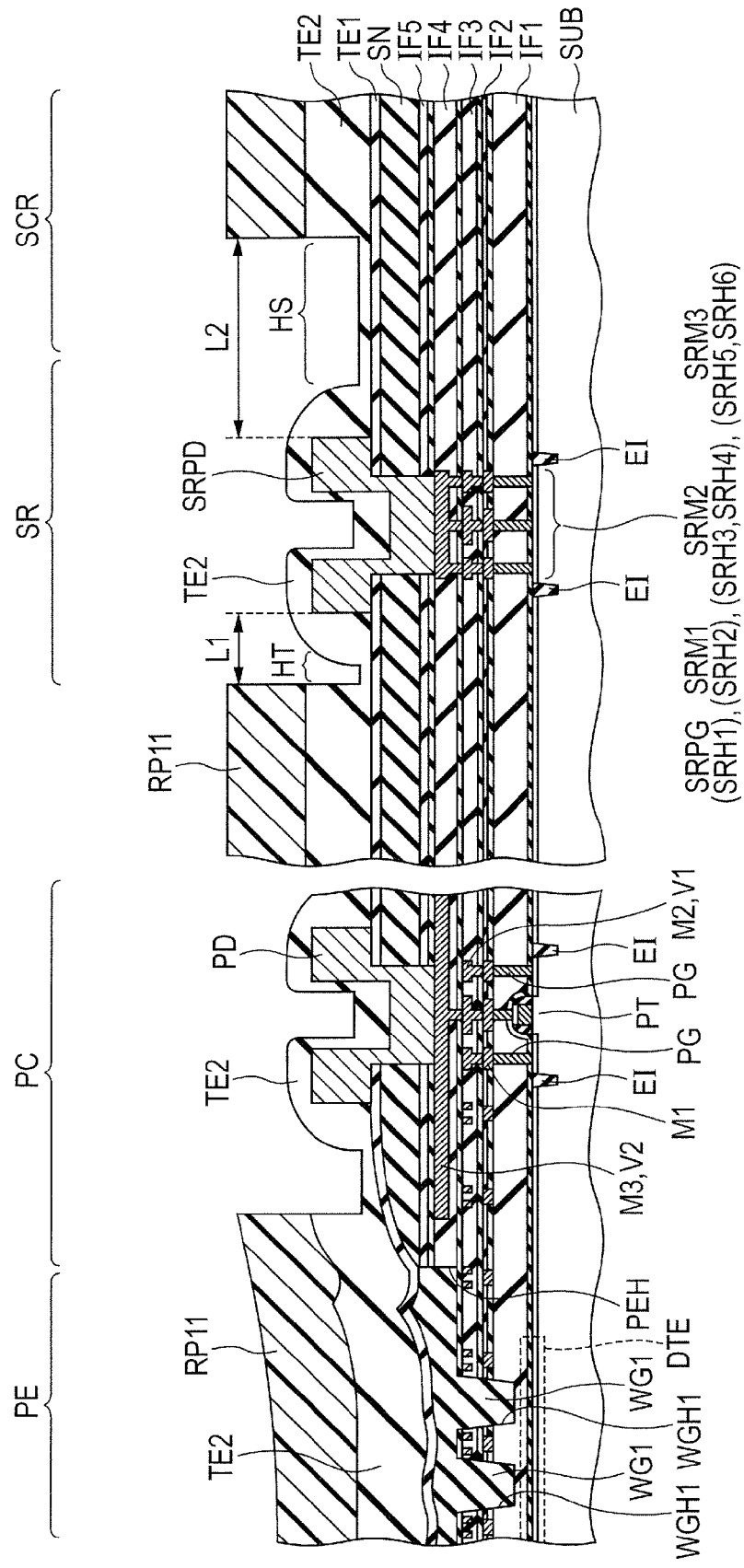
FIG. 41 is a second partial cross-sectional view explaining the operational advantage according to the embodiment.

In a pattern of the photoresist RP11 formed for preventing the surface roughness of the TEOS film TE2, as shown in FIG. 41, from an edge of the seal ring SRPD on the side of the peripheral circuit PC to the side of the peripheral circuit region PC, a portion of the TEOS film TE2 located in a region (region A) of a length L1 (about 1 μm) is exposed. On the other hand, from an edge of the seal ring SRPD on the side of the scribe region SCR to the side of the scribe region SCR, a portion of the TEOS film TE2 located in a region (region B) of a length L2 (about 3 μm) is exposed.

As a result, after the dry etching treatment using the photoresist RP11 as the etching mask, in a region, corresponding to the region A, on the outward side of the seal ring SRPD, a concave portion HS is formed along the seal ring SRPD. On the other hand, in a region, corresponding to the region B, on the inward side of the seal ring SRPD, a concave portion HT is formed along the seal ring SRPD. In addition, the concave portions HS and HT are formed such that a width of the concave portion HS is greater than a width of the concave portion HT.

Figure 42:
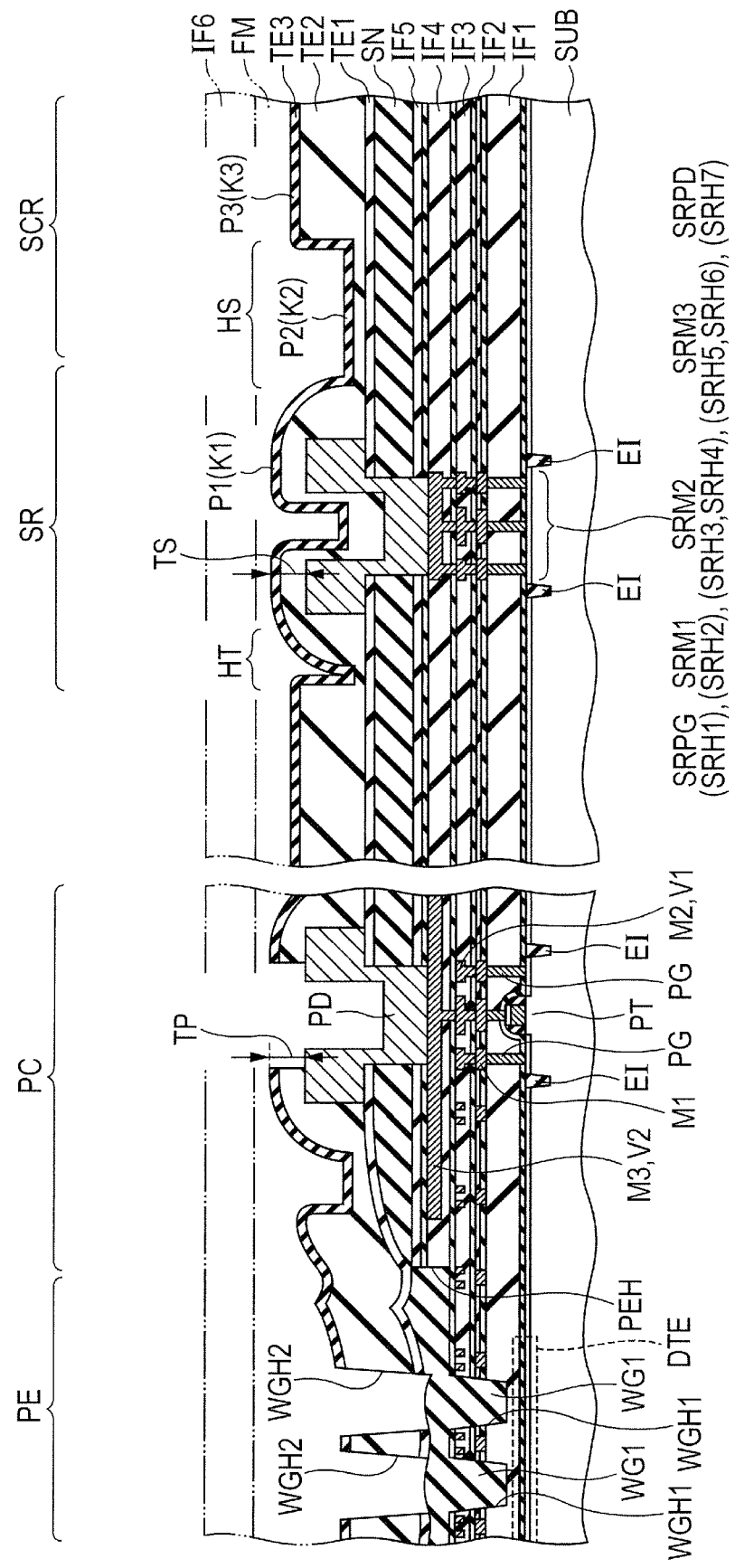
FIG. 42 is a third partial cross-sectional view explaining the operational advantage according to the embodiment.

After such concave portions HS and HT having been formed, in a state where a relatively thin TEOS film TE3 (having a thickness of about 100 nm) is formed before formation of the gap fill member FM, a relationship of predetermined heights over a surface of the TEOS film TE3 is as follows. As shown in FIG. 42, a position of a surface of the TEOS film TE3 located right above the seal ring SRPD is referred to as a first position P1. A position of the surface of the TEOS film TE3 located in the concave portion HS is referred to as a second position P2. A position of the surface of the TEOS film TE3 located in a direction departing from the concave portion HS for the outside of the seal ring region SR is referred to as a third position P3. Then, the second position P2 is lower than the first position P1 in height. Further, the third position P3 is lower than the first position P1 but higher than the second position P2. The relationship of heights described above is the same as the case of the TEOS film TE2 to which dry etching treatment is subjected.

Accordingly, at an interface between the TEOS film TE3 and the gap fill member FM in the imaging device IS which is completed when the gap fill member FM etc. are so formed as to cover the TEOS film TE3, an interface K2 corresponding to the second position P2 is lower in height than an interface K1 corresponding to the first position P1. Also, an interface K3 corresponding to the third position P3 is lower than the interface K1 but higher than the interface K2. Further, since scribe region SCR in FIG. 2 or FIG. 42 shows a portion of the scribe region SCR being left after the dicing, the third position P3 (interface K3) is a position corresponding to the vicinity of an edge of the imaging device IS as a chip.

Also, in the imaging device described above, in order to reduce both the level differences of the peripheral circuit region PC and the level difference of the seal ring region SR with respect to the pixel region PE, as shown in FIG. 24, dry etching treatment is subjected to a portion of the TEOS film TE2 covering the pad electrode PD and a portion of the TEOS film TE2 covering the seal ring SRPD at the same time. As a result, a thickness of a portion, of the TEOS film TE2, remaining over the upper surface of the pad electrode PD becomes substantially the same as a thickness of a portion, of the TEOS film TE2, remaining over the upper surface of the seal ring SRPD.

Consequently, as shown in FIG. 42, after the TEOS film TE3 has been formed, a thickness TP of a portion of the TEOS films TE2 and TE3 (insulating film) located over the upper surface of the pad electrode PD becomes substantially the same as a thickness TS of a portion of the TEOS films TE2 and TE3 (insulating film) located over the upper surface of the seal ring SRPD. In this regard, the "same thickness", however, is not intended to mean completely the same thickness, and is intended to include variations in production processes such as variations in film forming in the surface of the semiconductor substrate and variations in dry etching, etc. (Modification) In the imaging device IS described above, there has been explained the case where the second waveguide WG2 is formed in the second waveguide holding hole WGH2, and the color filter CF and the micro lens ML are formed over the second waveguide WG2. As an imaging device according to one modification, now, a case where a color filter is formed in the second waveguide holding hole will be explained.

Figure 43:
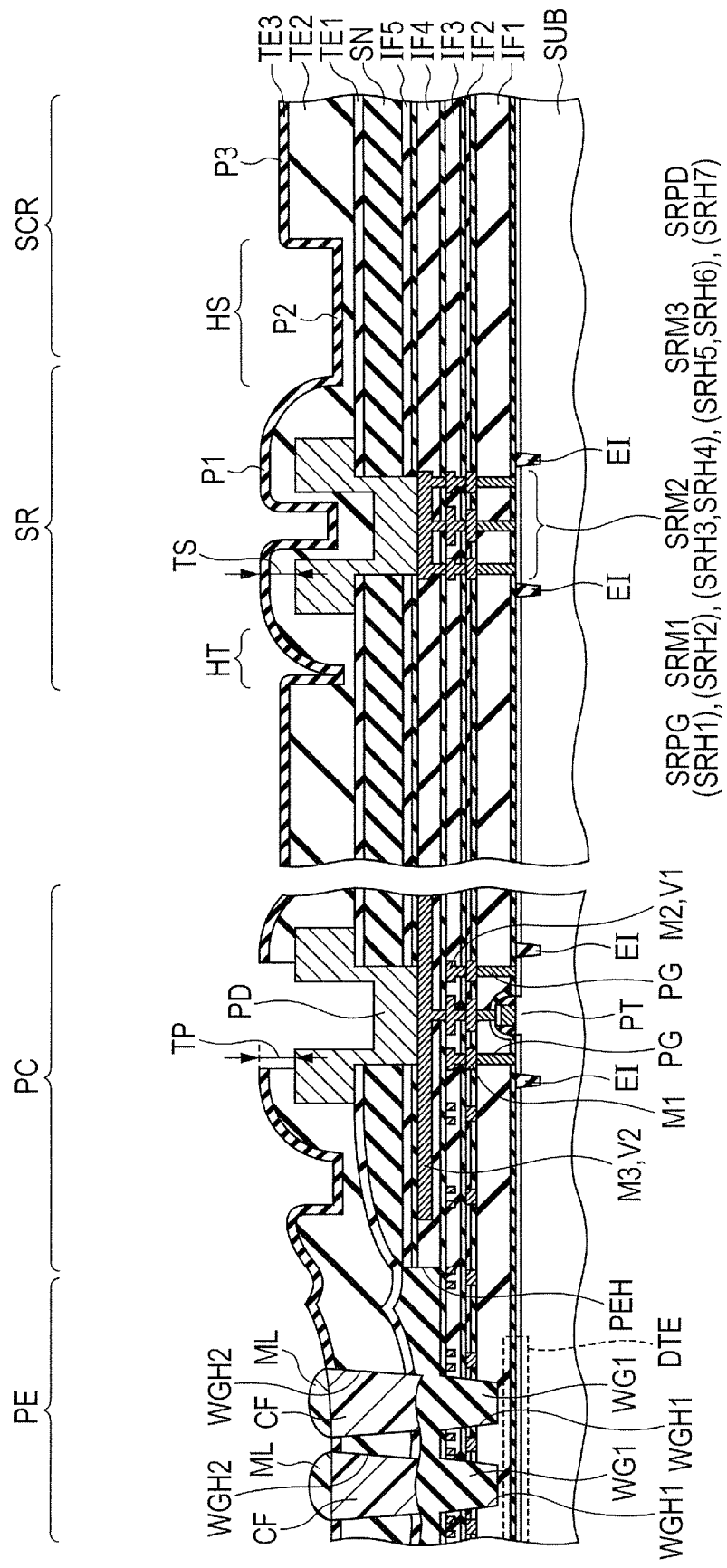
FIG. 43 is a partial cross-sectional view of an imaging device of a modification with respect to the embodiment.

After the second waveguide holding hole WGH2 has been formed through steps similar to the steps shown in FIGS. 4 to 29, as shown in FIG. 43, by a lithography process, a color filter CF of a predetermined color is formed in each of a plurality of second waveguide holding hole WGH2. Next, a micro lens ML is formed over each of a plurality of color filters CF. Subsequently, by dicing the scribe region SCR, principal parts of the imaging device IS according to the modification are completed.

Until the second waveguide holding hole WGH2 is formed, in the imaging device IS of the modification, parts thereof are formed through the same steps as those of the imaging device IS described above. For this reason, as in the imaging device IS described above, it is possible to prevent the surface of the TEOS film TE3 from getting rough. Also, various problems which might be caused because of the surface roughness can be gotten rid of (avoided).

Further, in the imaging device IS of the modification, the relationship of height of the surfaces (upper surfaces) of the TEOS film TE3 located in the seal ring region SR and the scribe region SCR is the same as that of imaging device IS described above. That is the second position P2 is lower than the first position P1 in height, and the third position P3 is lower than the first position P1 but higher than the second position P2.

Moreover, the thickness TP of a portion of the TEOS films TE2 and TE3 (insulating film) located over the upper surface of the pad electrode PD and the thickness TS of a portion of the TEOS films TE2 and TE3 (insulating film) located over the upper surface of the seal ring SRPD become substantially the same.

Second Embodiment

In First Embodiment, the explanation was made as to the case where the level difference of the peripheral circuit region PC and the level difference of the seal ring region SR are reduced by the dry etching treatment. Now, an explanation will be made of a case where the level difference of the peripheral circuit region PC and the level difference of the seal ring region SR are reduced by wet etching treatment.

Figure 44:
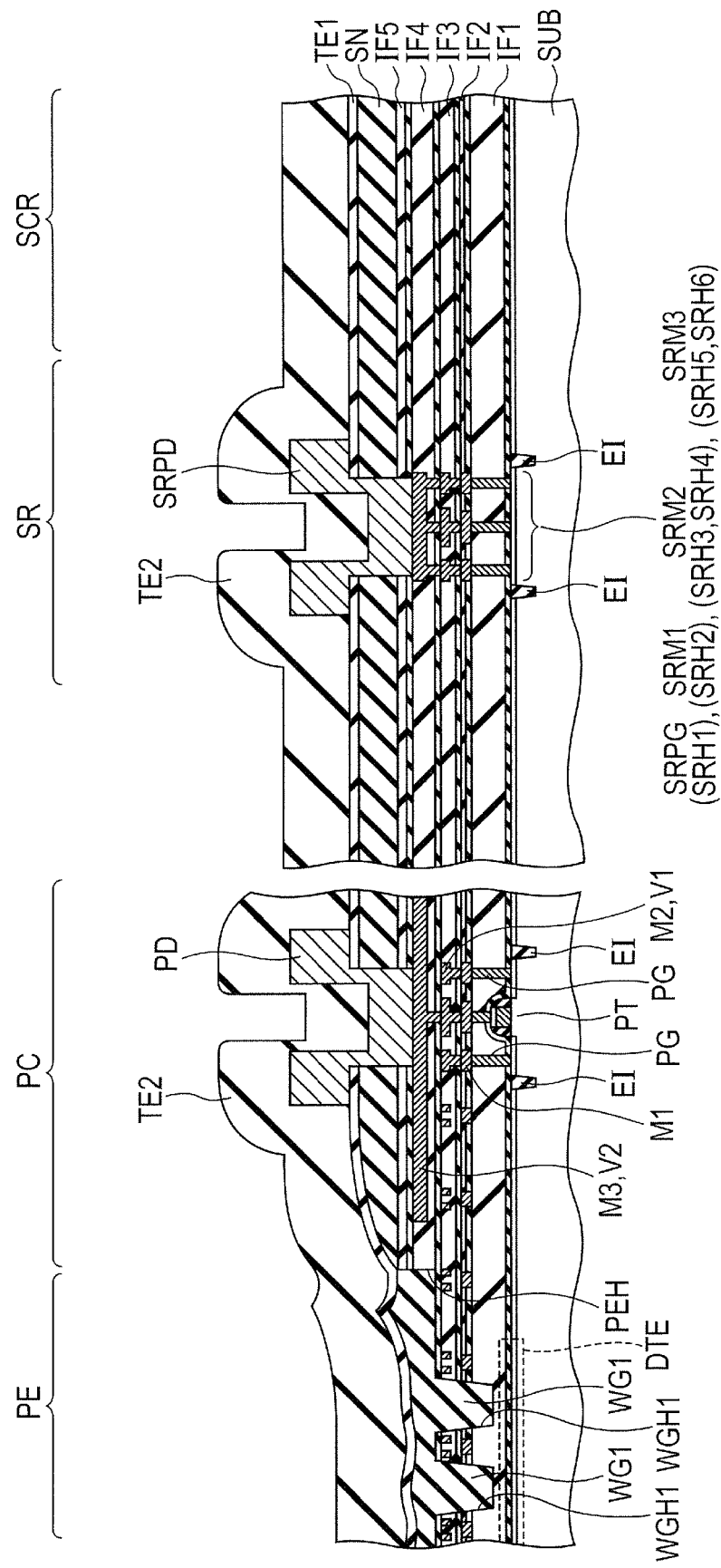
FIG. 44 is a partial cross-sectional view showing one step of a manufacturing method of an imaging device according to Second Embodiment.
Figure 45:
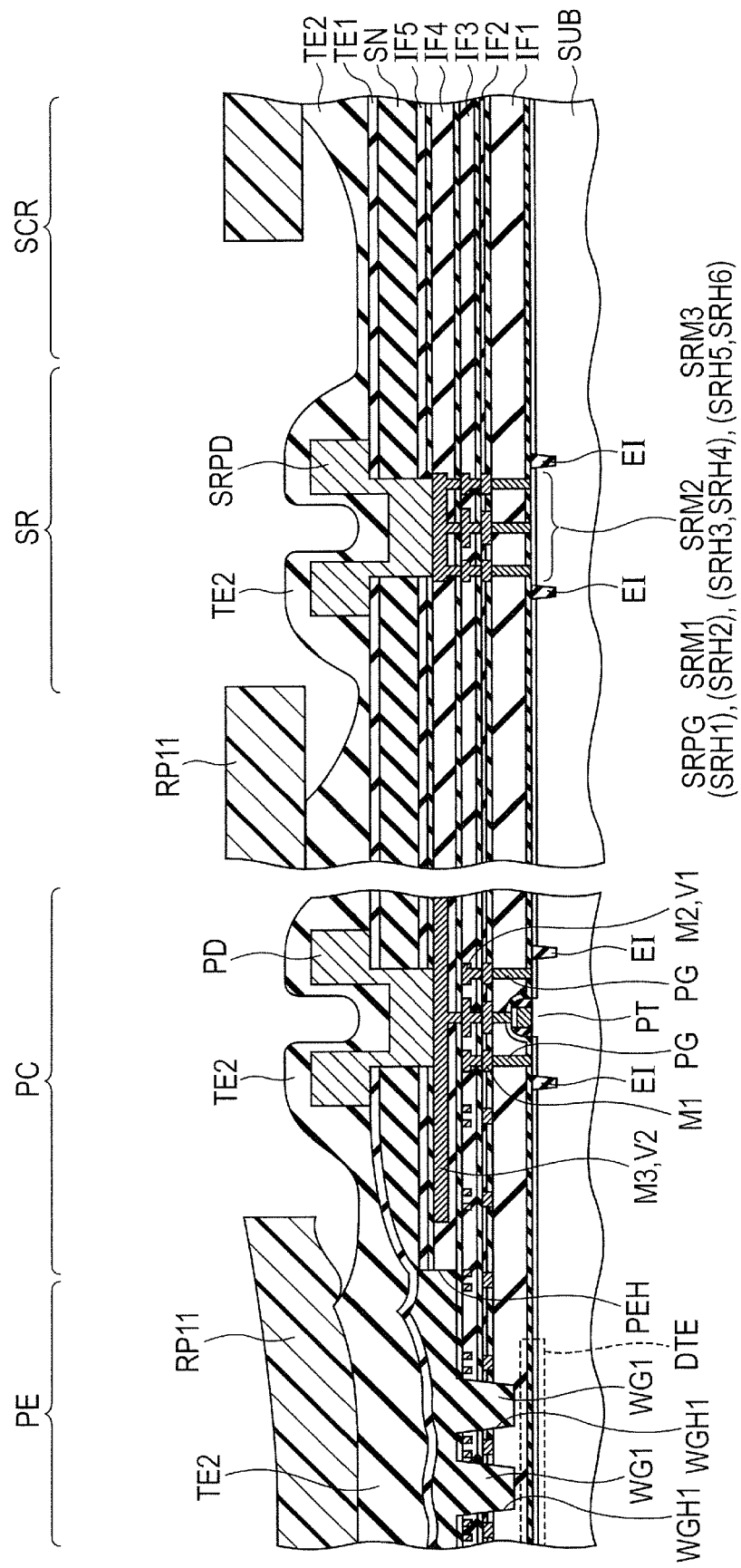
FIG. 45 is a partial cross-sectional view showing a step after the step shown in FIG. 44 according to the embodiment.

Through steps similar to the preceding steps shown in FIGS. 4 to 23, as shown in FIG. 44, a TEOS film TE2 (having a thickness of about 750 nm) is so formed as to cover the pad electrode PD and the seal ring SRPD or the like. Next, as shown in FIG. 45, by a lithography process, there are exposed a portion of the TEOS film TE2 covering the pad electrode PD of the peripheral circuit region PC and a portion of the TEOS film TE2 covering the seal ring SRPD of the seal ring region SR, respectively, a pattern of the photoresist RP11 covering a portion of the TEOS film TE2 located in another region is formed.

Next, by performing wet etching treatment using the photoresist RP11 as an etching mask, an exposed portion of about 550 nm of the TEOS film TE2 is removed. In this regard, as a liquid medication for the wet etching treatment, for instance, buffered fluoric acid (BHF) and rare fluoric acid or the like are used. In the wet etching treatment, the TEOS film TE2 is etched using the liquid medication in an isotropic manner.

Moreover, since the liquid medication permeates the interface between the photoresist RP11 and the TEOS film TE2, etching of a portion of the TEOS film TE2 located along the interface further advances. As a result, the surface of the TEOS film TE2 after the wet etching treatment becomes more gently sloped than the surface of the TEOS film TE2 after the dry etching treatment. Subsequently, the photoresist RP11 is removed.

Figure 46:
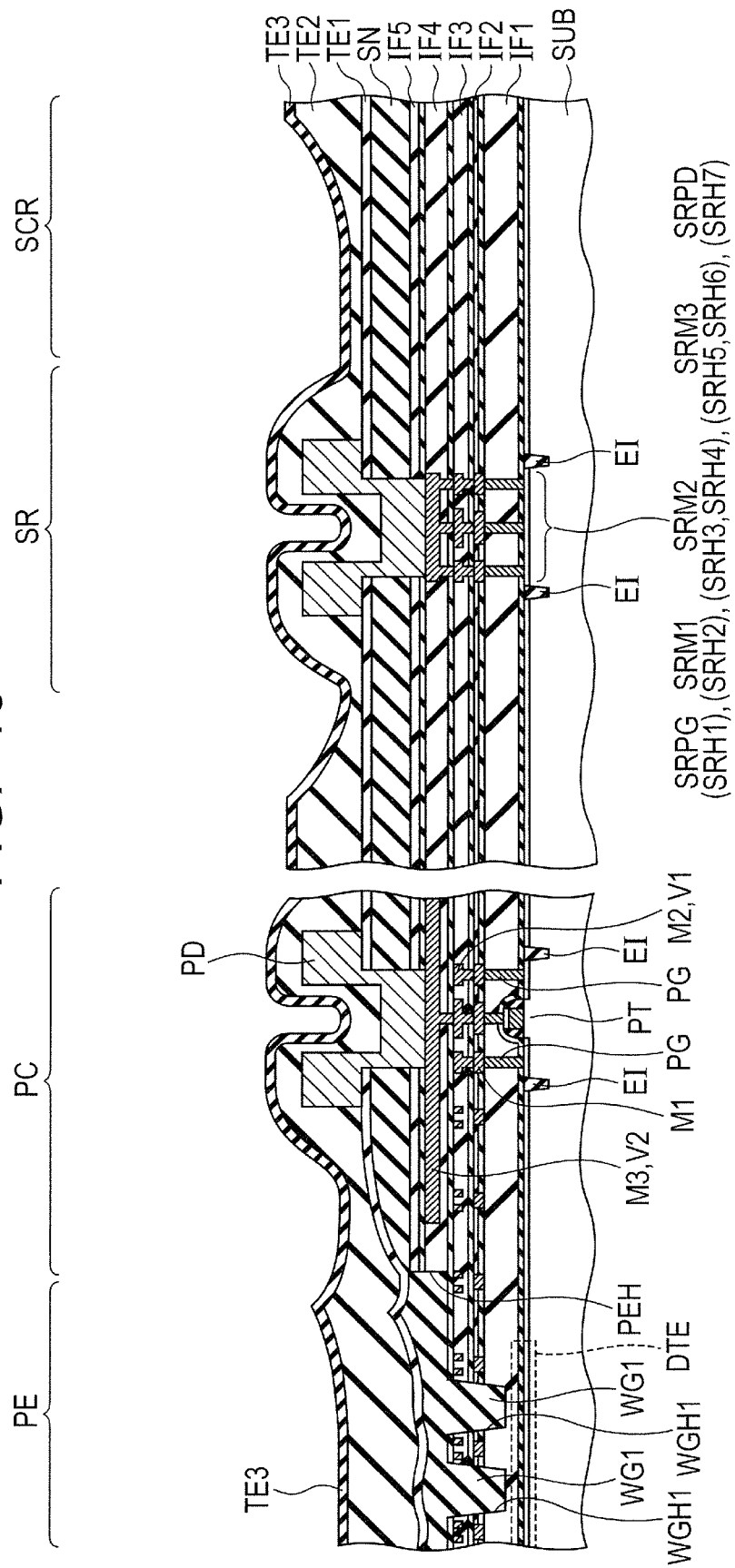
FIG. 46 is a partial cross-sectional view showing a step after the step shown in FIG. 45 according to the embodiment.
Figure 47:
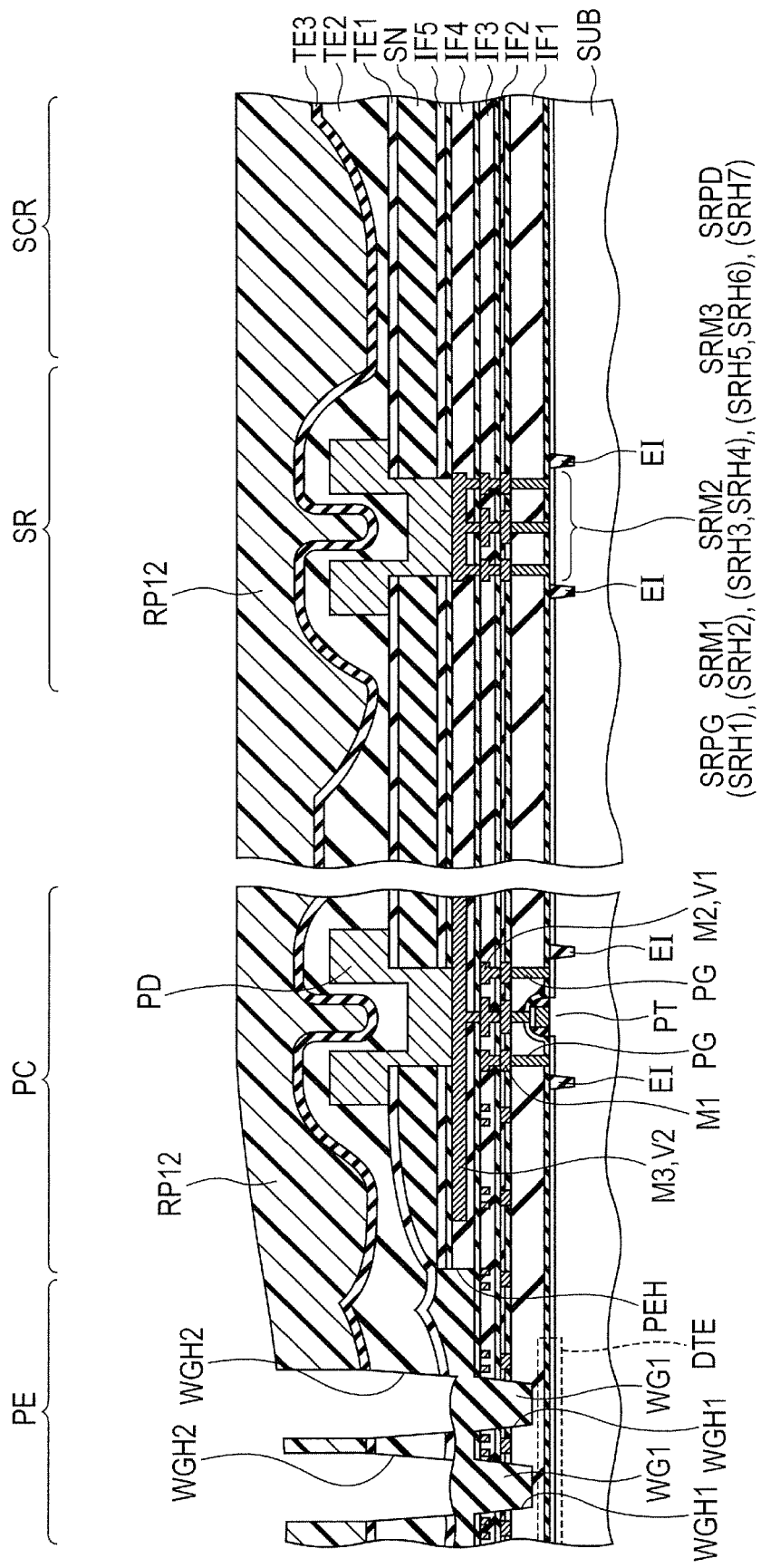
FIG. 47 is a partial cross-sectional view showing a step after the step shown in FIG. 46 according to the embodiment.

Next, as shown in FIG. 46, a TEOS film TE3 (having a thickness of about 100 nm) is further formed so as to cover the TEOS film TE2. Next, as shown in FIG. 47, by a lithography process, a pattern of a photoresist RP12 for forming a second waveguide holding hole is formed. Next, by performing etching treatment using the photoresist RP12 as an etching mask, a second waveguide holding hole WGH2 for exposing the first waveguide WG1 in the pixel region PE is formed. Subsequently, the photoresist RP12 is removed.

Figure 48:
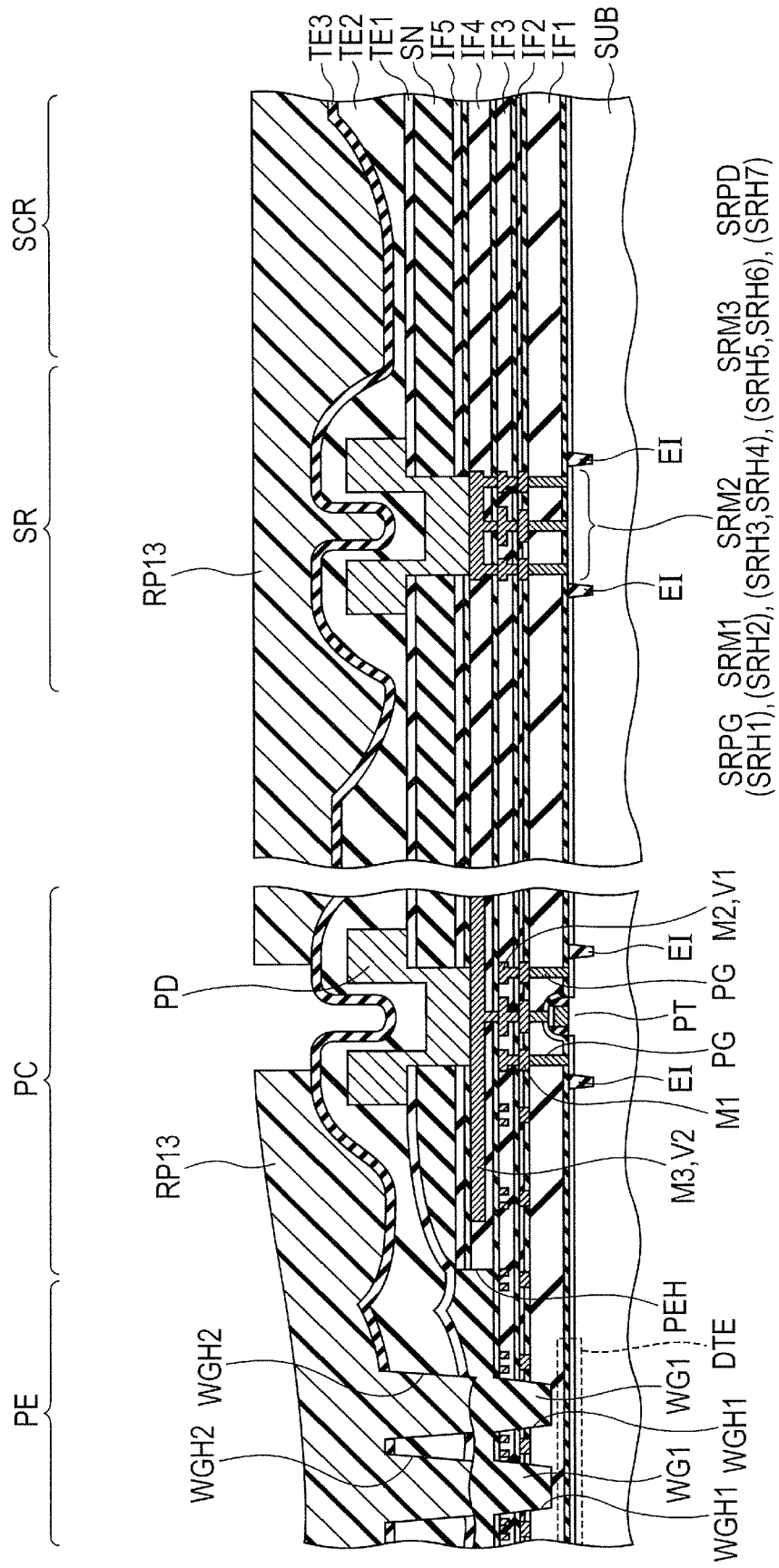
FIG. 48 is a partial cross-sectional view showing a step after the step shown in FIG. 47 according to the embodiment.
Figure 49:
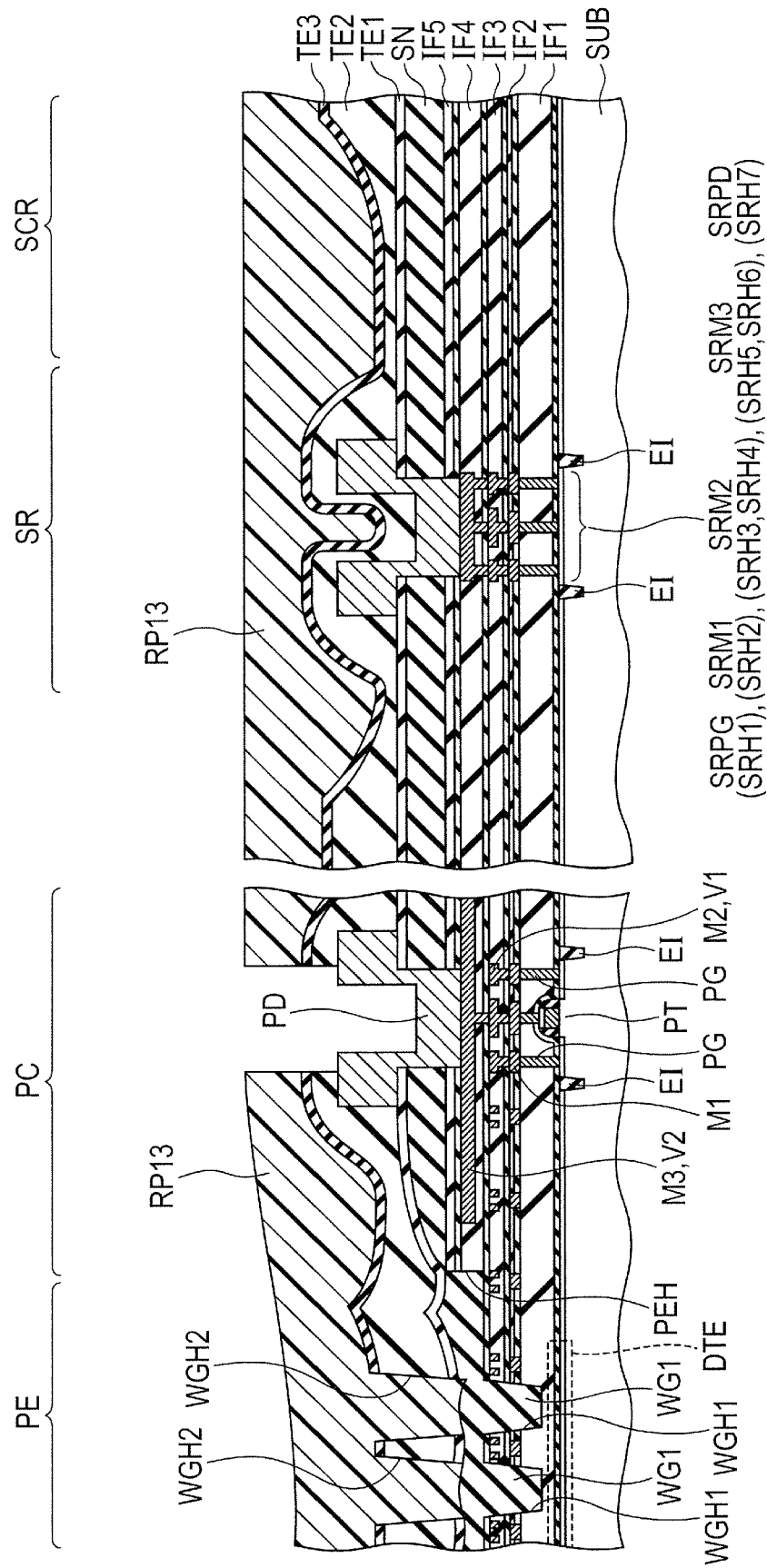
FIG. 49 is a partial cross-sectional view showing a step after the step shown in FIG. 48 according to the embodiment.
Figure 50:
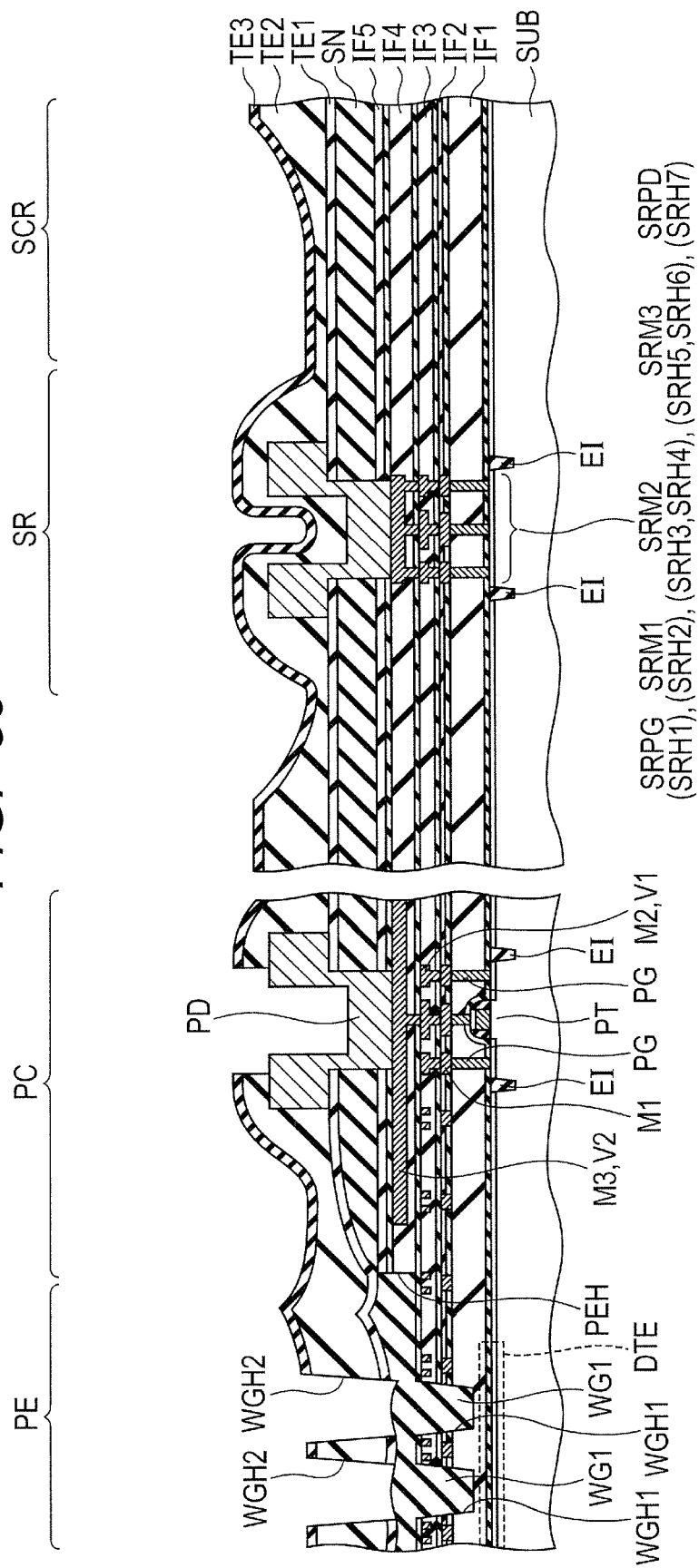
FIG. 50 is a partial cross-sectional view showing a step after the step shown in FIG. 49 according to the embodiment.

Next, as shown in FIG. 48, by a lithography process, a pattern of a photoresist RP13 for exposing the pad electrode PD is formed. Next, as shown in FIG. 49, using the photoresist RP13 as an etching mask, by subjecting etching treatment to the TEOS films TE3 and TE2, a surface of the pad electrode PD is exposed. Subsequently, as shown in FIG. 50, by removing the photoresist RP13, the second waveguide holding hole WGH2 etc. are exposed.

Figure 51:
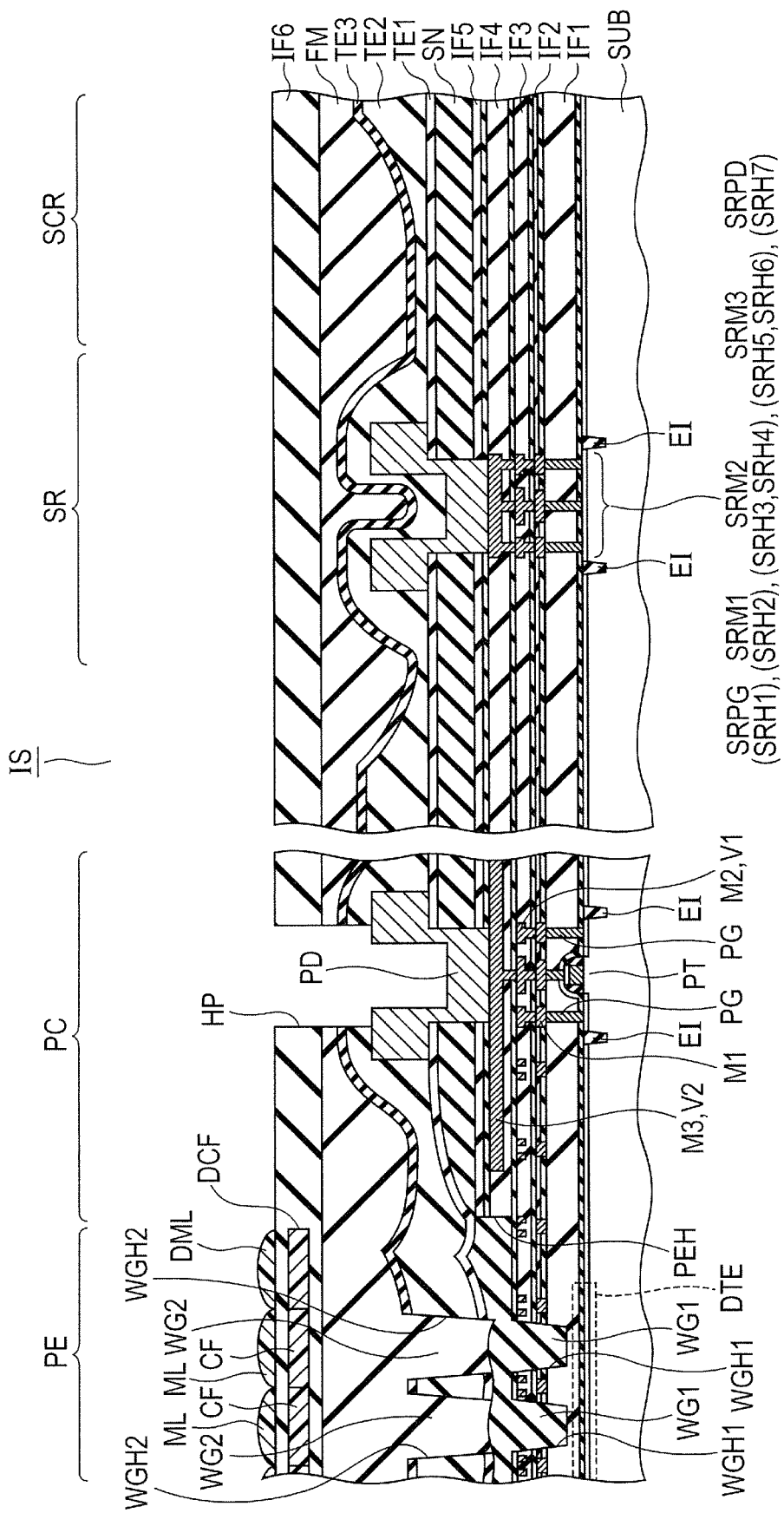
FIG. 51 is a partial cross-sectional view showing a step after the step shown in FIG. 50 according to the embodiment.

Next, as shown in FIG. 51, an insulating gap fill member FM of a coating type is so formed as to fill the second waveguide holding hole WGH2 and to cover the TEOS film TE3. A second waveguide WG2 to be in communication with the first waveguide WG1 is formed by the gap fill member FM embedded in the second waveguide holding hole WGH2.

Next, in the pixel region PE, by a lithography process, a color filter CF and a dummy color filter DCF are formed over the gap fill member FM. Next, a sixth insulating film IF6 is so formed as to cover the color filter CF and the dummy color filter DCF. Further, a micro lens ML corresponding to the color filter CF and a dummy micro lens DML corresponding to the dummy color filter DCF are formed over a surface of the sixth insulating film IF6 in the pixel region PE. Moreover, in the peripheral circuit region PC, a hole HP for exposing the surface of the pad electrode PE is formed. Subsequently, by dicing the scribe region SCR, principal parts of the imaging device IS are completed.

In the imaging device of the embodiment described above, when reducing the level difference of the peripheral circuit region PC with respect to the pixel region PE, as shown in FIG. 45, wet etching treatment is performed using, as an etching mask, the photoresist RP11 exposing a portion of the TEOS film TE2 covering the pad electrode PE of the peripheral circuit region PC and exposing a portion of the TEOS film TE2 covering the seal ring SRPD of the seal ring region SR.

Figure 52:
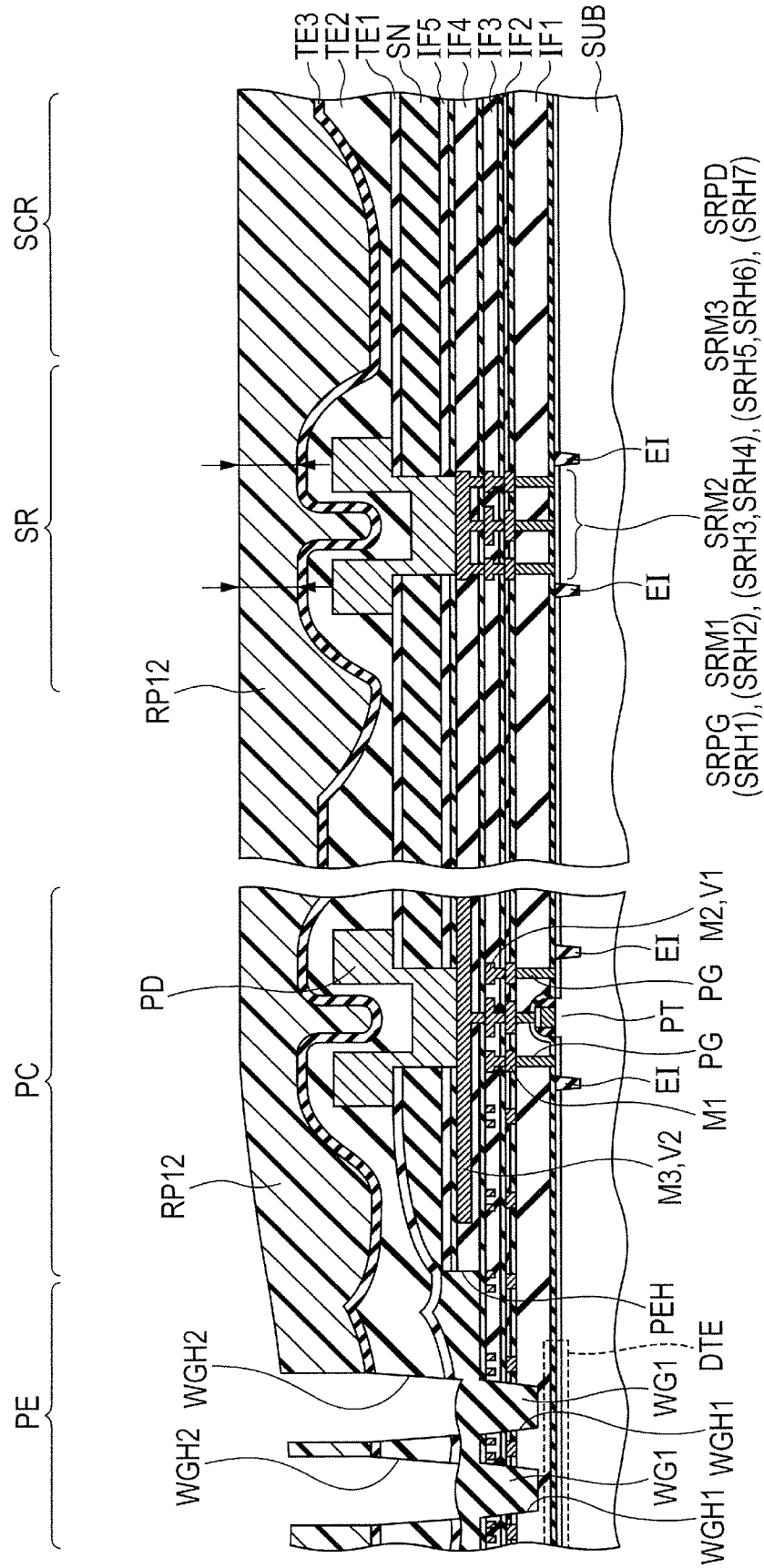
FIG. 52 is a first partial cross-sectional view explaining the operational advantage according to the embodiment.

In this way, the level difference of the seal ring region SR with respect to the pixel region PE becomes about the same as the level difference of the peripheral circuit region PC with respect to the pixel region PE. When the level difference of the seal ring region SR and the level difference of the peripheral circuit region PC become about the same, as shown in FIG. 52, in the photoresist RP12 for forming the second waveguide holding hole, a portion located in the seal ring region SR comes to have a sufficient thickness which is about the same as that of a portion located in the peripheral circuit region PC.

Therefore, when performing etching treatment using the photoresist RP12 as an etching mask, even if the surface of the photoresist RP12 is etched due to etching of the TEOS film TE3 etc., it is possible to prevent the TEOS film TE3 covering the seal ring SRPD from being exposed and a surface of the TEOS film TE3 from getting rough.

As a result, as explained in First Embodiment, it is possible to prevent the occurrence of the particle of the TEOS film itself and to contribute to improvement in yield of the imaging device IS. Moreover, since the surface of the TEOS film TE3 is prevented from getting rough, various problems which might be caused by the surface getting rough can be gotten rid of (avoided).

Also, in the manufacturing method of the imaging device described above, wet etching treatment is subjected to an exposed portion of the TEOS film TE2 using the photoresist RP11 as an etching mask. For this reason, the etching advances in an isotropic manner and, moreover, etching of a portion of the TEOS film TE2 located along an interface between the photoresist RP11 and the TEOS film TE2 further advances. As a result, the steep level difference of the surface of the TEOS film TE2 in the case after the dry etching treatment is reduced after the wet etching treatment to be more gently sloped. As a result, the flatness of the gap fill member CFM etc. can be improved further, becoming capable of favorably forming the color filter CF and the micro lens ML.

Figure 53:
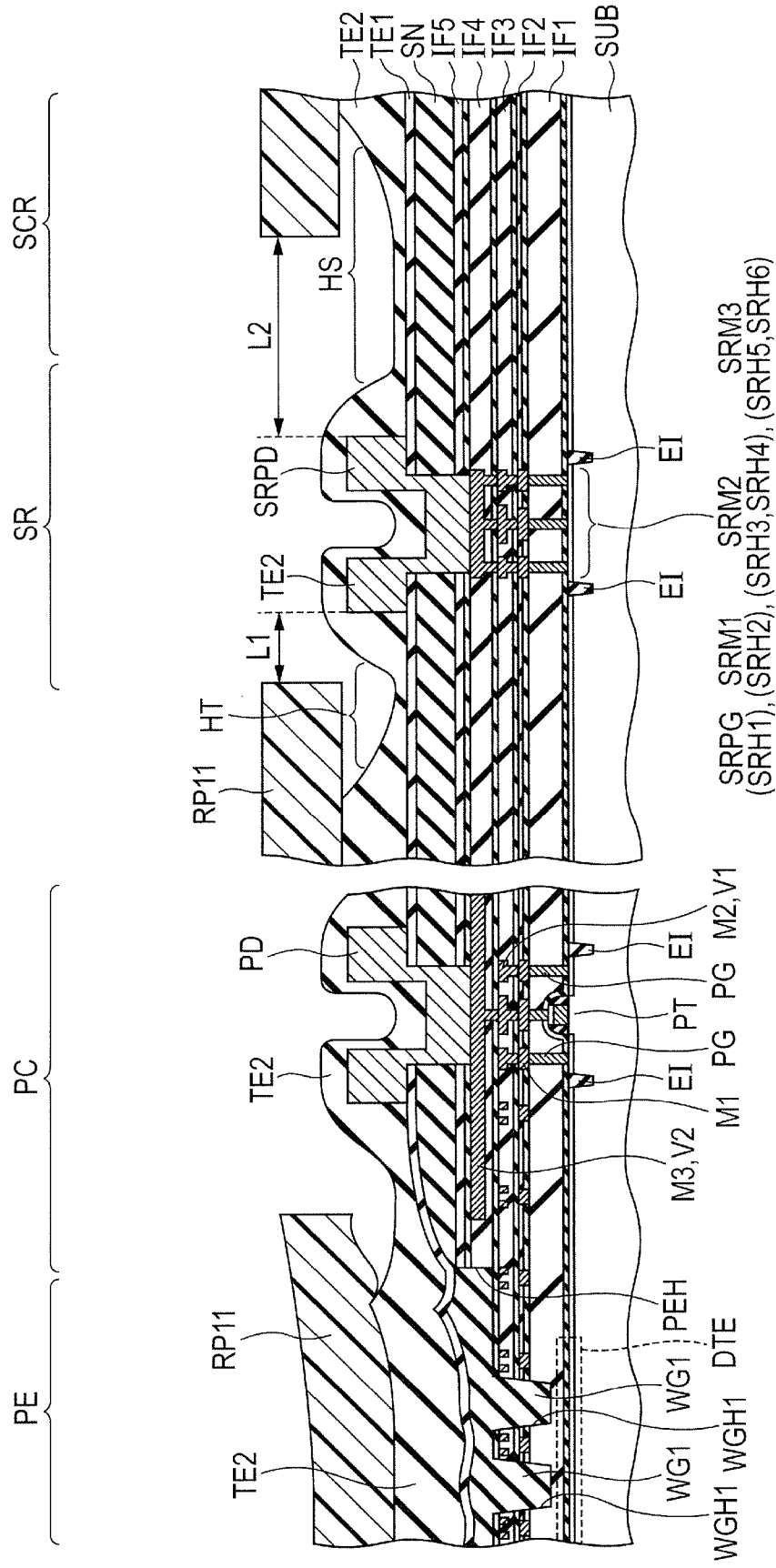
FIG. 53 is a second partial cross-sectional view explaining the operational advantage according to the embodiment.

Also, as described in First Embodiment, in the pattern of the photoresist RP11, as shown in FIG. 53, from an edge of the seal ring SRPD on the side of the peripheral circuit region PC to the side of the peripheral circuit region PC, a portion of the TEOS film TE2 located in the region (region A) of a length L1 (about 1 µm) is exposed. On the other hand, from an edge of the seal ring SRPD on the side of the scribe region SCR to the side of the scribe region SCR, a portion of the TEOS film TE2 located in the region (region B) of a length L2 (about 3 µm) is exposed.

As a result, after the wet etching treatment using the photoresist RP11 as the etching mask, in a region, corresponding to the region A, on the outward side of the seal ring SRPD, a concave portion HS is formed along the seal ring SRPD. On the other hand, in a region, corresponding to the region B, on the inward side of the seal ring SRPD, a concave portion HT is formed along the seal ring SRPD. In addition, due to isotropic etching using the liquid medication and etching from the interface between the photoresist RP11 and the TEOS film TE2, the width of each of the concave portion HS and the concave portion HT is greater than the width of each of the concave portion HS and the concave portion HT formed by the dry etching treatment.

After such gently-sloped concave portions HS and HT have been formed, in a state where a relatively thin TEOS film TE3 (having a thickness of about 100 nm) is formed before the formation of the gap fill member FM, the relationship of predetermined heights over the surface of the TEOS film TE3 is the same as the case of the imaging device according to First Embodiment. Now, a position of the surface of the TEOS film TE3 located right above the seal ring SRPD is referred to as a first position P1. A position of the surface of the TEOS film TE3 located in the concave portion HS is referred to as a second position P2. A position of the surface of the TEOS film TE3 located in a direction departing from the concave portion HS for the outside of the seal ring region SR is referred to as third position P3. Then, the second position P2 is lower than the first position P1 in height. Further, the third position P3 is lower than the first position P1 but higher than the second position P2. The relationship of heights is the same as the case of the TEOS film TE2 to which wet etching treatment is subjected.

Figure 54:
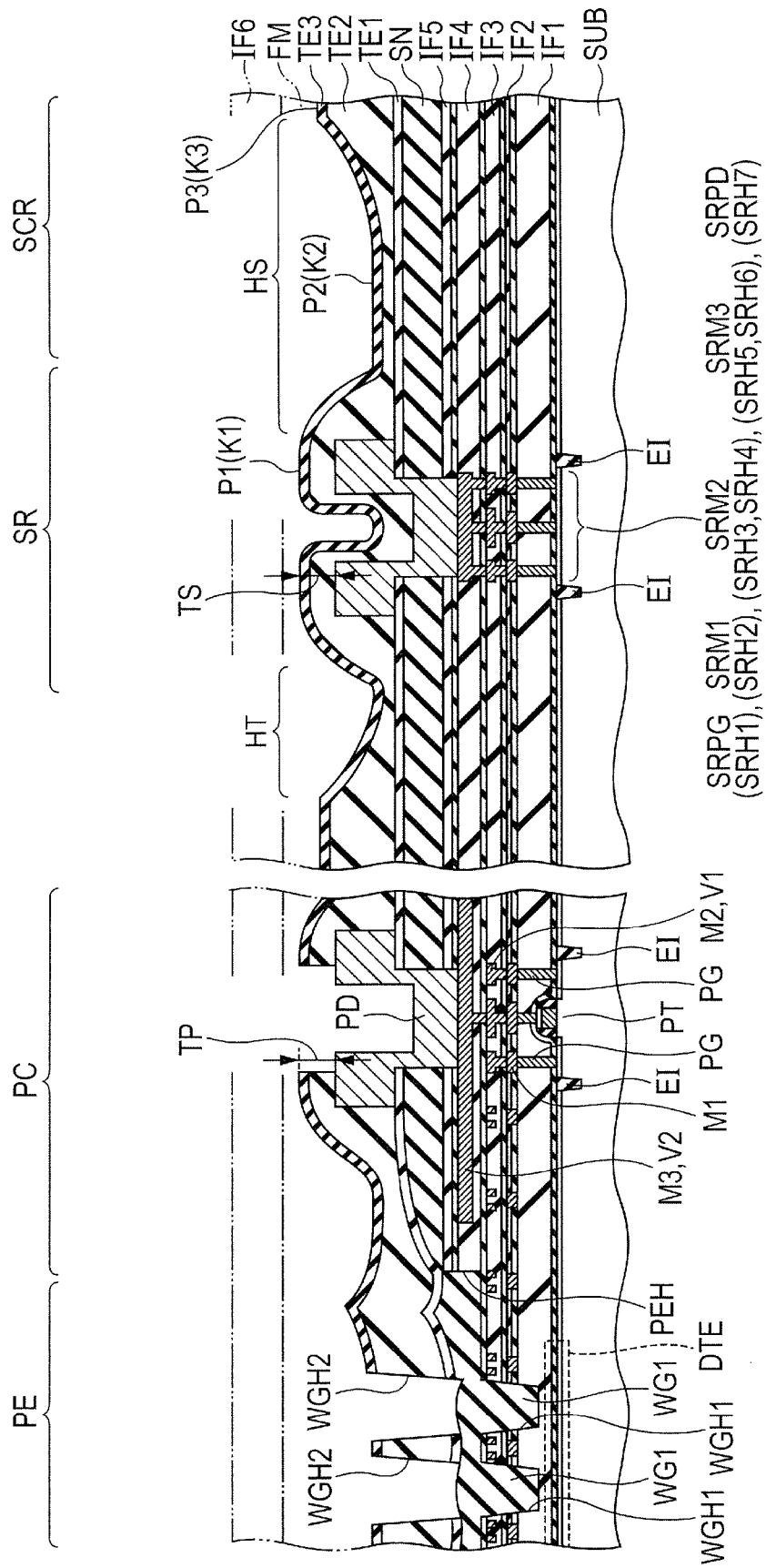
FIG. 54 is the first partial cross-sectional view explaining the operational advantage according to the embodiment.

Accordingly, as shown in FIG. 54, at an interface between the TEOS film TE3 and the gap fill member FM in the completed imaging device IS where the gap fill member FM etc. have been so formed as to cover the TEOS film TE3, an interface K2 corresponding to the second position P2 is lower in height than an interface K1 corresponding to the first position P1. Also, an interface K3 corresponding to the third position P3 is lower than the interface K1 but higher than the interface K2. Further, as described in First Embodiment, the third position P3 (interface K3) is a position corresponding to the vicinity of an edge of the imaging device IS as a chip.

Also, in the imaging device described above, in order to reduce both the level difference of the peripheral circuit region PC and the level difference of the seal ring region SR with respect to the pixel region PE, as shown in FIG. 47, wet etching treatment is subjected to a portion of the TEOS film TE2 covering the pad electrode PD and a portion of the TEOS film TE2 covering the seal ring SRPD at the same time. As a result, a thickness of a portion, of the TEOS film TE2, remaining over the upper surface of the pad electrode PD becomes substantially the same as a thickness of a portion, of the TEOS film TE2, remaining over the upper surface of the seal ring SRPD.

Accordingly, as shown in FIG. 54, after the TEOS film TE3 has been formed, the thickness TP of a portion of the TEOS films TE2 and TE3 (insulating film) located over the upper surface of the pad electrode PD becomes substantially the same as the thickness TS of a portion of the TEOS films TE2 and TE3 (insulating film) located over the upper surface of the seal ring SRPD. In this regard, the "same thickness", however, is not intended to mean completely the same thickness as in the case of First Embodiment, and is intended to include variations in production processes such as variations in film forming in surfaces of the semiconductor substrate and wet etching, etc. (Modification) In the imaging device IS described above, there has been explained the case where the second waveguide WG2 is formed in the second waveguide holding hole WGH2, and the color filter CF and the micro lens ML are formed over the second waveguide WG2. As an imaging device according to a modification thereof, now, a case where a color filter is formed in the second waveguide holding hole will be explained.

Figure 55:
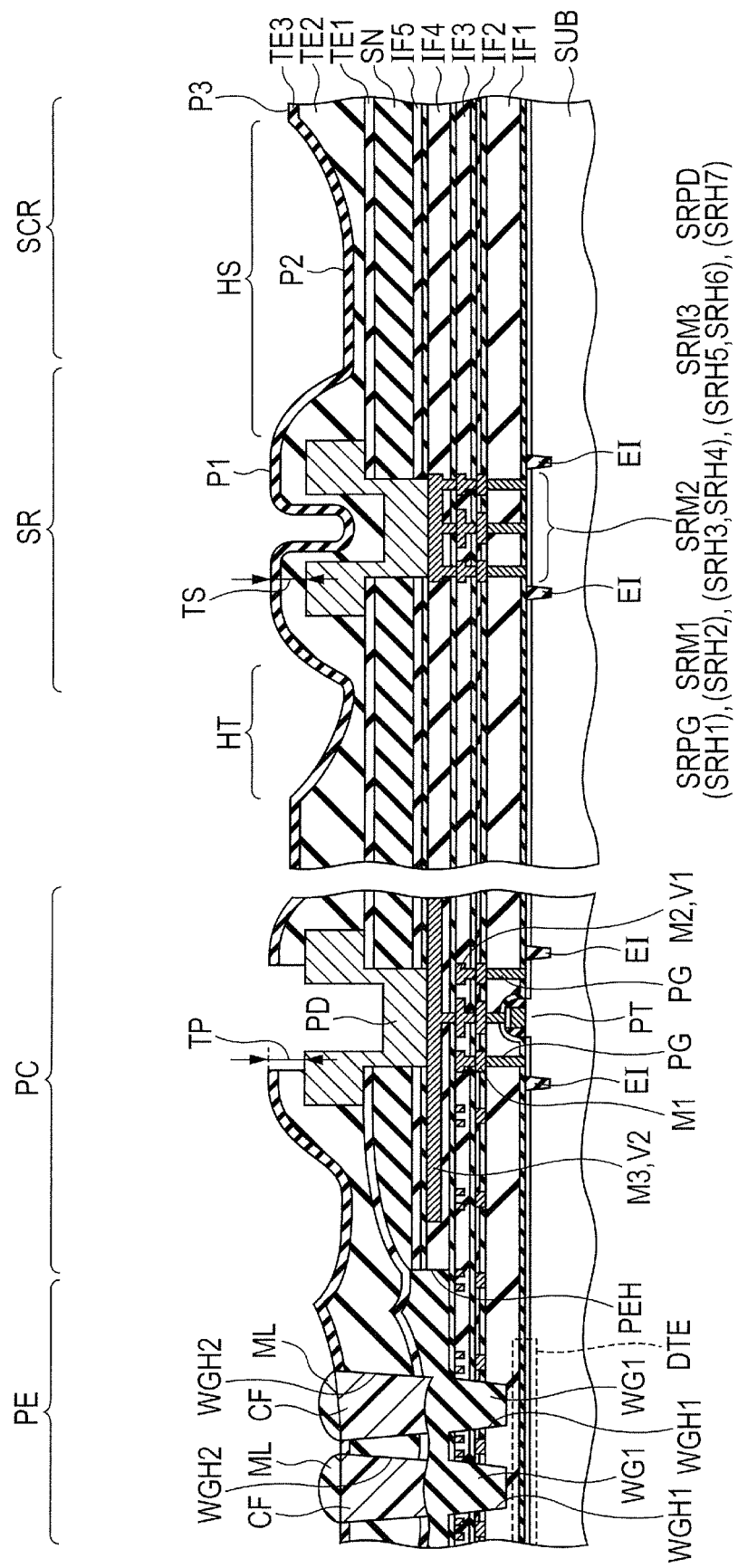
FIG. 55 is a partial cross-sectional view of an imaging device of a modification with respect to the embodiment.

After the second waveguide holding hole WGH2 has been formed through steps similar to the steps shown in FIGS. 4 to 22 and FIGS. 44 to 50, as shown in FIG. 55, by a lithography process, a color filter CF of a predetermined color is formed in each of the second waveguide holding holes WGH2. Next, a micro lens ML is formed over each of the plurality of color filters CF. Subsequently, by dicing the scribe region SCR, principal parts of the imaging device IS according to the modification are completed.

Until the second waveguide holding hole WGH2 is formed, the imaging device IS according to the modification is being formed through the same steps as those of the imaging device IS described above. Therefore, as in the imaging device IS described above, it is possible to prevent the surface of the TEOS film TE3 from getting rough. Also, various problems which might be caused by the surface roughness can be gotten rid of (avoided).

Further, in the imaging device IS according to the modification, the relationship of heights of the surface (upper surface) of the TEOs film TE3 located in the seal ring region SR and the scribe region SCR is the same as that of the imaging device IS described above. That is, the second position P2 is lower than the first position P1 in height. Also, the third location P3 is lower than the first position P1 but higher than the second position P2.

Further, the thickness TP of the portion of TEOS films TE2 and TE3 (insulating film) located over the upper surface of the pad electrode PD becomes substantially the same as the thickness TS of the portion of the TEOS films TE2 and TE3 (insulating film) located over the upper surface of the seal ring SRPD.

The numeric values of the film thickness etc. shown in the manufacturing method of the imaging device according to each embodiment described above are examples and are not limitative. Also, as the methods for reducing the level differences in the peripheral circuit region PC and the seal ring region SR, the dry etching treatment was explained in First Embodiment and the wet etching treatment was explained in Second Embodiment. However, the dry etching treatment and the wet etching treatment may be combined as required.

Also, as a seal ring, the three-fold seal ring was shown by way of example. However, so long as moisture from the outside can be interrupted, the seal ring is not limited to the three-fold seal ring. For instance, there may be used a two-fold seal ring or seal rings etc. including a plurality of bundles of two-fold seal rings. Alternatively, it may be a single-fold seal ring.

The invention made by the present inventors was described specifically based on some embodiments. The invention is however not limited to or by them but can be changed in various ways without departing from the scope of the invention.

What is claimed is:

1. An imaging device having a waveguide comprising:
a seal ring region including continuous ring-like seal rings formed over a semiconductor substrate;
a pixel region including the waveguide, and a peripheral circuit region that are formed, respectively, in regions inside the seal ring region; and
an insulating film so formed as to cover the pixel region, the peripheral circuit region, and the seal ring region,
wherein a first concave portion is formed along the seal ring in a region located on the outward side of the seal ring in the insulating film, and
wherein, when a position of a surface of the insulating film located right above the seal ring is referred to as a first position, a position of the surface of the insulating film located in the first concave portion is referred to as a second position, and a position of the surface of the insulating film located in a direction departing from the first concave portion for the outside of the seal ring region is referred to as a third position, the second position is lower than the first position in height, and the third position is lower than the first position but higher than the second position in height.

2. The imaging device according to claim 1,
wherein a second concave portion is formed along the seal ring in a region located on the inward side of the seal ring in the insulating film, and
wherein a width of the first concave portion is greater than a width of the second concave portion.

3. The imaging device according to claim 1,
wherein a pad electrode is formed in the peripheral circuit region,
wherein the insulating film includes a portion covering the pad electrode, and
wherein a thickness of a portion of the insulating film located right above the pad electrode is the same as that of a portion of the insulating film located right above the seal ring.

4. A method of manufacturing an imaging device having a waveguide, comprising the steps of:

defining a pixel region, a peripheral circuit region, and a seal ring region continuously enclosing the pixel region and the peripheral circuit region over a semiconductor substrate;

forming a wiring structure and a pad electrode in the peripheral circuit region by forming an interlayer insulating film and a conductive film sequentially and patterning each of them, and forming a seal ring in the seal ring region;

forming an insulating film over the semiconductor substrate so as to cover the pixel region, the pad electrode, and the seal ring;

forming a pattern of a first photoresist exposing a first region of the insulating film located right above the pad electrode and a second region including a right-above portion of the insulating film located right above the seal ring;

subjecting etching treatment to the exposed first and second regions of the insulating film using the first photoresist as an etching mask;

after removing the first photoresist, forming a pattern of the second photoresist covering a region including the first and second regions of the insulating film and exposing a third region of the insulating film located in the pixel region; and forming a waveguide holding hole in the pixel region by subjecting etching treatment to the exposed third region of the insulating film using the second photoresist as an etching mask.

5. The method of manufacturing an imaging device according to claim 4, wherein, in the step where the pattern of the first photoresist is formed, as the second region of the insulating film, a region extending from the right-above portion of the insulating film to an outward side portion located on the outward side of the seal ring is exposed, wherein a first concave portion is formed in the insulating film by etching the outward side portion in the step where the etching treatment is subjected to the second region of the insulating film, and wherein, when a position of the surface located in the right-above portion of the insulating film is referred to as a first position, a position of the surface of the insulating film located in the first concave portion is referred to as a second position, and a position of the surface of the insulating film located in a direction departing from the first concave portion for the outside of the seal ring region is referred to as a third position, the second position is lower than the first position in height, and the third position is lower than the first position but higher than the second position in height.

6. The method of manufacturing an imaging device according to claim 5, wherein, in the step where the pattern of the first photoresist is formed, as the second region of the insulating film, a region extending from the right-above portion of the insulating film to the inward side portion located on the inward side of the seal ring is exposed, wherein, in the step where the etching treatment is subjected to the second region of the insulating film, a second concave portion is formed in the insulating film by the inward side portion being etched, and wherein the first concave portion and the second concave portion are formed such that a width of the first concave portion is greater than a width of the second concave portion.

7. The method of manufacturing an imaging device according to claim 4, wherein dry etching treatment is performed in the step where the etching treatment is subjected to the second region of the insulating film.

8. The method of manufacturing an imaging device according to claim 4, wherein wet etching treatment is performed in the step where the etching treatment is subjected to the second region of the insulating film.

* * * * *